US008546779B2

(12) United States Patent
Sonehara

(10) Patent No.: US 8,546,779 B2
(45) Date of Patent: Oct. 1, 2013

(54) RESISTANCE CHANGE MEMORY AND MANUFACTURING METHOD THEREOF

(75) Inventor: Takeshi Sonehara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 373 days.

(21) Appl. No.: 12/844,281

(22) Filed: Jul. 27, 2010

(65) Prior Publication Data

US 2011/0127483 A1 Jun. 2, 2011

(30) Foreign Application Priority Data

Nov. 30, 2009 (JP) ................................. 2009-272628

(51) Int. Cl.
*H01L 29/02* (2006.01)

(52) U.S. Cl.
USPC ............... 257/2; 257/209; 257/497; 257/530; 257/E21.078; 257/E45.001

(58) Field of Classification Search
USPC ...................................... 257/2, 209, 497, 530
See application file for complete search history.

(56) References Cited

U.S. PATENT DOCUMENTS

| | | | | |
|---|---|---|---|---|
| 5,869,397 | A * | 2/1999 | Miyakawa | 438/655 |
| 6,657,301 | B2 * | 12/2003 | Maekawa et al. | 257/751 |
| 2004/0266182 | A1 | 12/2004 | Ku et al. | |
| 2009/0243002 | A1 | 10/2009 | Sonehara et al. | |
| 2009/0283739 | A1 * | 11/2009 | Kiyotoshi | 257/4 |
| 2010/0176366 | A1 * | 7/2010 | Fu et al. | 257/4 |
| 2010/0315857 | A1 * | 12/2010 | Sonehara et al. | 365/148 |
| 2010/0321979 | A1 * | 12/2010 | Yasutake et al. | 365/148 |
| 2011/0062557 | A1 * | 3/2011 | Bandyopadhyay et al. | 257/616 |
| 2011/0133149 | A1 * | 6/2011 | Sonehara | 257/3 |
| 2011/0233507 | A1 * | 9/2011 | Sonehara et al. | 257/4 |

FOREIGN PATENT DOCUMENTS

| JP | 2005-19943 | 1/2005 |
|---|---|---|
| JP | 2009-167530 | 7/2009 |

OTHER PUBLICATIONS

Choi et al., "Thermally stable ternary titanium-tantalum silicide formation on polycrystalline silicon" J. Appl. Phys. 74(2), Jul. 15, 1993.*
U.S. Appl. No. 13/051,500, filed Mar. 18, 2011, Sonehara et al.
U.S. Appl. No. 12/886,118, filed Sep. 20, 2010, Sonehara.
U.S. Appl. No. 12/888,132, filed Sep. 22, 2010, Sonehara, et al.

* cited by examiner

*Primary Examiner* — A. Sefer
(74) *Attorney, Agent, or Firm* — Oblon, Spivak, McClelland, Maier & Neustadt, L.L.P.

(57) ABSTRACT

According to one embodiment, a resistance-change memory of embodiment includes a first interconnect line extending in a first direction, a second interconnect line extending in a second direction intersecting with the first direction, and a cell unit. The cell unit is provided at an intersection of the first interconnect line and the second interconnect line. The cell unit includes a non-ohmic element having a silicide layer on at least one of first and second ends thereof, and a memory element to store data in accordance with a reversible change in a resistance state. The silicide layer includes a 3d transition metal element which combines with an Si element to form silicide and which has a first atomic radius, and at least one kind of an additional element having a second atomic radius greater than the first atomic radius.

15 Claims, 33 Drawing Sheets

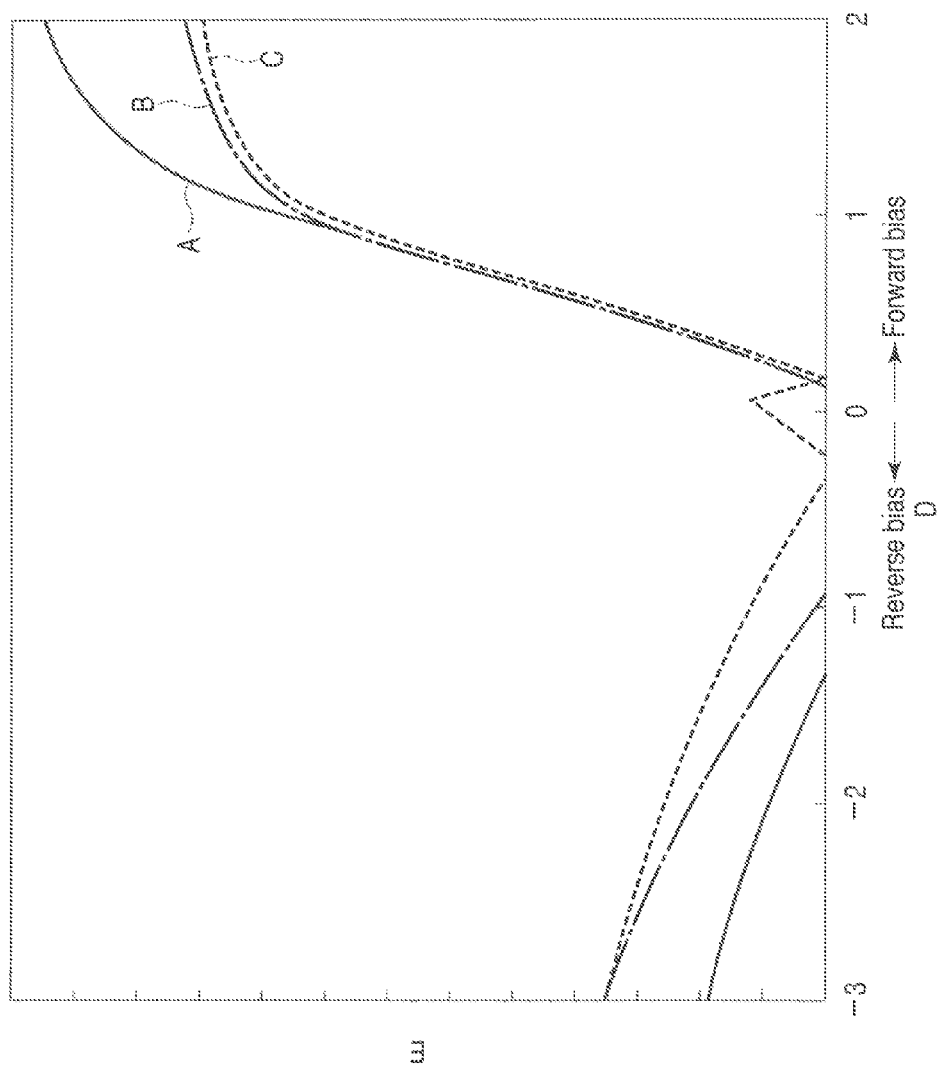
F I G. 8B

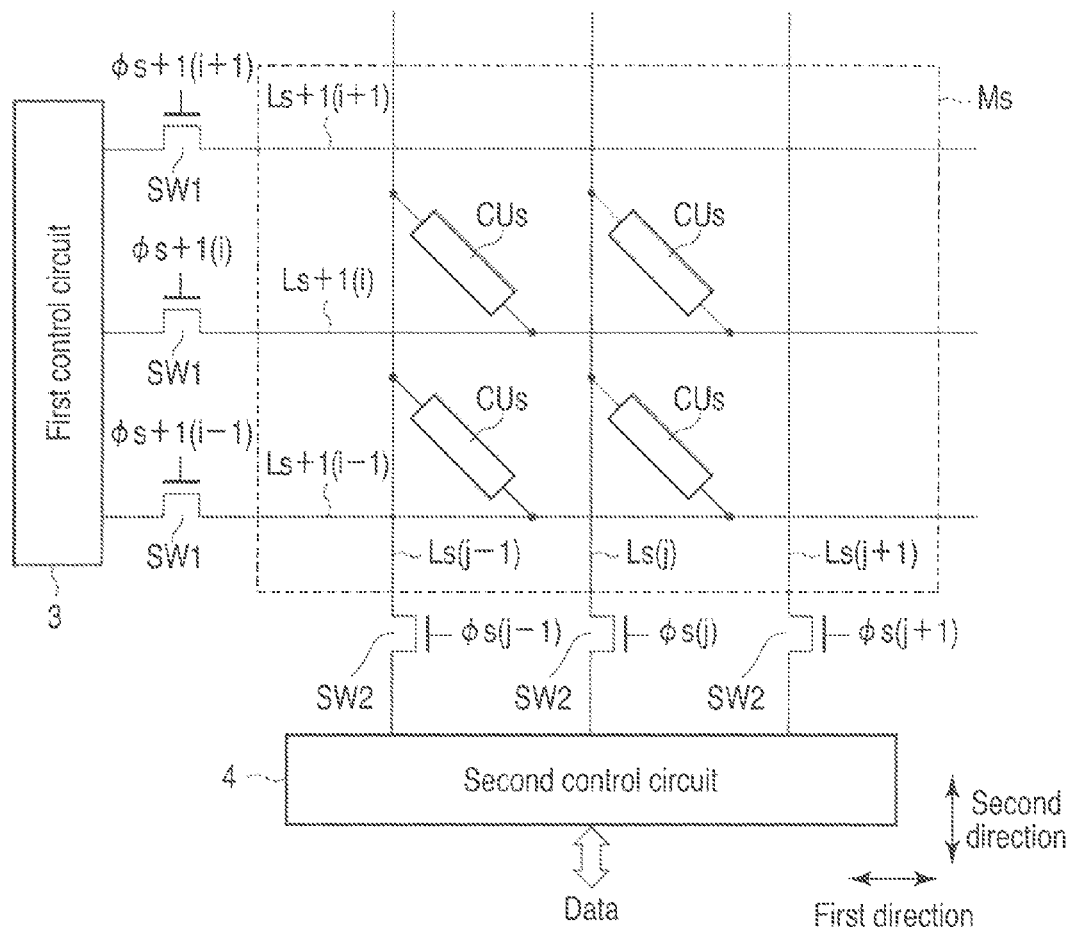
F I G. 11A

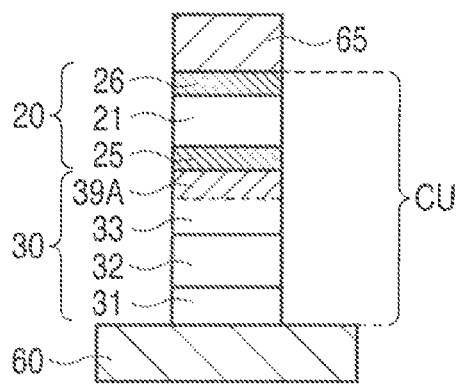 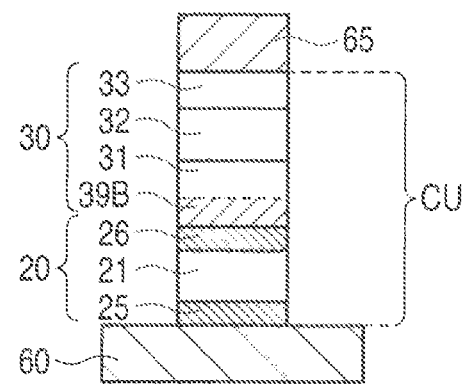
FIG. 12A   FIG. 12B
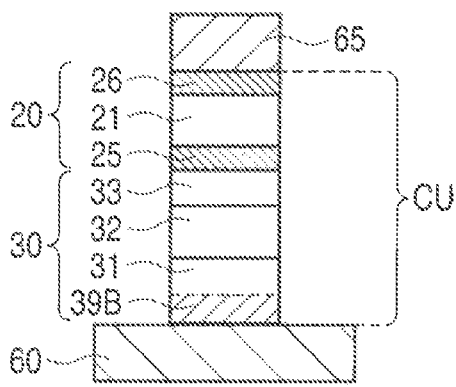 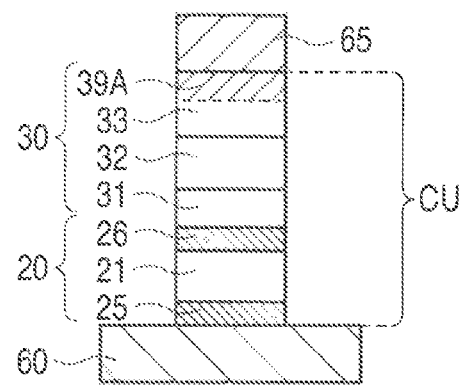
FIG. 12C   FIG. 12D
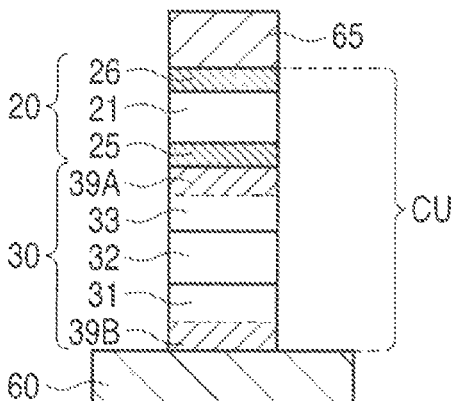 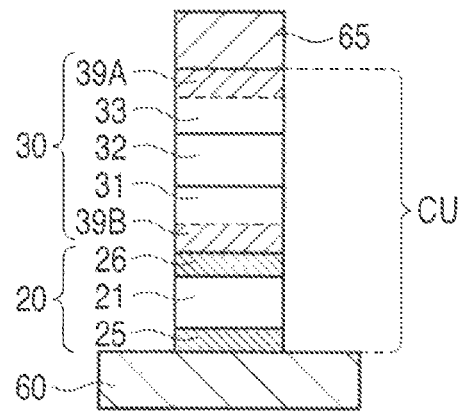
FIG. 12E   FIG. 12F

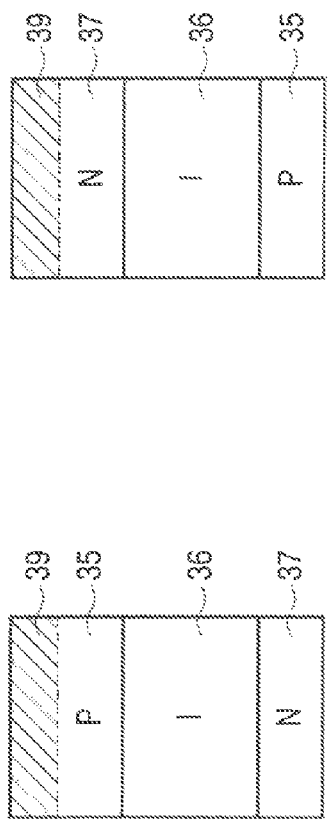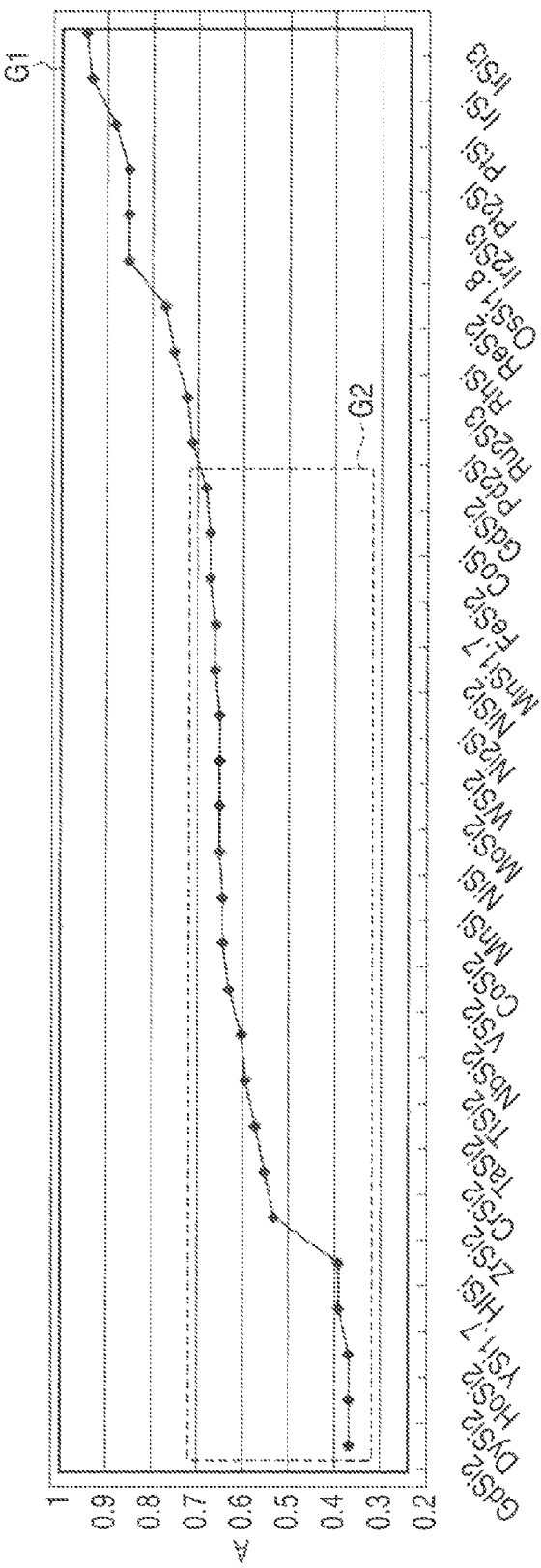
FIG. 13A
FIG. 13B
FIG. 13C

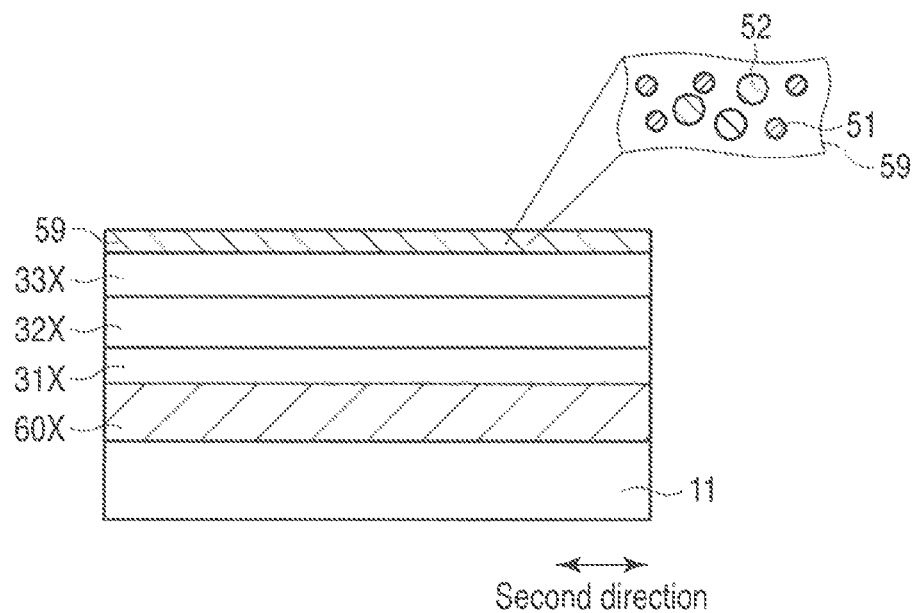
F I G. 14A
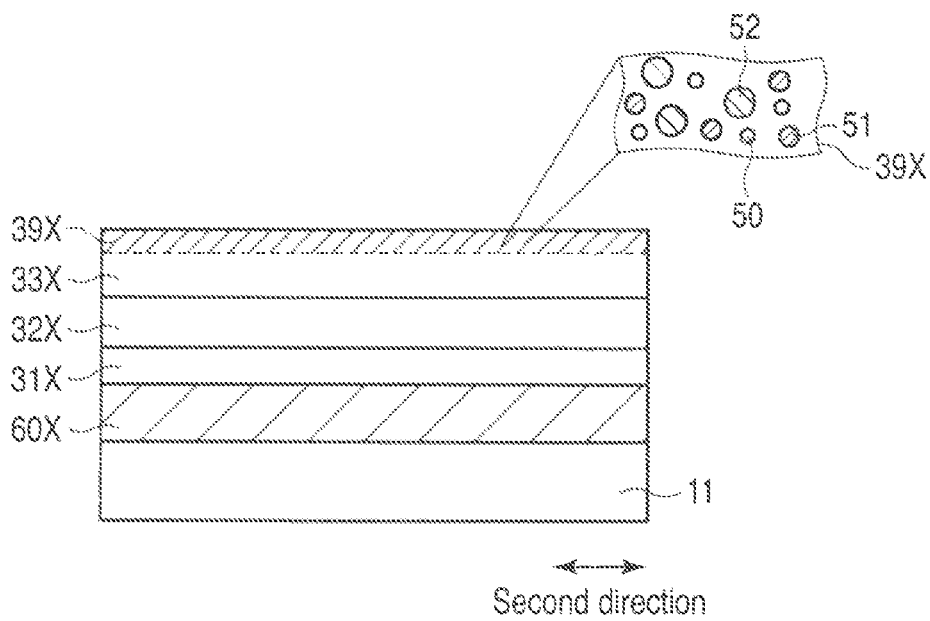
F I G. 14B

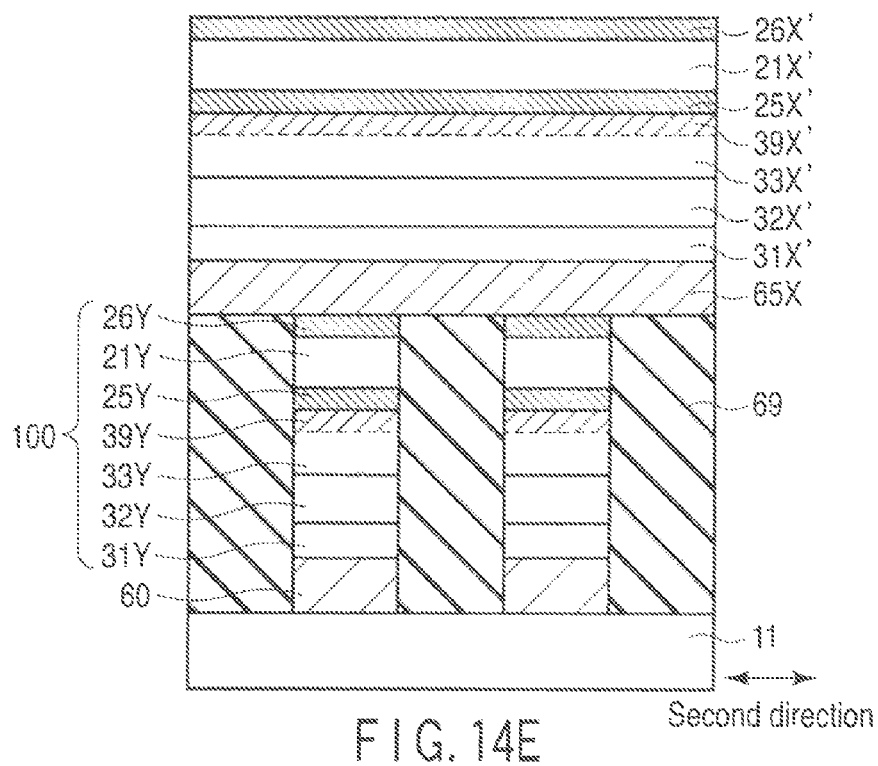
F I G. 14E
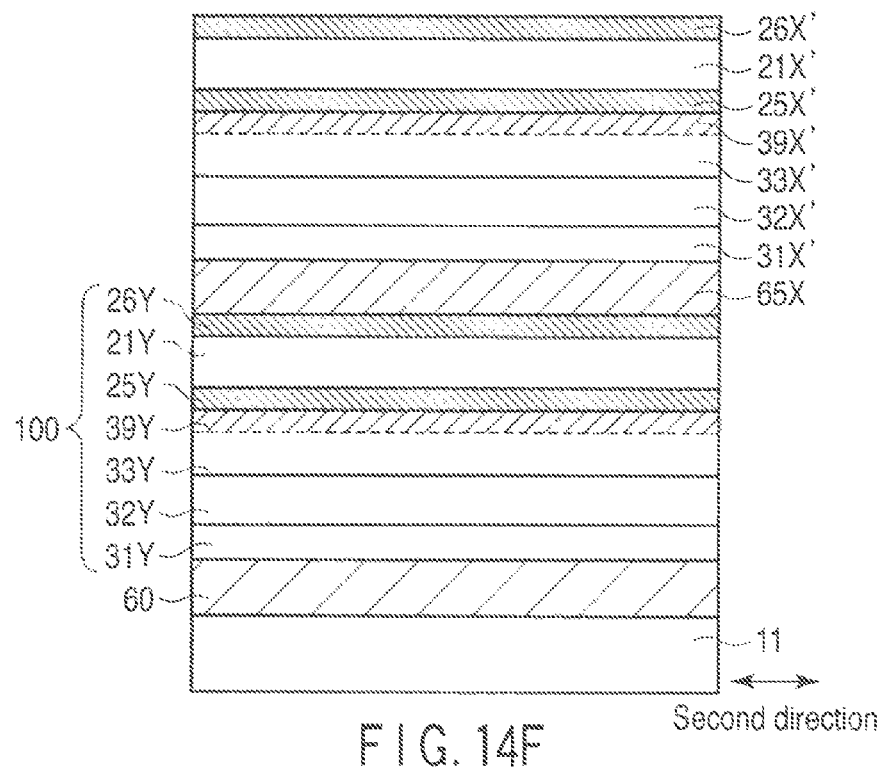
F I G. 14F

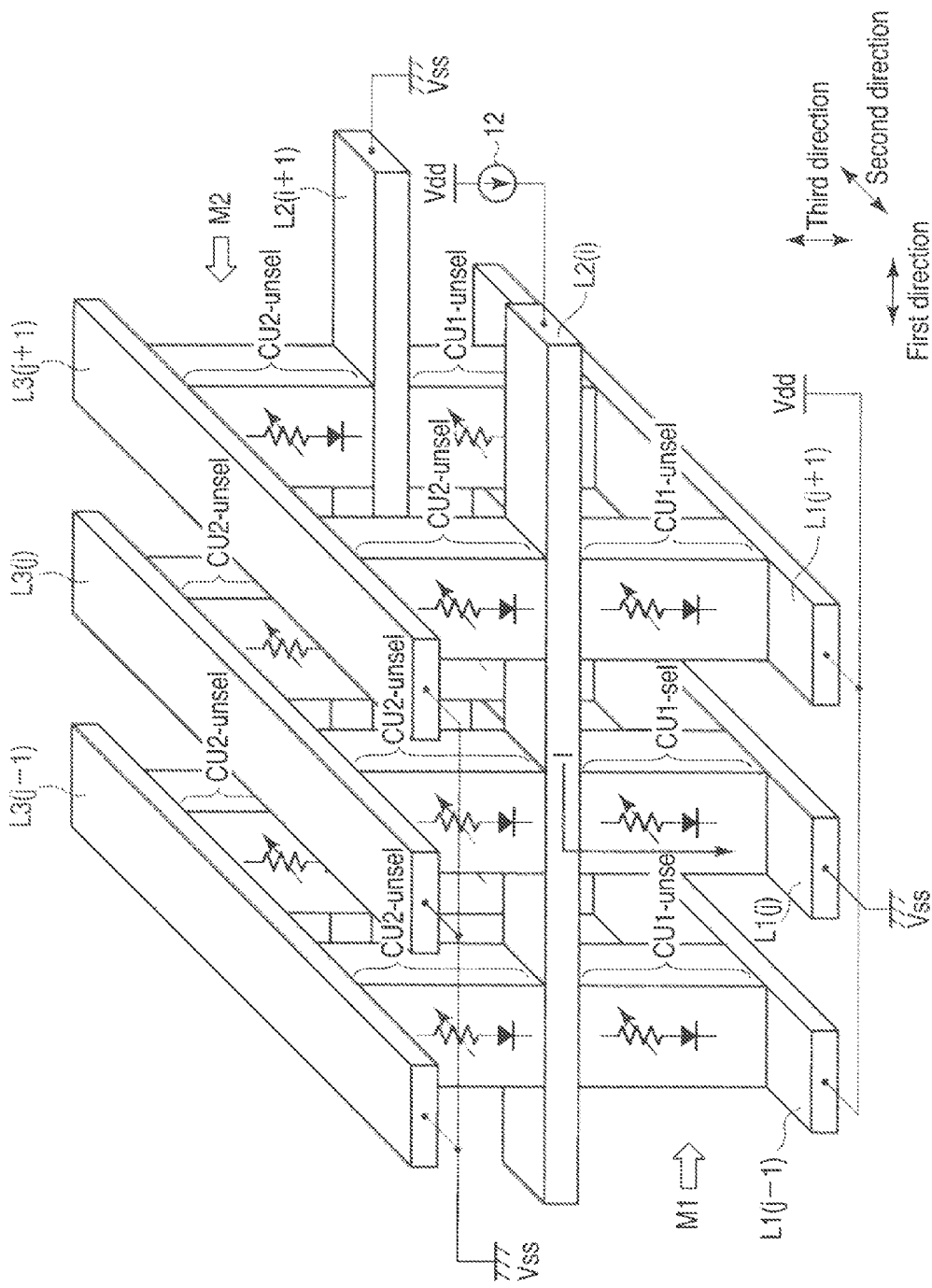
F I G. 19

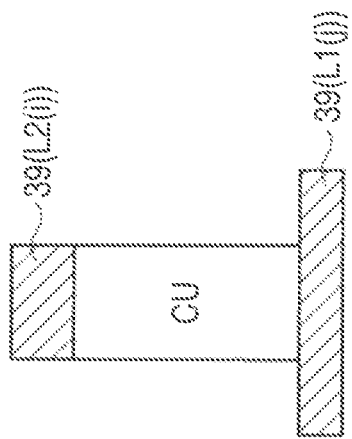
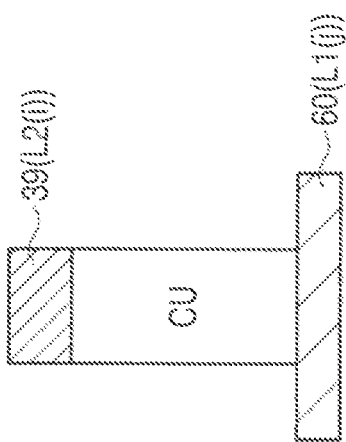
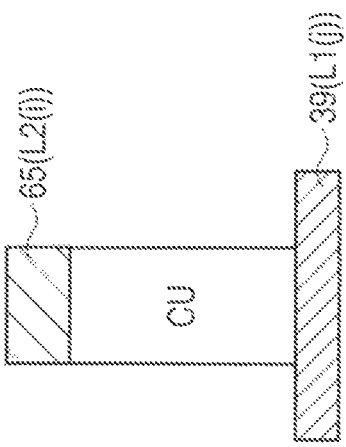

RESISTANCE CHANGE MEMORY AND MANUFACTURING METHOD THEREOF

CROSS-REFERENCE TO RELATED APPLICATIONS

This application is based upon and claims the benefit of priority from Japanese Patent Application No. 2009-272628, filed Nov. 30, 2009; the entire contents of which are incorporated herein by reference.

FIELD

Embodiments described herein relate generally to a resistance change memory and a manufacturing method thereof.

BACKGROUND

Recently, as next-generation nonvolatile semiconductor memories, resistance change memories have been attracting attention, such as a resistive RAM (ReRAM) in which a variable resistive element serves as a memory element, and a phase change RAM (PCRAM) in which a phase change element serves as a memory element.

These resistance change memories are characterized in that a memory cell array is a cross-point type and a higher memory capacity is enabled by three-dimensional integration, and also characterized by being capable of the same high-speed operation as that of a DRAM.

If such a resistance change memory is put to practice use, a NAND flash memory serving as a file memory and a DRAM serving as a work memory, for example, can be replaced with the resistance change memories.

There are, however, challenges to solve in putting the resistance change memory to practice use. One of these challenges concerns the material (e.g., silicide) used for the resistance change memory.

Jpn. Pat. Appln. KOKAI Publication No. 2005-019943 discloses a technique associated with nickel silicide to which other elements are added.

However, the use of silicide that takes the structure and manufacturing process of the resistance change memory is desired.

BRIEF DESCRIPTION OF THE DRAWINGS

FIG. 8B is a graph for illustrating the characteristics of silicide included in the cell unit according to the present embodiment;
FIG. 11A is a diagram showing the layout of first and second control circuits;
FIG. 12A is a diagram showing an example of the configuration of the cell unit;
FIG. 12B is a diagram showing an example of the configuration of the cell unit;
FIG. 12C is a diagram showing an example of the configuration of the cell unit;
FIG. 12D is a diagram showing an example of the configuration of the cell unit;
FIG. 12E is a diagram showing an example of the configuration of the cell unit;
FIG. 12F is a diagram showing an example of the configuration of the cell unit;
FIG. 13A is a diagram showing an example of the configuration of a non-ohmic element;
FIG. 13B is a diagram showing an example of the configuration of the non-ohmic element;
FIG. 13C is a graph for illustrating the work function of silicide;
FIG. 14A is a diagram showing one step of a first method of manufacturing the resistance change memory according to the embodiment;
FIG. 14B is a diagram showing one step of the first method of manufacturing the resistance change memory according to the embodiment;
FIG. 14E is a diagram showing one step of the first method of manufacturing the resistance change memory according to the embodiment;
FIG. 14F is a diagram showing one step of the first method of manufacturing the resistance change memory according to the embodiment.

FIG. 19 is a diagram for illustrating the operation of the resistance change memory;

FIG. 21A is a diagram showing a modification of the resistance change memory according to the embodiment;

FIG. 21B is a diagram showing the modification of the resistance change memory according to the embodiment;

FIG. 21C is a diagram showing the modification of the resistance change memory according to the embodiment;

DETAILED DESCRIPTION

Hereinafter, an embodiment of embodiments will be described in detail with reference to the drawings. In the following explanation, elements having the same function and configuration are provided with the same signs and are repeatedly described when necessary.

In general, according to one embodiment, a resistance change memory includes a first interconnect line extending in a first direction, a second interconnect line extending in a second direction intersecting with the first direction; and a cell unit. The cell unit is provided at an intersection of the first interconnect line and the second interconnect line. The cell unit includes a non-ohmic element having a silicide layer on at least one of first and second ends thereof, and a memory element to store data in accordance with a reversible change in a resistance state. The silicide layer includes a 3d transition metal element which combines with an Si element to form silicide and which has a first atomic radius, and at least one kind of an additional element having a second atomic radius greater than the first atomic radius.

The embodiment is directed to a resistance change memory in which a variable resistive element or a phase change element serves as a memory element.

EMBODIMENT

Basic Example (1) Configuration

Figure 1:
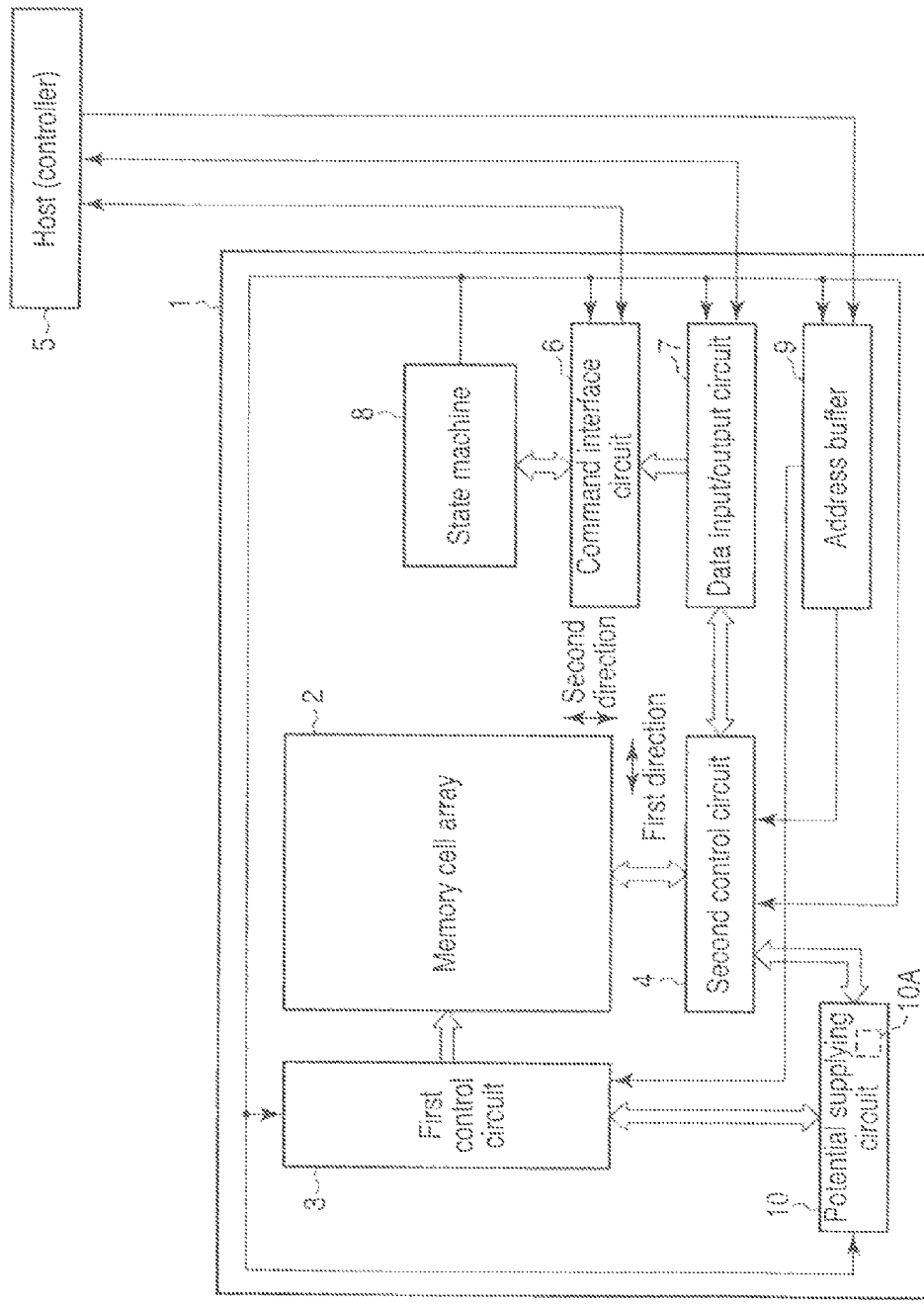
FIG. 1 is a diagram showing a resistance change memory.
Figure 2:
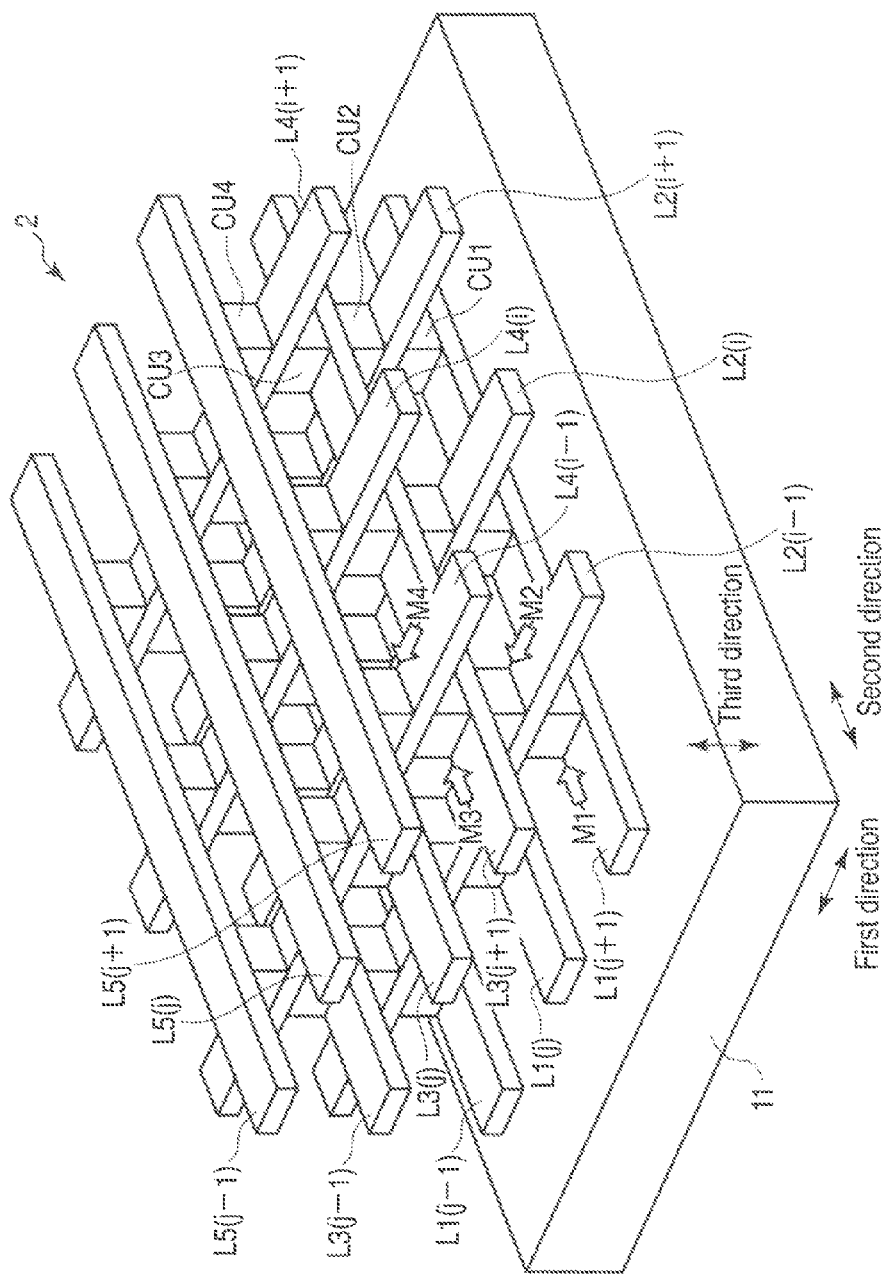
FIG. 2 is a diagram showing an example of the configuration of a memory cell array in the resistance change memory.
Figure 3:
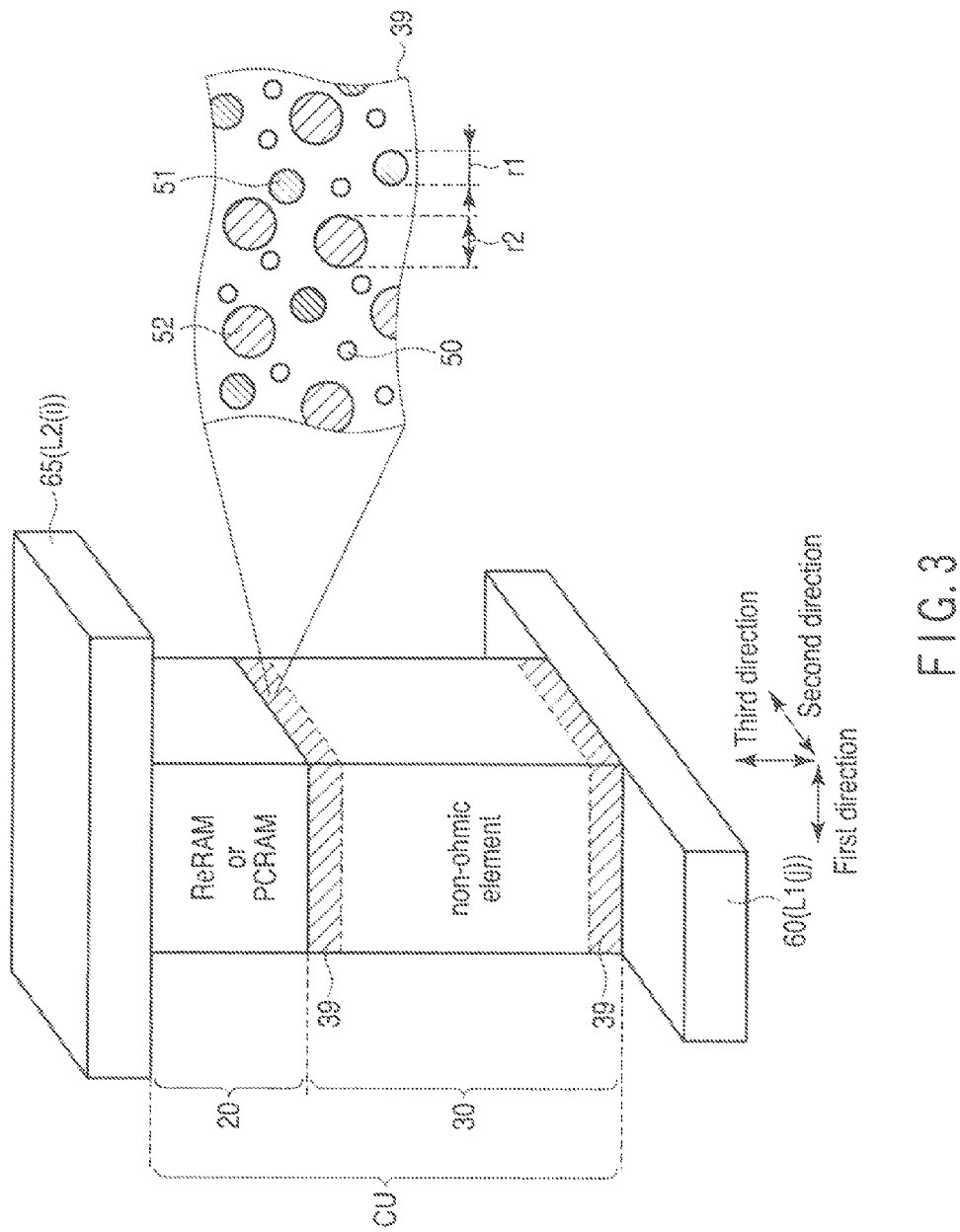
FIG. 3 is a diagram showing a cell unit of the resistance change memory according to an embodiment.

A resistance change memory according to an embodiment of the embodiment is described with FIG. 1 to FIG. 3.

FIG. 1 shows essential parts of the resistance change memory.

A resistance change memory (e.g., chip) 1 has a memory cell array 2.

A first control circuit 3 is disposed at one end of the first direction of memory cell array 2, and a second control circuit 4 is disposed at the other end of the second direction that intersects with the first direction.

The first control circuit 3 selects a row of the memory cell array 2 on the basis of, for example, a row address signal. Moreover, the second control circuit 4 selects a column of the memory cell array 2 on the basis of, for example, a column address signal.

The first and second control circuit 3, 4 control writing, erasing and reading of data in a memory element within memory cell array 2.

Here, in the resistance change memory 1, for example, a write is referred to as a set, and an erasure is referred to as a reset. A resistance value in a set state has only to be different from a resistance value in a reset state, and whether the resistance value in the set state is higher or lower makes no difference.

Moreover, if one of a plurality of levels of resistance values that can be marked by the memory element can be selectively written in a set operation, a multilevel resistance change memory in which one memory element stores multilevel data can be obtained.

A controller 5 supplies a control signal and data to the resistance change memory 1. The control signal is input to a command/interface circuit 6, and data is input to a data input/output buffer 7. The controller 5 may be disposed in the chip 1 or may be disposed in a chip (host device) different from the chip 1.

The command/interface circuit 6 judges in accordance with the control signal whether data from the controller 5 is command data. When the data is command data, the data is transferred from the data input/output buffer 7 to a state machine 8.

The state machine 8 manages the operation of the resistance change memory 1 on the basis of the command data. For example, the state machine 8 manages the set/reset operations and read operation on the basis of command data from the controller 5. The controller 5 can receive status information managed by the state machine 8, and judge the result of the operation in the resistance change memory 1.

In the set/reset operations and read operation, the controller 5 supplies an address signal to the resistance change memory 1. The address signal is input to the first and second control circuits 3, 4 via the address buffer 9.

A potential supplying circuit 10 outputs, at a predetermined timing, a voltage pulse or current pulse necessary for, for example, the set/reset operations and read operation in accordance with an instruction from the state machine 8. The potential supplying circuit 10 includes a pulse generator 10A.

FIG. 2 is a bird's-eye view showing the structure of the memory cell array. The memory cell array shown in FIG. 2 has a cross-point type structure.

The cross-point type memory cell array 2 is disposed on a substrate 11. The substrate 11 is a semiconductor substrate (e.g., a silicon substrate), or an interlayer insulating film on a semiconductor substrate. In addition, when the substrate 11 is an interlayer insulating film, a circuit that uses, for example, a field effect transistor may be formed on the surface of a semiconductor substrate under the cross-point type memory cell array 2.

The cross-point type memory cell array 2 is configured by, for example, a stack structure of a plurality of memory cell arrays (also referred to as memory cell layers).

FIG. 2 shows, by way of example, the case where the cross-point type memory cell array 2 is composed of four memory cell arrays M1, M2, M3, M4 that are stacked in the third direction (a direction perpendicular to the main plane of substrate 11). The number of memory cell arrays stacked has only to be two or more. In addition, the cross-point type memory cell array 2 may be configured by one memory cell array. Alternatively, an insulating film may be provided between two memory cell arrays stacked, and the two memory cell arrays may be electrically separated by the insulating film.

Thus, when the plurality of memory cell arrays M1, M2, M3, M4 are stacked, the address signal includes, for example, a memory cell array selection signal, a row address signal and a column address signal. The first and second control circuit 3, 4 select one of the stacked memory cell arrays in accordance with, for example, the memory cell array selection signal. The first and second control circuit 3, 4 can write/erase/read data in one of the stacked memory cell arrays, or can simultaneously write/erase/read data in two or more or all of the stacked memory cell arrays.

Memory cell array M1 is composed of a plurality of cell units CU1 arrayed in the first and second directions. Similarly, the memory cell array M2 is composed of a plurality of arrayed cell units CU2, memory cell array M3 is composed of a plurality of arrayed cell units CU3, and memory cell array M4 is composed of a plurality of arrayed cell units CU4.

Each of cell units CU1, CU2, CU3, CU4 is composed of a memory element and a non-ohmic element that are connected in series.

Furthermore, on the substrate 11, there are arranged, from the side of the substrate 11, interconnect lines L1 (j−1), L1 (j), L1 (j+1), interconnect lines L2 (i−1), L2 (i), L2 (i+1), interconnect lines L3 (j−1), L3 (j), L3 (j+1), interconnect lines L4 (i−1), L4 (i), L4 (i+1), and interconnect lines L5 (j−1), L5 (j), L5 (j+1).

The odd interconnect lines from the side of substrate 11, that is, interconnect lines L1 (j−1), L1 (j), L1 (j+1), interconnect lines L3 (j−1), L3 (j), L3 (j+1) and interconnect lines L5 (j−1), L5 (j), L5 (j+1) extend in the second direction.

The even interconnect lines from the side of substrate 11, that is, interconnect lines L2 (i−1), L2 (i), L2 (i+1) and interconnect lines L4 (i−1), L4 (i), L4 (i+1) extend in the first direction.

These interconnect lines are used as word lines or bit lines. Here, interconnect lines L1 (j−1), L1 (j), L1 (j+1), L3 (j−1), L3 (j), L3 (j+1), L5 (j−1), L5 (j), L5 (j+1) that extend in the second direction intersect with interconnect lines L2 (i−1), L2 (i), L2 (i+1), L4 (i−1), L4 (i), L4 (i+1) that extend in the first direction.

Lowermost first memory cell array M1 is disposed between first interconnect lines L1 (j−1), L1 (j), L1 (j+1) and second interconnect lines L2 (i−1), L2 (i), L2 (i+1). In the set/reset operations and read operation for the memory cell array M1, either interconnect lines L1 (j−1), L1 (j), L1 (j+1) or interconnect lines L2 (i−1), L2 (i), L2 (i+1) are used as word lines, and the other interconnect lines are used as bit lines.

The memory cell array M2 is disposed between second interconnect lines L2 (i−1), L2 (i), L2 (i+1) and third interconnect lines L3 (j−1), L3 (j), L3 (j+1). In the set/reset operations and read operation for the memory cell array M2, either interconnect lines L2 (i−1), L2 (i), L2 (i+1) or interconnect lines L3 (j−1), L3 (j), L3 (j+1) are used as word lines, and the other interconnect lines are used as bit lines.

The memory cell array M3 is disposed between third interconnect lines L3 (j−1), L3 (j), L3 (j+1) and fourth interconnect lines L4 (i−1), L4 (i), L4 (i+1). In the set/reset operations and read operation for the memory cell array M3, either interconnect lines L3 (j−1), L3 (j), L3 (j+1) or interconnect lines L4 (i−1), L4 (i), L4 (i+1) are used as word lines, and the other interconnect lines are used as bit lines.

The memory cell array M4 is disposed between fourth interconnect lines L4 (i−1), L4 (i), L4 (i+1) and fifth interconnect lines L5 (j−1), L5 (j), L5 (j+1). In the set/reset operations and read operation for the memory cell array M4, either interconnect lines L4 (i−1), L4 (i), L4 (i+1) or interconnect lines L5 (j−1), L5 (j), L5 (j+1) are used as word lines, and the other interconnect lines are used as bit lines.

FIG. 3 is a bird's-eye view schematically showing the structure of one cell unit.

In the cross-point type memory cell array 2, a current is only passed through a selected memory element, a memory element 20 and a non-ohmic element 30 are connected in series between two interconnect lines (the word line and the bit line).

In the cell unit CU in FIG. 3, the memory element 20 is stacked on the non-ohmic element 30. However, the structure of the cell unit CU shown in FIG. 3 is only one example, and the non-ohmic element 30 may be stacked on the memory element 20.

In the cross-point type memory cell array, a stack composed of the memory element 20 and the non-ohmic element 30 is disposed as one cell unit CU in a part where two interconnect lines 60, 65 intersect with each other. In the stacking direction (third direction), the cell unit CU is interposed between two interconnect lines 60, 65. Here, interconnect lines 60, 65 correspond to two successively stacked interconnect lines in FIG. 2, such as interconnect line L1 (j) and interconnect line L2 (i), or interconnect line L2 (i) and interconnect line L3 (j) or interconnect line L3 (j) and interconnect line L4 (i).

The memory element 20 is a variable resistive element or a phase change element. Here, the term variable resistive element means an element made of a material with a resistance value that changes upon application of, for example, a voltage, a current or heat. The term phase change element means an element made of a material having a physicality (impedance) such as a resistance value or capacitance that changes due to a phase change by an application of a voltage, a current or heat.

The term phase change (phase transition) includes the following:

Metal-semiconductor transition, metal-insulator transition, metal-metal transition, insulator-insulator transition, insulator-semiconductor transition, insulator-metal transition, semiconductor-semiconductor transition, semiconductor-metal transition, semiconductor-insulator transition Phase change of quantum state (e.g., metal-superconductor transition)

Paramagnet-ferromagnet transition, anti ferromagnet-ferromagnet transition, ferromagnet-ferromagnet transition, ferrimagnet-ferromagnet transition, or combination of the above transitions Paraelectric-ferromagnet transition, paraelectric-pyroelectric transition, paraelectric-piezoelectric transition, ferroelectric-ferroelectric transition, antiferroelectric-ferroelectric transition, or combination of the above transitions Combination of the above transitions For example, transition to ferroelectric-ferromagnet from a metal, insulator, semiconductor, ferroelectric, paraelectric, pyroelectric, piezoelectric, ferromagnet, ferrimagnet, helimagnet, paramagnet or antiferromagnet, and reverse transition In accordance with the above definition, the variable resistive element includes the phase change element.

In the embodiment of the present invention, the variable resistive element is mainly made of, for example, a metal oxide (e.g., a binary or ternary metal oxide), a metal compound, a chalcogenide material (e.g., Ge—Sb—Te, In—Sb—Te), organic matter, carbon, or carbon nanotube.

In addition, the resistance value of a magnetoresistive effect element used for a magnetoresistive RAM (MRAM) changes when the relative directions of the magnetizations of two magnetic layers constituting this element change. In the present embodiment, a magnetoresistive effect element such as a magnetic tunnel junction (MTJ) element is also included in the variable resistive element.

As a means of changing the resistance value of the memory element 20, there are an operation called a bipolar operation and an operation called an unipolar operation. In the bipolar operation, the polarity of a voltage applied to the memory element 20 is changed to cause a reversible change in the resistance value of the memory element 20 between at least a first value (first level) and a second value (second level). In the unipolar operation, one or both of the intensity and application time (pulse width) of a voltage is controlled without changing the polarity of the voltage applied to the memory element to cause a reversible change in the resistance value of the memory element between at least the first value and the second value.

The bipolar operation is used for a memory such as a spin injection type MRAM which requires bi-directional passage of a current through the memory element during writing.

The non-ohmic element 30 is an element which does not have linearity in its input/output characteristics, that is, an element which has non-ohmic characteristics.

A rectification element such as a PN junction diode, a PIN junction diode, a Schottky diode or a metal-insulator-semiconductor (MIS) diode is used for the non-ohmic element 30. The term PN junction diode means a diode in which a P-type semiconductor layer (anode layer) and an N-type semiconductor layer (cathode layer) form a PN junction. The term PIN diode means a diode which has an intrinsic semiconductor layer between a P-type semiconductor layer (anode layer) and an N-type semiconductor layer (cathode layer). The term Schottky diode means a diode in which a semiconductor layer and a metal layer form a Schottky junction. The term MIS diode means a diode which has an insulating layer between a metal layer and a semiconductor layer.

In addition to the rectification element, a stack structure such as a semiconductor-insulator-semiconductor (SIS) structure or a metal-insulator-metal (MIM) structure is used for non-ohmic element 30.

In the resistance change memory driven by the unipolar operation, a rectification element such as a diode is mainly used as the non-ohmic element 30. In the resistance change memory driven by the bipolar operation, the MIM structure or SIS structure is mainly used as the non-ohmic element 30.

In the present embodiment, a resistance change memory that utilizes the unipolar operation is mainly described. However, it goes without saying that the resistance change memory in the embodiment of the present invention may be a memory that utilizes the bipolar operation.

When a resistance change memory having a cross-point type memory cell array (hereinafter referred to as a cross-point type resistance change memory) is driven via unipolar operation, the following characteristics are required for rectification element 30 as a non-ohmic element in order to accurately perform the set/reset operations and read operation: a current (forward current) is high when a forward bias is applied, and a current (reverse current) is low and a breakdown voltage is high when a reverse bias is applied.

As shown in FIG. 3, in the resistance change memory according to the present embodiment, the non-ohmic element 30 that forms the cell unit CU has a silicide layer 39 on at least one of its ends (upper end and lower end) in its as-stacked direction.

The silicide layer (also simply referred to as silicide) 39 includes a silicon element 50, a 3d transition metal element 51 having first atomic radius r1, and an element 52 having second atomic radius r2. Although three kinds of elements 50, 51, 52 are randomly arranged in the silicide layer 39 in FIG. 3 for the sake of simplicity in illustration, it goes without saying that the three kinds of elements 50, 51, 52 are chemically bonded together on the basis of a stoichiometric composition ratio to form one crystal grain or one layer.

The 3d transition metal element 51 is chemically bonded the Si element 50, and thereby the silicide layer is formed.

In the present embodiment, the 3d transition metal element 51 means a metal element capable of having stable unpaired electrons on the 3d orbit of an atom. 3d transition metal element includes, for example, scandium (Sc), titanium (Ti), vanadium (V), chromium (Cr), manganese (Mn), iron (Fe), cobalt (Co), nickel (Ni), copper (Cu) and zinc (Zn). In the present embodiment, the group of elements listed here as 3d the transition metal elements are referred to as a 3d transition metal element group (first element group).

The element 51 included in the silicide layer 39 is at least one kind of element selected from the 3d transition metal element group.

The element 52 has atomic radius r2 greater than atomic radius r1 of a selected 3d transition metal element. The element 52 having atomic radius r2 is an element added to silicide formed of the Si element and the 3d transition metal element, and is an element foreign to silicide. In the present embodiment, the element 52 is also referred to as an additional element or foreign element.

The element 52 includes a 4d transition metal element, a 4f transition metal element, a group 13 element and a group 14 element.

In the present embodiment, the 4d transition metal element means a metal element capable of having stable unpaired electrons on the 4d orbit of an atom.

A 4d transition metal element includes, for example, yttrium (Y), zirconium (Zr), niobium (Nb), molybdenum (Mo), technetium (Tc), ruthenium (Ru), rhodium (Rh), palladium (Pd), silver (Ag) and cadmium (Cd).

In the present embodiment, the 4f transition metal element means a metal element capable of having a stable unpaired electron on the 4f orbit of an atom.

4f transition metal element includes, for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt) and gold (Au).

The group 13 element includes, for example, indium (In) and thallium (Tl). The group 14 element includes, for example, germanium (Ge), tin (Sn) and lead (Pb).

A group of elements 52 having an atomic radius greater than the atomic radius of an element selected as the 3d transition metal element 51 is referred to as an additional element group (second element group). At least one kind is selected from the second element group for the element 52 included in silicide layer 39.

The element 52 is not limited to the elements belonging to the additional element group shown here by way of example. The element 52 may be any element as long as atomic radius r2 of the element 52 is greater than atomic radius r1 of one kind of the 3d transition metal element 51 selected from the 3d transition metal element group. Moreover, an element belonging to the 3d transition metal element group may be used for the additional element 52 as long as it has as atomic radius greater than atomic radius r1 of the element 51 selected as the 3d transition metal element to form silicide.

It is to be noted that, in the present embodiment, the atomic radius of an element is regulated by one of a metallic bond radius, an ionic radius and a covalent bond radius in accordance with the selected element 52 and a combination state of elements. Here, the atomic radius of each element is not described in detail. In general, the radius of an element (atom) having a greater atomic number in the periodic table of elements among elements of the same group tends to be greater, and the radius of an element having a smaller atomic number among elements of the same period tends to be greater.

The element 52 is mainly lattice-substituted for the 3d transition metal element 51 in the crystal structure of silicide formed of the Si element 50 and the 3d transition metal element 51 and present in the silicide layer 39. That is, the silicide layer 39 including the additional element 52 is rendered a mixed crystal by the addition of the additional element 52.

However, the additional element 52 may be present in the silicide layer 39 as a crystal grain of a compound of this element 52 and the Si element 50, as a crystal grain of a compound of this element 52 and the 3d transition metal element 51, as a compound of this element and two elements 50, 51, or as a crystal grain of single additional element 52.

The silicide 39 included in the resistance change memory according to the present embodiment is represented by a chemical formula (composition formula) "$M_{1-x}D_xSi_y$", wherein "M" indicates the 3d transition metal element, "D" indicates an element having a greater atomic radius than that of the 3d transition metal element, and "Si" indicates silicon. Here, "x" is 0.01 or more and 0.99 or less, and "y" is 1 or more and 2 or less.

However, silicide made of the 3d transition metal element 51 and the Si element 52 is preferably the main component (base material) of the silicide layer 39, and preferably has a relation x1>x2 when indicated by "x=x2", "x1=1−x=1−x2", that is, when indicated by $M_{x1}D_{x2}Si_y$.

More specifically, the amount of addition of additional element D to silicide composed of the Si element and 3d transition metal element (M) (the ratio of element D to element M) is preferably 30 atomic % or less. That is, the value of "x" in the composition formula of silicide in the present embodiment is preferably 0.3 or less.

This is based on the following theory: If element "D(52)" is excessively added, a compound containing the additional element may also be excessively generated in the silicide layer 39. Due to the excessively formed compound, the crystal phase of the silicide layer 39 may be rough, or phase separation may be caused. Therefore, the resulting formation of no silicide layer having predetermined characteristics and considerable deterioration of the quality of the silicide layer 39 should be prevented.

Furthermore, the additional element 52 is preferably an element which is one or more periods away from the selected 3d transition metal element 51. For example, when Ti or Ni is selected as the 3d transition metal element 51, Pd or Pt is preferably used as the additional element 52.

The reason for this is that, as described above or as represented by the composition formula, the added element "D(52)" is lattice-substituted for the 3d transition metal element in the crystal structure of silicide and the silicide layer 39 is rendered a mixed crystal. Therefore, the crystal structure of a compound (e.g., silicide) formed of the added element 52 and the Si element 50 and the crystal structure of a compound containing the additional element 52 are preferably approximate to the crystal structure of silicide formed of the Si element 50 and the 3d transition metal element 51.

For example, in the case of an MnP crystal structure as in NiSi, an element (e.g., Pt or Pd) in which silicide formed of Si and an additional element can have a crystal structure approximate to the MnP structure is preferably selected as the element 52 to be added to silicide serving as the base material.

The change in the composition and crystal structure of the silicide layer caused by the addition of the foreign element 52 is thus taken into consideration to prevent the adverse effect of the addition of the foreign element 52.

As shown in FIG. 3, in the resistance change memory according to the embodiment of the present invention, the silicide layer 39 which includes the Si element 50, the 3d transition metal element 51 forming silicide, and the element 52 having the atomic radius r2 greater than the atomic radius r1 of the element 51 is provided on at least one end of the non-ohmic element (e.g., a rectification element) forming the resistance change memory.

When the foreign element 52 is added to a certain silicide, the silicide layer 39 has high heat resistance, and characteristic deterioration of the junction of the silicide layer 39 and some other parts is reduced.

Thus, according to the resistance change memory in the embodiment of the present invention, the characteristics of elements constituting the resistance change memory, for example, the forward bias/reverse bias of a diode can be improved.

(2) Characteristics of Silicide

The characteristics of silicide included in the resistance change memory according to the embodiment of the present invention are next described with FIG. 4 to FIG. 8B.

Figure 4:
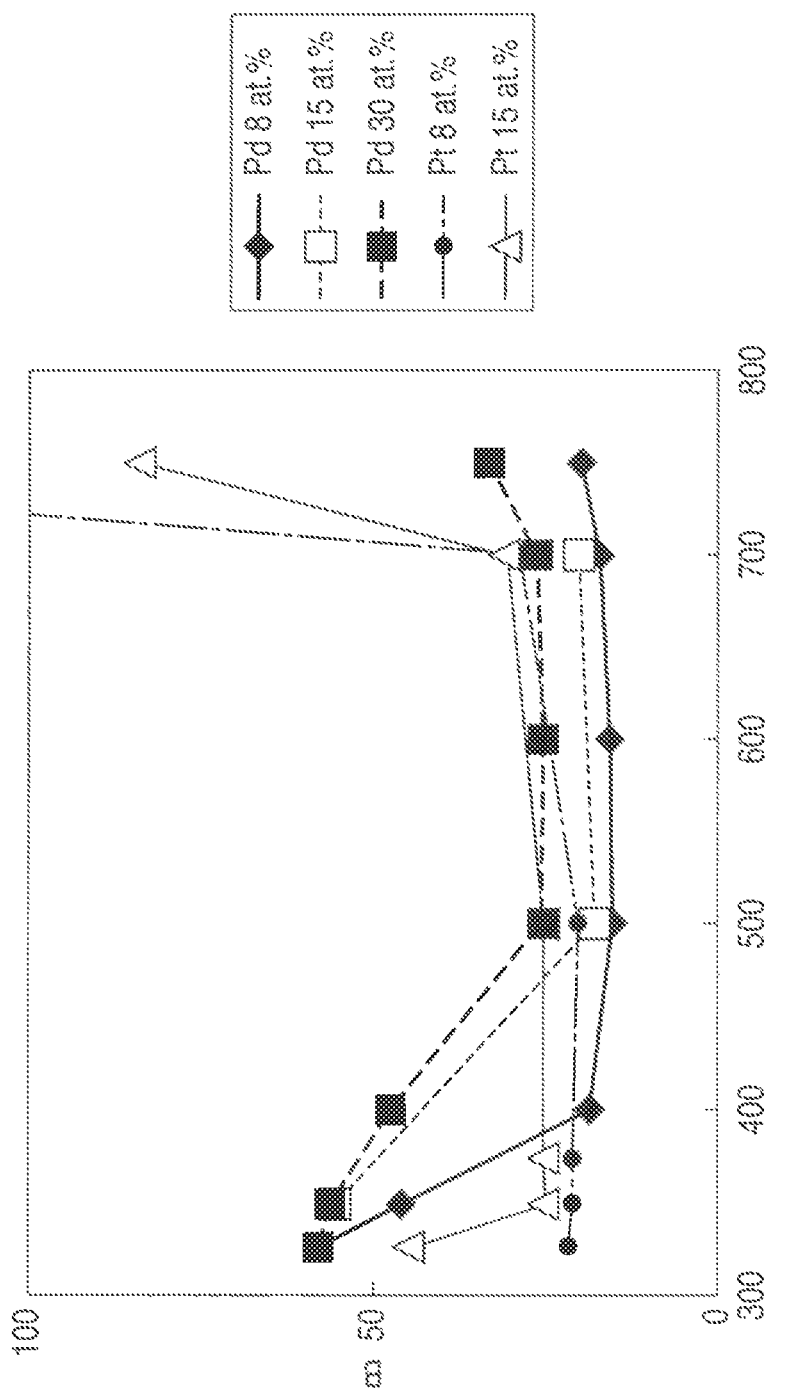
FIG. 4 is a graph for illustrating the characteristics of silicide included in the cell unit according to the present embodiment.

FIG. 4 is a graph showing the relation between the temperature of a thermal treatment for silicide and the electric resistance of silicide, in silicide included in the resistance change memory according to the present embodiment. In FIG. 4, the horizontal axis indicates heating temperature (denoted by "A" in FIG. 4, unit: ° C.), and the vertical axis indicates electric resistance (denoted by "B" in FIG. 4). In FIG. 4, the electric resistance is indicated by sheet resistance (unit: Ω/□).

In FIG. 4, the characteristics of silicide to which palladium (Pd) is added and the characteristics of silicide to which platinum (Pt) is added are shown. Silicide serving as the base material is nickel silicide ($NiSi_y$ ($0<y\leq2$)). In this case, in FIG. 3, Ni corresponds to the 3d transition metal element 51, and Pd or Pt corresponds to the additional element 52. $NiSi_y$ including Pd or Pt is formed on B-doped SiGe. Here, silicide is thermally treated by a rapid thermal annealing (RTA) method.

In FIG. 4, the concentrations of Pd are 8 atomic %, 15 atomic % and 30 atomic %, and the concentrations of Pt are 8 atomic % and 15 atomic %.

In the present embodiment, the concentrations (atomic percentages) of Pd and Pt are regulated by the ratio of Pd (or Pt) to Ni. In the present embodiment, this ratio is indicated by atomic percent, and written as atomic % or at. %. For example, when the concentration of Pd is 8 atomic %, $NiSi_y$ including Pd is indicated by $Ni_{0.92}Pd_{0.08}Si_y$ ($0<y\leq2$).

As shown in FIG. 4, at a thermal treatment temperature ranging from 500° C. to 700° C., the sheet resistance of $NiSi_y$ to which Pd is added and the sheet resistance of $NiSi_y$ to which Pt is added respectively show values ranging from 10Ω/□ to 30Ω/□ without any significant change in the resistance value.

If agglomeration of a metal in the silicide layer or phase separation of the silicide layer is caused, the electric resistance (sheet resistance) of the silicide layer is increased.

Therefore, the experimental result in FIG. 4 shows that even if $NiSi_y$ to which Pd or Pt is added is thermally treated at 500° C. to 700° C., there is no agglomeration of metal elements (Ni, Pd and Pt) in the silicide layer, no phase separation of silicide and no deterioration of the crystallinity of the silicide layer.

In particular, the electric resistance of $NiSi_y$ to which 8 atomic % of Pd and 15 atomic % of Pd is added maintains the same level as the resistance value at a heating temperature of 500° C. to 700° C. even if such $NiSi_y$ is thermally treated at 750° C.

In addition, the sheet resistance of Pd-added $NiSi_y$ thermally treated at 500° C. to 700° C. is lower than the sheet resistance of Pd-added $NiSi_y$ thermally treated at 350° C. This is attributed to the fact that the crystallinity of silicide has improved owing to the thermal treatment or a chemical reaction between the metal (Ni, Pd) elements and the Si element is optimized within a temperature range of 500° C. to 700° C. such that the composition ratio of silicide made of Ni, Pd and Si is closer to an ideal stoichiometric composition ratio.

On the other hand, the resistance value of $NiSi_y$ to which Pt is added is within a range of 350° C. to 700° C., and shows no great change. It is considered from this fact that the reaction temperature for silicidation of $NiSi_y$ containing Pt (hereinafter also referred to as a silicide reaction temperature) is lower than the silicide reaction temperature of $NiSi_x$ containing Pd.

Figure 5A:
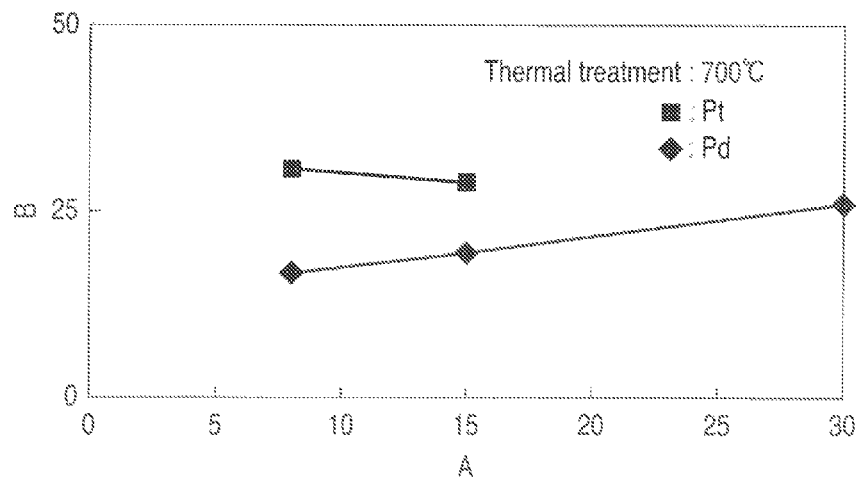
FIG. 5A is a graph for illustrating the characteristics of silicide included in the cell unit according to the present embodiment.
Figure 5B:
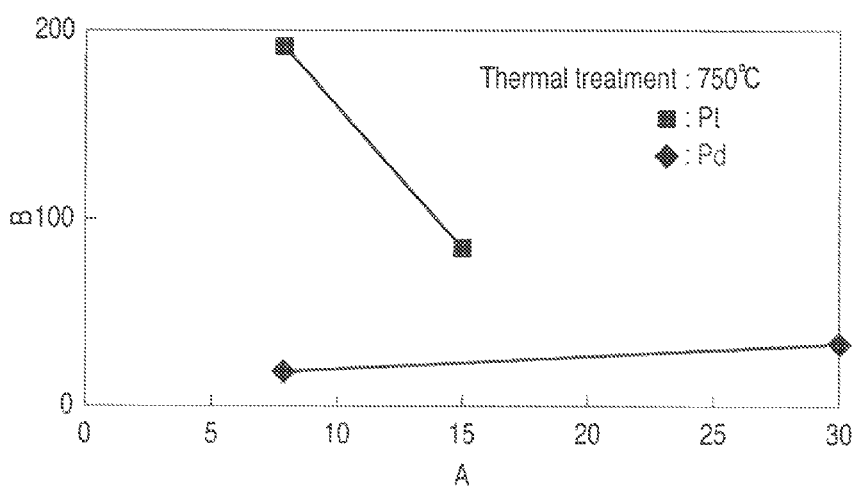
FIG. 5B is a graph for illustrating the characteristics of silicide included in the cell unit according to the present embodiment.

FIG. 5A and FIG. 5B show changes in the electric resistance of silicide included in the resistance change memory according to the present embodiment versus the concentration of the element (foreign element) added to silicide. In FIG. 5A and FIG. 5B, the horizontal axis indicates the concentration (denoted by "A" in FIG. 5A and FIG. 5B) of the added element, and the vertical axis indicates electric resistance (here, sheet resistance) (denoted by "B" in FIG. 5A and FIG. 5B). The unit of the concentration of the added element is at. % (atomic %).

FIG. 5A and FIG. 5B show the cases where Pd or Pt is added to $NiSi_y$ as in the example shown in FIG. 4. In addition, each silicide layer is formed on B-doped SiGe as in FIG. 4.

FIG. 5A shows the case where $NiSi_y$ to which Pd or Pt is added is thermally treated at 700° C. FIG. 5B shows the case where $NiSi_y$ to which Pd or Pt is added is thermally treated at 750° C.

As shown in FIG. 5A and FIG. 5B, the sheet resistance of Pd-added $NiSi_y$ is lower than the sheet resistance of Pt-added $NiSi_y$.

Moreover, as in FIG. 4, the sheet resistance of Pt-added $NiSi_y$ at a heating temperature of 750° C. is higher than the sheet resistance at a heating temperature of 700° C. On the other hand, the sheet resistance of Pd-added $NiSi_y$ even at a heating temperature reaching 750° C. is at about the same level as the sheet resistance at a heating temperature of 700° C.

Further, in Pd-added $NiSi_y$, a sheet resistance of the same level is obtained regardless of the concentration of Pd within the range of Pd concentration of about 8 atomic % to 30 atomic %.

In accordance with the experimental result shown in FIG. 4 to FIG. 5B, the silicide layer in which Pd is added to $NiSi_y$ can have low electric resistance, and can obtain a characteristic close to the maximum high-temperature resistance. This characteristic is particularly apparent when the silicide layer in which Pd is added to $NiSi_y$ is formed on SiGe.

Furthermore, regarding the high-temperature resistance of a silicide layer on a P-type silicon layer, as in a MIS diode that uses P-type silicon, Pd-added $NiSi_y$ shows more satisfactory high-temperature resistance (higher heat resistance) than Pt-added $NiSi_y$. In addition, if the manufacturing cost is compared with the characteristics of silicide, Pd-added $NiSi_y$ makes it possible to obtain a lower-cost and higher-performance element (e.g., rectification element) and resistance change memory that uses this element than Pt-added $NiSi_y$.

For example, when the concentration of added Pd is 15 atomic %, Pd-added $NiSi_y$ ($Ni_{0.85}Pd_{0.15}Si_y$) can ensure a relatively low sheet resistance of about 20Ω/□ and have high heat resistance at a temperature of about 750° C.

As a result, the amount of the addition of the foreign element (D) to silicide (base material) composed of the Si element (Si) and 3d transition metal element (M) (the ratio of element D to element M) is particularly preferably 15 atomic % or less. In this case, the value of "x" in the composition formula of silicide in the present embodiment is 0.15 or less.

Figure 6A:
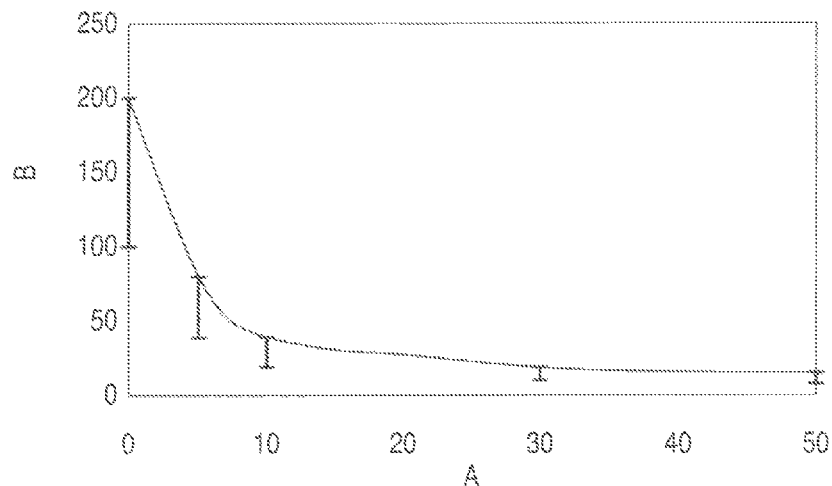
FIG. 6A is a graph for illustrating the characteristics of silicide included in the cell unit according to the present embodiment.
Figure 6B:
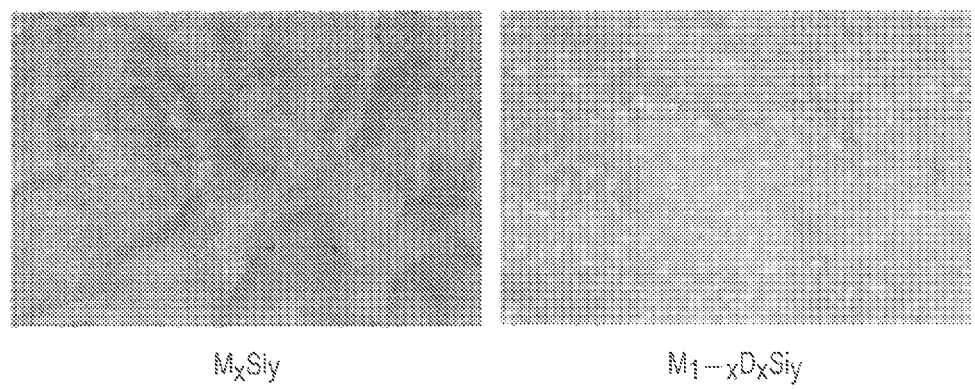
FIG. 6B is a view for illustrating the characteristics of silicide included in the cell unit according to the present embodiment.

The relation between the addition of the foreign element to a certain silicide and crystal grains constituting silicide is described with FIGS. 6A and 6B.

FIG. 6A shows the relation between the concentration [at. %] of an element added to silicide (denoted by "A" in FIG. 6A) and the crystal grain diameter [nm] of silicide (denoted by "B" in FIG. 6A), in silicide ($NiSi_y$) included in the resistance change memory according to the present embodiment. FIG. 6B shows microscopic images of the surface of the silicide layer. FIG. 6B shows the surface of nickel silicide ($NiSi_y$) to which no foreign element is added and the surface of $NiSi_y$ to which 30 atomic % of a foreign element is added.

As shown in FIG. 6A, when the concentration of the foreign element added to $NiSi_y$ is higher, the grain diameter of crystals constituting one silicide layer is smaller.

Furthermore, as shown in FIG. 6B, one silicide layer is formed of crystals having a greater grain diameter in $NiSi_y$ to which no foreign element is added, while one silicide layer is formed of crystals of 30 nm or less (hereinafter referred to as microcrystal) in $NiSi_y$ to which foreign element D is added.

As shown in FIG. 6A and FIG. 6B, the grain diameter of crystals constituting a certain silicide layer becomes smaller when an element different in size from the 3d transition metal element forming the silicide layer, in particular, element D having a greater atomic radius than the 3d transition metal element is added.

The smaller crystal leads to a smaller surface area of each crystal and more stable energy for maintaining crystal. It is considered that such stabilization of crystal energy attributed to the smaller crystal prevents decomposition of silicide crystals (interatomic bonds) and inhibits agglomeration of a metal and deterioration of the crystal phase of silicide even if high heat energy is applied to the silicide layer.

As shown in FIG. 4 to FIG. 6B, silicide which includes Si, a 3d transition metal element forming silicide, and an element having a greater atomic radius than the 3d transition metal element shows high-temperature resistance (high heat resistance).

A thermal treatment at about 500° C. is used in a back-end process of a general semiconductor device (e.g., an integrated circuit). A thermal treatment at about 600° C. to 700° C. may be used for a resistance change memory.

The silicide layer included in the resistance change memory according to the present embodiment is capable of maintaining electric properties without deterioration in the quality of the crystallinity of silicide even when thermally treated at 700° C. or more.

Therefore, as shown in FIG. 4 to FIG. 6B, silicide which includes a 3d transition metal element and an element having a greater atomic radius than the 3d transition metal element, such as $Ni_{1-x}Pd_xSi_y$ and $Ni_{1-x}Pt_xSi_y$, has resistance to a higher temperature (hereinafter referred to as high-temperature resistance) than the temperature of a thermal treatment in a general back-end process, and also has resistance to a high-temperature thermal treatment used for the resistance change memory.

Figure 7A:
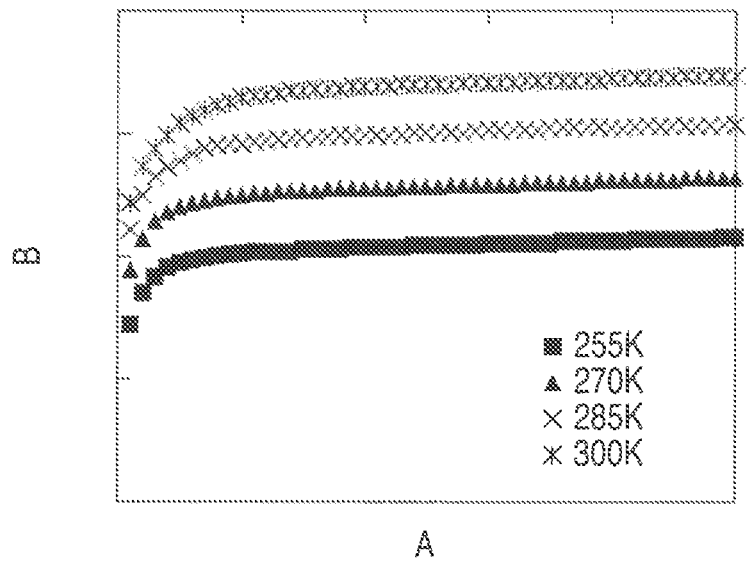
FIG. 7A is a graph for illustrating the characteristics of silicide included in the cell unit according to the present embodiment.
Figure 7B:
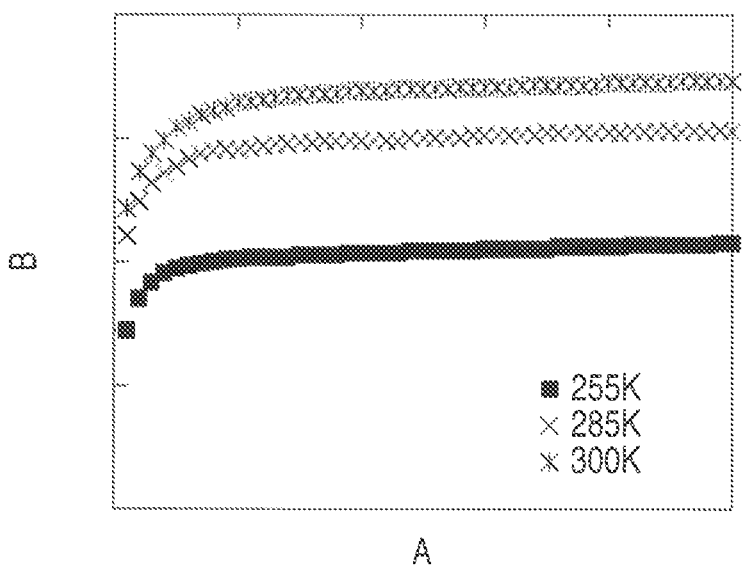
FIG. 7B is a graph for illustrating the characteristics of silicide included in the cell unit according to the present embodiment.

FIG. 7A and FIG. 7B shows current-voltage characteristics (I-V characteristics) in the junction of silicon and silicide according to the present embodiment. In FIG. 7A and FIG. 7B, the horizontal axis indicates the voltage applied to a silicon-silicide junction (denoted by "A" in FIG. 7A and FIG. 7B, unit: [V]), and the vertical axis indicates the current running through the junction due to the applied voltage (denoted by "B" in FIG. 7A and FIG. 7B, unit: [A]).

FIG. 7A shows I-V characteristics measured under temperature conditions at 255 K (absolute temperature), 270 K, 285 K and 300 K in the junction of silicide ($Ni_{0.87}Pd_{0.13}Si_y$) in which the concentration of Pd versus Ni is set at 13 atomic % and P-type silicon. FIG. 7B shows I-V characteristics measured under temperature conditions at 255 K (absolute temperature), 285 K and 300 K in the junction of silicide ($Ni_{0.70}Pd_{0.30}Si_y$) in which the concentration of Pd versus Ni is set at 30 atomic % and P-type silicon. In addition, "y" is a value indicated by a range of $0<y\leq 2$.

As shown in FIG. 7A, the junction of $Ni_{0.87}Pd_{0.13}Si_y$ and P-type silicon forms a Schottky junction. From the temperature dependence of each I-V characteristic shown in FIG. 7A, the height of a Schottky barrier of this junction measures about 0.28 eV.

As in FIG. 7A, $Ni_{0.70}Pd_{0.30}Si_y$ and P-type silicon forms a Schottky junction. From the temperature dependence of each I-V characteristic shown in FIG. 7B, the height of a Schottky barrier of $Ni_{0.70}Pd_{0.30}Si_y$ and P-type silicon measures about 0.31 eV.

Generally, in a Schottky junction of P-type silicon and each of $NiSi_y$ to which no Pd is added, titanium silicide ($TiSi_y$) and tantalum silicide ($TaSi_y$), the height of a Schottky barrier is about 0.4 eV to 0.5 eV.

The following is shown from the result of measurements in FIG. 7A and FIG. 7B.

If element D having a greater atomic radius than the atomic radius of element (3d transition metal element) M is added to silicide indicated by "$MSi_y$", the work function of silicide can be modulated. As shown in FIG. 7A and FIG. 7B, the modulation of the work function of silicide depends on the concentration of added element D.

Furthermore, if the work function of silicide is modulated by the addition of a foreign element, the work function of silicide versus silicon can be optimized, and the interface resistance of the silicon-silicide junction can be reduced.

For example, as described above, the Schottky barrier against P-type silicon is lower in $NiSi_y$ to which Pd is added than in $NiSi_y$ to which no Pd is added. That is, the interface resistance against P-type silicon can be lower in $NiSi_y$ to which Pd is added than in $NiSi_y$, $TiSi_y$ and $TaSi_y$ to which no foreign element is added.

The addition of the foreign element (e.g., Pt or Pd) to silicide tends to cause the segregation of Pt or Pd or of other impurities contained in silicon at the interface between silicide and silicon. Thus, a layer in which impurities are segregated with high concentration (referred to as a high-concentration segregation layer) is formed at the silicide-silicon interface. As a result, the interface resistance of the silicon-silicide junction is reduced.

As shown in FIG. 7A and FIG. 7B, in silicide including a 3d transition metal element and a foreign element (additional element) having a greater atomic radius than the atomic radius of the 3d transition metal element, the work function of silicide can be modulated by the addition of the foreign element, so that the interface resistance of the silicon-silicide junction can be reduced.

In addition, Pd or Pt is added to $NiSi_y$ in the case mainly illustrated in FIG. 4 to FIG. 7B, and the characteristics of silicide included in the resistance change memory according to the present embodiment have been described. However, substantially the same tendency as that in FIG. 4 to FIG. 7B is also shown and similar results can be obtained in the present embodiment when silicide made of an Si element and a different 3d transition metal element (e.g., Ti) and other additional elements (foreign elements) are used.

Advantages in the following case are described with FIG. 8A and FIG. 8B: the silicide layer ($M_{1-x}D_xSi_y$) including the Si element 50, the 3d transition metal element 51, and at least one kind of the element 52 having atomic radius r2 greater than atomic radius r1 of the 3d transition metal element 51 is applied to the resistance change memory, as shown in FIG. 3.

Figure 8A:
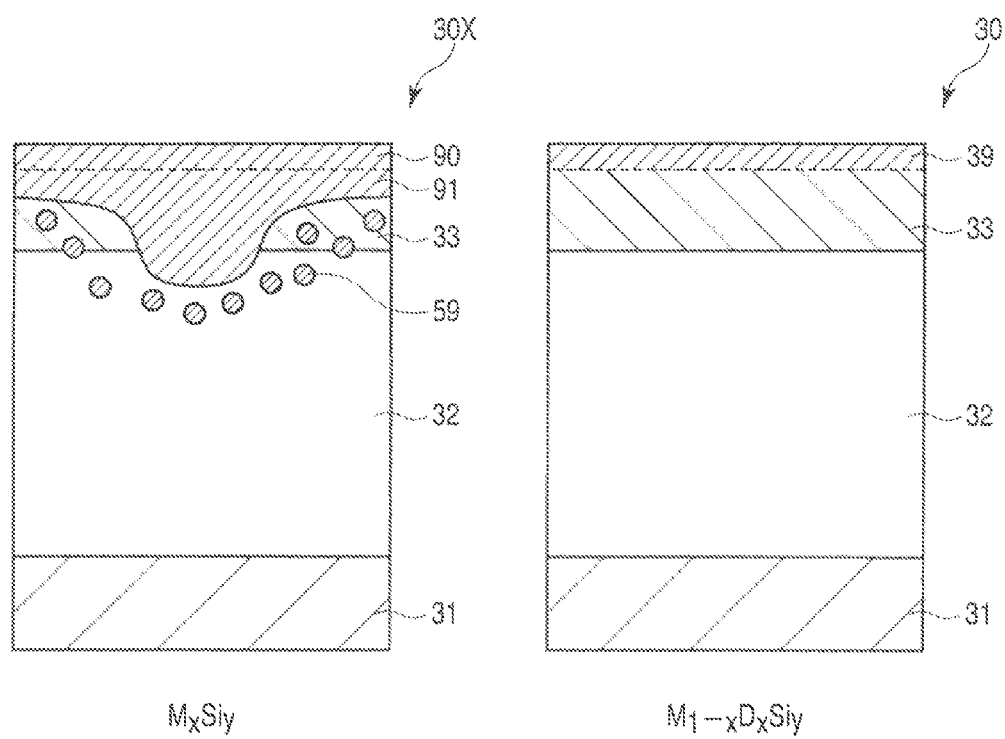
FIG. 8A is a diagram for illustrating the characteristics of silicide included in the cell unit according to the present embodiment.

FIG. 8A is a diagram schematically showing the state of the non-ohmic element included in the resistance change memory when subjected to a high-temperature thermal treatment. In FIG. 8A, diodes 30X, 30 constituting a cell unit of the cross-point type resistance change memory are shown. In addition, PIN diodes constituted of three semiconductor layers (silicon layers) 31, 32, 33 are shown as examples of diodes 30X, 30 in FIG. 8A.

Here, the PIN diode has a stack structure composed of the intrinsic semiconductor layer 32, semiconductor layer 33 containing a large amount of a P-type impurity (having a high concentration of acceptor impurities), and the semiconductor layer 31 containing a large amount of an N-type impurity (a high concentration of donor impurities). In addition, the stack positions (vertical relation) of the P-type semiconductor layer 33 and the N-type semiconductor layer 31 may be reverse to that in FIG. 8A.

In FIG. 8A, a silicide ($MSi_y$) 90 to which no foreign element is added is provided on one end (semiconductor layer 33 side) of the diode 30X. In FIG. 8A, a silicide ($M_{1-x}D_xSi_y$) 39 to which foreign element D is added is provided on one end (semiconductor layer 33 side) of the diode 30.

In the process of manufacturing the resistance change memory, a high-temperature thermal treatment at about 600° C. to 800° C. may be conducted to form the non-ohmic element and the memory element.

For example, the high-temperature resistance (heat resistance) of $NiSi_y$ to which no foreign element is added is about 600° C. When a thermal treatment at a high temperature of 600° C. or more is conducted, agglomerates 59 of metal element M forming silicide may be formed in the semiconductor layer 33 where the silicide layer 90 is provided and in the intrinsic semiconductor 32 thereunder, in the diode 30X that uses silicide to which no foreign element is added ($M_xSi_y$), as shown in FIG. 8A.

Furthermore, transition metal element (transition metal atom) M can diffuse into semiconductor layers 33, 32 due to the high-temperature thermal treatment. In particular, the intrinsic semiconductor 32 is provided between the N-type semiconductor layer 31 and the P-type semiconductor layer 33 in the PIN diode. Therefore, the diffusion of the metal atoms in the intrinsic semiconductor 32 forms an impurity level in the intrinsic semiconductor 32 and significantly deteriorates the electric properties of the PIN diode.

Moreover, due to an excessive silicide reaction resulting from the high-temperature thermal treatment, the silicide layer 91 may be formed to erode not only the end of the semiconductor layer 33 but also regions where formation of no silicide layer is needed, such as the inside of the semiconductor layer 33 and the intrinsic semiconductor 32. This erosion may break down a silicon-silicon junction.

This deteriorates the electric characteristics of the diode 30X, and degrades the operating characteristics of the resistance change memory. Moreover, if the thickness of semiconductor layer 33 is increased to reduce adverse effects of the agglomeration/diffusion of the metal element and the erosion by silicide, shrinking (decrease of the aspect ratio) of the cell unit is difficult.

Moreover, since the agglomeration/diffusion of the metal element and the erosion of the semiconductor layer by the silicide layer are nonuniform in the memory cell array, characteristic variation among the cell units in the memory cell array increases.

On the other hand, the silicide layer 39 including the Si element, the 3d transition metal element (M) and the element (D) having an atomic radius greater than the atomic radius of the 3d transition metal element has high-temperature resistance ranging from 700° C. to 750° C. owing to the smaller crystal grain as described with FIG. 4 to FIG. 6B.

Therefore, as shown in FIG. 8A, in diode 30 having silicide layer 39, the agglomeration/diffusion of the metal element (M or D) and the erosion by silicide are inhibited by the high heat resistance of silicide ($M_{1-x}D_xSi_y$) even if a thermal treatment at 500° C. or more is conducted.

This reduces the deterioration of the characteristics of the cell unit including the silicide layer, for example, the forward bias characteristic and reverse bias characteristic of the diode due to the high-temperature thermal treatment included in the process of manufacturing the resistance change memory.

FIG. 8B shows one example of the I-V characteristic of the diode. In FIG. 8B, the horizontal axis indicates a potential difference applied across both ends of the diode (denoted by "D" in FIG. 8B, unit: [V]), and the vertical axis indicates, on a logarithmic scale, the current running through the junction due to the applied potential difference (denoted by "E" in FIG. 8B, unit: [A]).

In FIG. 8B, characteristic line (full line) A indicates a simulation result obtained by a self-manufactured simulator regarding the I-V characteristic of the diode which is provided, on one end, with the silicide layer 39 including the Si element, the 3d transition metal element (M) and the additional element (D) as in, for example, the diode 30 shown in FIG. 8A. Characteristic line (chain line) B indicates a simulation result regarding the I-V characteristic of the diode which is provided, on one end, with the silicide layer including the Si element and the 3d transition metal element (M), that is, the silicide layer to which no foreign element is added. A silicon-silicide interface resistance model is applied to the simulations indicated by these characteristic lines A, B.

Characteristic line (broken line) C indicates measurements of the I-V characteristic of the diode shown by characteristic line B. Characteristic line B and characteristic line C show that the simulation and the measurements substantially correspond to each other.

In addition, the silicide layer forms an interface with the P-type silicon layer in the simulation and experiment shown in FIG. 8B. Moreover, in the diode corresponding to each of characteristic lines A, B, C, the silicide layer includes the same kind of 3d transition metal element.

The intensity (upper limit value) of an output current (referred to as a forward current) of the rectification element when a forward bias is applied is subject to the intensity of the interface resistance of the silicon-silicide junction. Specifically, the upper limit value of the forward current decreases if the interface resistance increases.

As shown in FIG. 7A and FIG. 7B, the work function of silicide can be modulated by the addition of an additional element (foreign element) of desired concentration to silicide. Thus, at the junction of silicon and silicide, resistance (interface resistance) generated in the interface can be reduced. That is, the interface resistance can be reduced, so that a current loss resulting from the interface resistance can be reduced.

Consequently, as indicated by characteristic line A in FIG. 8B, the upper limit of the forward current of the rectification element when a forward bias is applied can be improved in the resistance change memory according to the present embodiment, as compared with the rectification element that uses silicide indicated by characteristic line B to which no foreign element is added.

Therefore, at a certain voltage applied to the rectification element (non-ohmic element), the rectification element can supply a higher forward current to the memory element. This also contributes to a reduction in the power consumption of the resistance change memory.

Furthermore, since the silicide layer to which a foreign element is added has high-temperature resistance in the resistance change memory according to the present embodiment as described above, the agglomeration and diffusion of the metal element included in the silicide layer and the erosion of other parts by the silicide layer can be inhibited. This makes it possible to prevent the formation of an impurity level in the semiconductor layer and the breakdown of the junction.

Thus, in the resistance change memory according to the present embodiment, a high breakdown voltage can be ensured in the rectification element used as the non-ohmic element, and an output current (referred to as a reverse current) of the rectification element when a reverse bias is applied can be reduced.

Furthermore, in the resistance change memory according to the present embodiment, since the formation of randomly generated agglomerates and the diffusion of the metal element in the silicon layer can be inhibited, characteristic variation of the cell units in one memory cell array can be reduced.

Moreover, the forward bias/reverse bias characteristics of the rectification element can be improved, which contributes to the thickness reduction of the layers constituting the rectification element and the reduction of the area of the cell unit.

Consequently, according to the resistance change memory in the embodiment of the present invention, characteristic deterioration of the resistance change memory can be inhibited.

EXAMPLE (1) Configuration

An example of the resistance change memory according to the embodiment of the present invention is more specifically described with FIG. 9 to FIG. 19.

(a) Configurations of the Memory Cell Array and the Control Circuit

Figure 9:
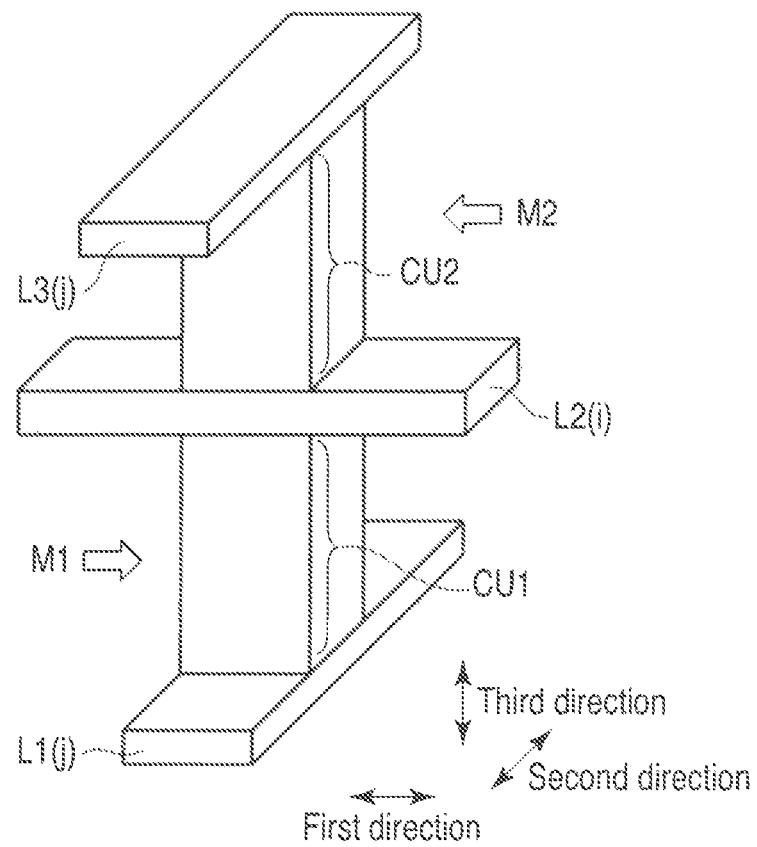
FIG. 9 is a diagram showing an example of the configuration of the cell unit.

FIG. 9 specifically shows one example of the configurations of the interconnect lines and the cell units in the cross-point type memory cell array.

Here, cell units CU1, CU2 in two memory cell arrays M1, M2 in FIG. 2 are shown. In this case, the cell units in two memory cell arrays M3, M4 in FIG. 2 are the same in configuration as the cell units in two memory cell arrays M1, M2 in FIG. 2.

Each of cell units CU1, CU2 is composed of a memory element and a non-ohmic element that are connected in series. Here, a rectification element is used for the non-ohmic element.

There are various patterns of the connection between the memory element and the rectification element. However, all the cell units in one memory cell array need to be the same in the connection between the memory element and the rectification element.

Figure 10:
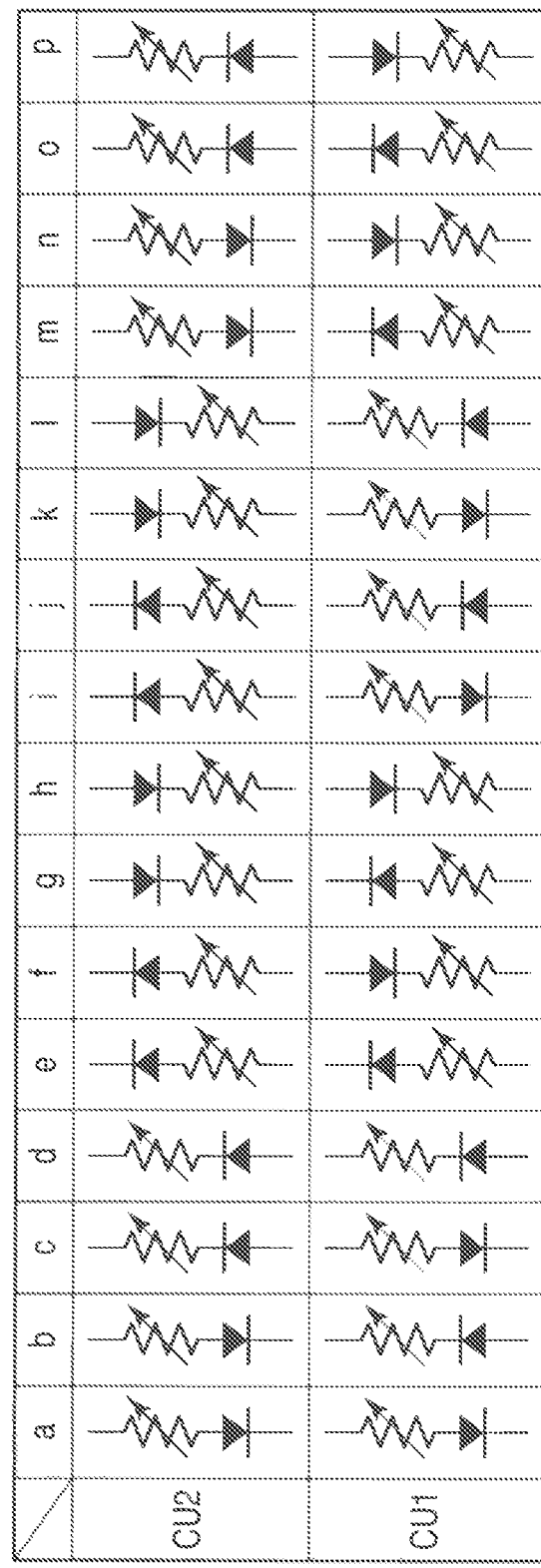
FIG. 10 is a diagram showing the connection between a memory element and a rectification element.

FIG. 10 shows the connection between the memory element and the rectification element.

In one cell unit, there are a total of four patterns of the connection between the memory element and the rectification element; two patterns of the positional relation between the memory element and the rectification element, and two patterns of the direction of the rectification element. Therefore, there are sixteen patterns (four patterns×four patterns) of the connection between the memory element and the rectification element regarding the cell units in two memory cell arrays.

a to p of FIG. 10 denote sixteen patterns of connection.

While the embodiment is applicable to all of the sixteen patterns of connection, the connection of "a" of FIG. 10 is mainly described below by way of example.

Figure 11B:
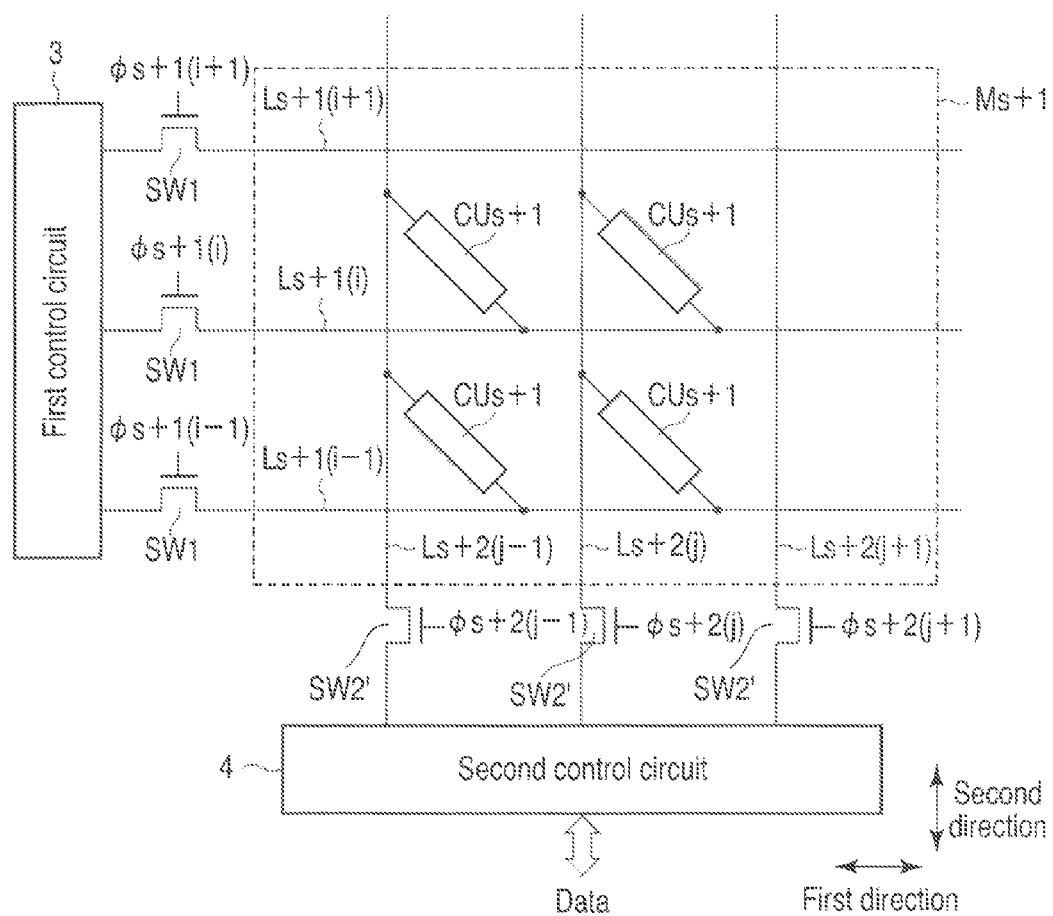
FIG. 11B is a diagram showing the layout of the first and second control circuits.

FIG. 11A and FIG. 11B show a first example of the layout of the first and second control circuits.

Memory cell array Ms in FIG. 11A corresponds to one layer M1, M2, M3, M4 of cross-point type memory cell array 2 shown in FIG. 2. As shown in FIG. 11A, memory cell array Ms is composed of a plurality of arrayed cell units CUs. The cell units CUs are connected on one end to interconnect lines Ls (j−1), Ls (j), Ls (j+1), and connected on the other end to interconnect lines Ls+1 (i−1), Ls+1 (i), Ls+1 (i+1).

As shown in FIG. 11B, memory cell array Ms+1 is composed of a plurality of arrayed cell units CUs+1. The cell units CUs+1 are connected on one end to interconnect lines Ls+1 (i−1), Ls+1 (i), Ls+1 (i+1), and connected on the other end to interconnect lines Ls+2 (j−1), Ls+2 (j), Ls+2 (j+1).

Here, s is 1, 3, 5, 7, . . . .

The first control circuit 3 is connected to interconnect lines Ls+1 (i−1), Ls+1 (i), Ls+1 (i+1) on one end in the first direction via switch elements SW1. Switch elements SW1 are controlled by, for example, control signals φs+1 (i−1), φs+1 (i), φs+1 (i+1). The switch element SW1 is configured by, for example, an N-channel field effect transistor (FET).

The second control circuit 4 is connected to interconnect lines Ls (j−1), Ls (j), Ls (j+1) on one end in the second direction via switch elements SW2. Switch elements SW2 are controlled by, for example, control signals φs (j−1), φs (j), φs (j+1). The switch element SW2 is configured by, for example, an N-channel FET.

Second control circuit 4 is connected to interconnect lines Ls+2 (j−1), Ls+2 (j), Ls+2 (j+1) on one end in the second direction via switch elements SW2'. Switch elements SW2' are controlled by, for example, control signals φs+2 (j−1), φs+2 (j), φs+2 (j+1). Switch element SW2' is configured by, for example, an N-channel field effect transistor.

Figure 11C:
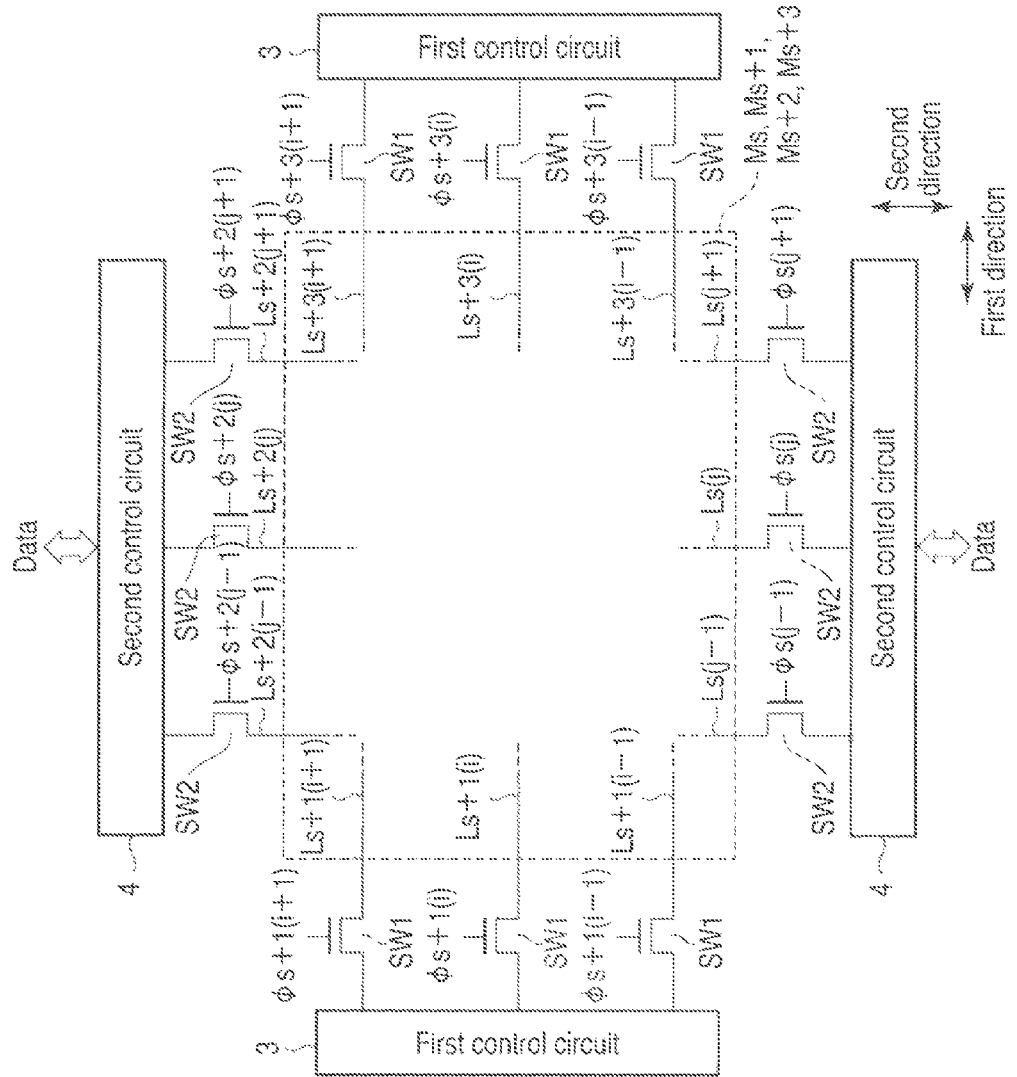
FIG. 11C is a diagram showing the layout of the first and second control circuits.

FIG. 11C shows a second example of the layout of the first and second control circuits. In addition, in FIG. 11C, the internal configuration of memory cell arrays Ms, Ms+1, Ms+2, Ms+3 is substantially the same as that of the memory cell array shown in FIG. 11A or FIG. 11B and is therefore not shown.

The layout in the second example is different from the layout in the first example in that first control circuits 3 are disposed at both ends of the first direction of memory cell array Ms, Ms+1, Ms+2, Ms+3 and in that second control circuits 4 are disposed at both ends of the second direction of memory cell array Ms, Ms+1, Ms+2, Ms+3.

Here, s is 1, 5, 9, 13, . . . .

First control circuits 3 are connected to interconnect lines Ls+1 (i−1), Ls+1 (i), Ls+1 (i+1) on both ends in the first direction via switch elements SW1. Switch elements SW1 are controlled by, for example, control signals φs+1 (i−1), φs+1 (i), φs+1 (i+1), φs+3 (i−1), φs+3 (i), φs+3 (i+1). The switch element SW1 is configured by, for example, an N-channel field effect transistor.

Second control circuits 4 are connected to interconnect lines Ls (j−1), Ls (j), Ls (j+1) on both ends in the second direction via switch elements SW2. Switch elements SW2 are controlled by, for example, control signals φs (j−1), φs (j), φs (j+1), φs+2 (j−1), φs+2 (j), φs+2 (j+1). The switch element SW2 is configured by, for example, an N-channel field effect transistor.

(b) Configuration of the Cell Unit

FIG. 12A to FIG. 12F show examples of the configuration of the cell unit.

One cell unit CU is disposed between two interconnect lines 60, 65. One cell unit CU is composed of one memory element 20 and one non-ohmic element 30.

In one cell unit, the memory element 20 is stacked on the non-ohmic element 30, or the non-ohmic element 30 is stacked on the memory element 20.

Here, in the stacking direction of two elements 20, 30, an interconnect line 65 side is called an upper side (upper end or upper part), and an interconnect line 60 side is called a lower side (lower end or lower part).

Here, a PIN diode is illustrated as the non-ohmic element 30. As described above, the PIN diode has a structure in which an intrinsic semiconductor layer is interposed between a P-type semiconductor layer and an N-type semiconductor layer. In addition, in accordance with the connection of two cell units of the memory cell array 2 shown in FIG. 10, the vertical relation between an anode layer and a cathode layer of the diode 30 in the stacking direction may be reverse.

For example, in the cell unit CU shown in FIG. 12A, in case the upper semiconductor layer 33 is a P-type semiconductor layer (anode layer) of the PIN diode, the lower semiconductor layer 31 is an N-type semiconductor layer (cathode layer) of the PIN diode. On the contrary, in case the upper semiconductor layer 33 is an N-type semiconductor layer (cathode layer) of the PIN diode, the lower semiconductor layer 31 is a P-type semiconductor layer (anode layer) of the PIN diode. In each case, the semiconductor layer 32 between two semiconductor layers 31, 33 is an intrinsic semiconductor layer of the PIN diode.

In the cell unit in FIG. 12B to FIG. 12F as well, two semiconductor layers 31, 33 sandwiching the intrinsic semiconductor layer 32 have a similar relation to that in FIG. 12A when a PIN diode is used for the rectification element (non-ohmic element) 30.

Each of semiconductor layers 31, 32, 33 is made of a material containing silicon as the main component. For example, silicon carbide (SiC), silicon germanium (SiGe), silicon tin (SiSn), polycrystalline silicon (Poly-Si), amorphous silicon or monocrystalline silicon is used to form semiconductor layers 31, 32, 33. In SiC, the concentration of C (carbon) against Si is about 0 to 3 atomic %. In SiGe, the concentration of Ge (germanium) versus Si is about 0 to 30 atomic %. In SiSn, the concentration of Sn (tin) versus Si is about 0 to 3 atomic %.

Furthermore, boron (B) is added to semiconductor layers 31, 33 containing P-conductivity-type silicon as the main component. Phosphorus (P) or arsenic (As) is added to semiconductor layers 31, 33 containing N-conductivity-type silicon as the main component. In addition, the intrinsic semiconductor layer may contain P-type/N-type impurities, but the concentration of the P-type/N-type impurities contained in the intrinsic semiconductor layer 32 is lower than the concentration of impurities contained in semiconductor layers 31, 33.

The memory element 20 has a structure in which the resistance change film 21 is interposed between two electrodes 25, 26. In the examples shown in FIG. 12A to FIG. 12F, the electrode 25 on the lower side in the stacking direction of two elements 20, 30 is called a lower electrode, and the electrode 26 on the upper side is called an upper electrode.

The resistance change film 21 is a layer made of a material with a resistance value that changes upon application of, for example, a voltage, a current or heat, or a material having a physicality such as a resistance value or capacitance (impedance) that changes due to a phase change. The resistance value of the resistance change film 21 is reversibly changed by the application of energy such as a voltage, and the condition in which the resistance value has changed is retained in a nonvolatile manner until energy that changes the resistance value is again provided.

In addition, the memory element 20 may be an element that shows such characteristics by the combination of electrodes 25, 26 and the resistance change film 21, or the resistance change film 21 may be an element that shows such characteristics.

Interconnect lines 60, 65 are used as a bit line and a word line, as described above. Interconnect lines 60, 65 are made of, for example, a metal such as Cu, Al or W, a metal compound such as titanium nitride (TiN) or tungsten nitride (WN), or silicide such as $NiSi_y$ or $TiSi_y$.

In the example shown in FIG. 12A, the memory element 20 is stacked on the diode 30. The diode 30 is disposed on the interconnect line 60. One end (bottom) of the diode 30 is electrically connected to the interconnect line 60. The other end (top) of the diode 30 is electrically connected to one end (lower electrode) of the memory element 20. The other end (upper electrode) of the memory element 20 is electrically connected to the interconnect line 65.

The diode 30 has the silicide layer 39A on its upper end, and the silicide layer 39A is provided on the top of the upper semiconductor layer 33. The silicide layer 39A intervenes between the semiconductor layer 33 and the lower electrode 25 of the memory element 20. For example, the silicide layer 39A is in direct contact with the lower electrode 25.

Furthermore, in the example shown in FIG. 12B, the diode 30 is stacked on memory element 20. In this case, the memory element 20 is disposed on the interconnect line 60. One end (lower electrode) of memory element 20 is electrically connected to the interconnect line 60. The other end (upper electrode) of the memory element 20 is electrically connected to one end (bottom) of the diode 30. The other end (top) of the diode 30 is electrically connected to the interconnect line 65. In the cell unit shown in FIG. 12B, the diode 30 has the silicide layer 39B on its lower end, and the silicide layer 39B is provided on the bottom of the lower semiconductor layer 31. Silicide layer 39B intervenes between the semiconductor layer 31 and the upper electrode 26. For example, the silicide layer 39B is in direct contact with the upper electrode 26.

In the example shown in FIG. 12C, the memory element 20 is stacked on the diode 30. The silicide layer 39B is provided on the bottom of the semiconductor layer 31 of the diode 30. The silicide layer 39B intervenes between the semiconductor layer 31 and the interconnect line 60. For example, the silicide layer 39B is in direct contact with the interconnect line 60.

In the example shown in FIG. 12D, the diode 30 is stacked on the memory element 20. The silicide layer 39A is provided on the top of the semiconductor layer 33 of the diode 30. The silicide layer 39A intervenes between the semiconductor layer 33 and the interconnect line 65. For example, the silicide layer 39A is in direct contact with the interconnect line 65.

As shown in FIG. 12A to FIG. 12D, the silicide layer 39A, 39B is only formed on a single end (one end) of the diode, so that the process of manufacturing the diode having the silicide layer 39A, 39B can be simpler.

Especially, when a silicide in which a metal element having a work function close to that of a valence band such as Pt, Pd, Os, Ir, Rh or Ru is added to a 3d transition metal element such as Ni or Ti that is used in the present embodiment is used as silicide ($M_{1-x}D_xSi_y$) in the present embodiment, the formation of the silicide layer 39A, 39B in a semiconductor layer containing P-conductivity-type silicon as the main component is effective. The reason for this is as follows: The system to which, for example, the above-mentioned Pt belongs has a work function (a Fermi level) close to that of the valence band of P-type Si, and such elements can improve the segregation of impurities at the interface and the activation rate of impurities. Therefore, the formation of an electric junction of silicide that uses the above-mentioned system and a P-type semiconductor (e.g., P-type Si) is preferable as regards the electric properties of the element.

Furthermore, as shown in FIG. 12E and FIG. 12F, silicide layers 39A, 39B may be provided on both ends (top/bottom) of the diode 30, respectively.

In the example shown in FIG. 12E, silicide layer 39A provided at the top of the diode 30 intervenes between the lower electrode 25 and the semiconductor layer 33. Moreover, the silicide layer 39B provided at the bottom of the diode 30 intervenes between the semiconductor layer 31 and the interconnect line 60. For example, the silicide layer 39A on the upper side of the element is in direct contact with the lower electrode 25, and the silicide layer 39B on the bottom side of element is in direct contact with the interconnect line 60.

In the example shown in FIG. 12F, the silicide layer 39A provided at the top of the diode 30 intervenes between the semiconductor layer 33 and the interconnect line 65. Moreover, the silicide layer 39B provided at the bottom of the diode 30 intervenes between the semiconductor layer 31 and the upper electrode 26. For example, the silicide layer 39A on the upper side of the element is in direct contact with the interconnect line 65, and the silicide layer 39B on the bottom side of the element is in direct contact with the upper electrode 26.

One of the cell units shown in FIGS. 12A and 12F is disposed between the bit line and the word line to satisfy the connection relation shown in FIG. 10 to configure a memory cell array and a cross-point type memory cell array.

As in the cell units CU shown in FIG. 12A to FIG. 12F, the silicide layer 39A, 39B is provided on at least one end (top) or the other end (bottom) of the non-ohmic element (e.g., rectification element). As shown in FIG. 3, the silicide layer 39A, 39B includes the Si element 50, the 3d transition metal element 51 that combines with the Si element to form silicide, and the additional element (foreign element) 52 having an atomic radius greater than the atomic radius of the 3d transition metal element.

The junction of the silicide layer 39A, 39B and the silicon layer 31, 32 may have a segregation layer (not shown) in which impurities (donor/acceptor) contained in the silicon layer are segregated with high concentration due to the addition of the additional element 52.

Further, the silicide layer 39A, 39B may contain one kind of additional element, or may contain two or more kinds of additional elements.

Although three semiconductor layers are stacked as in a PIN diode in the structures illustrated in FIG. 12A to FIG. 12F, a metal-insulator-semiconductor (MIS) diode, a SIS structure or a MIM structure may be used for the non-ohmic element 30, or a structure in which two layers are stacked as in a PN diode may be used for the non-ohmic element. Moreover, the non-ohmic element may be an element which allows non-ohmic characteristics to be formed by four layers (films).

For example, if the non-ohmic element 30 having the silicide layer 39A in the present embodiment is a MIS diode, three layers are stacked in the following order: a metal layer, an insulating layer and a semiconductor layer from the lower side; or a semiconductor layer, an insulating layer and a metal layer from the lower side. In addition, a structure in which the silicide layer is only provided on the semiconductor layer is sufficient for the MIS diode. However, the semiconductor layer and the silicide layer may be provided on the surface of the metal layer opposite to the junction surface of the metal layer and the insulating layer.

Moreover, the non-ohmic element 30 may have a structure in which three or more P-type semiconductor layers and N-type semiconductor layers are alternately stacked, such as a three-layer bipolar transistor type structure or a four-layer thyristor type structure. Especially, in case the upper semiconductor layer 33 is a P-type semiconductor layer or an N-type semiconductor layer in the above-mentioned structure, the silicide layer 39A, 39B described in the present embodiment may be provided in the semiconductor layer 33.

In FIG. 12A to FIG. 12F, a diffusion preventing layer or an adhesive layer may be provided between the interconnect line 60, 65 and the non-ohmic element 30, between the non-ohmic element 30 and the memory element 20 or between the memory element 20 and the interconnect line 60, 65. The diffusion preventing layer prevents the diffusion of constituent atoms or constituent elements of each part between parts that are joined together. The adhesive layer secures the bonding force between joined parts and prevents the separation of the parts. In addition, electrodes 25, 26 may have substantially the same function as the diffusion preventing layer or the adhesive layer.

FIG. 13A to FIG. 13C show one example of the non-ohmic element (here, the rectification element) and the work function of silicide.

In FIG. 13A and FIG. 13B, a PIN diode is shown as the non-ohmic element. In case the non-ohmic element includes a semiconductor layer as in the PIN diode, the silicide layer 39 used in the present embodiment is provided in the P-type semiconductor layer 35 or the N-type semiconductor layer 37 depending on the connection of the cell units. The intrinsic semiconductor layer 36 is provided between the P-type semiconductor layer 35 and the N-type semiconductor layer 37. Semiconductor layers 35, 36, 37 are semiconductor layers containing silicon as the main component, and may be a layer containing Ge or C in addition to silicon. Here, for ease of explanation, these semiconductor layers are simply referred to as P-type/N-type silicon layers.

When the silicide layer and the N-type silicon layer form an interface (junction), the relation between the conduction band of the N-type silicon layer and the work function of the silicide layer affects the electric properties of the element. When the silicide layer and the P-type silicon layer form an interface (junction), the relation between the valence band of the P-type silicon layer and the work function of the silicide layer affects the electric properties of the element. That is, the difference between the conduction band (N-type Si)/valence band (P-type Si) of silicon and the work function of silicide is one of the causes of interface resistance.

In case the energy difference between the conduction band (N-type Si)/valence band (P-type Si) of silicon and the work function of silicide is closer to 0 eV, the interface resistance is lower, and a current and a voltage output via the silicon-silicide junction are higher.

As long as the P-type/N-type silicon layer that forms an interface with the silicide layer is a P+/N+ silicon layer having a high impurity concentration of, for example, $10^{20}/cm^3$ or more, an energy difference that can reduce a loss caused by the interface resistance is sufficient. In this case, the energy difference between the valence band of P-type silicon and the work function of silicide and the energy difference between the conduction band of N-type silicon and the work function of silicide may be, by way of example, 0.7 eV or less.

As described with FIG. 7A and FIG. 7B, the magnitude of the work function of silicide to silicon can be adjusted by adding at least one kind of additional element having an atomic radius greater than the atomic radius of the 3d transition metal element to the silicide layer composed of the Si element and the 3d transition metal element.

Therefore, by controlling the combination of the material of silicide and an additional element and controlling the addition amount of the additional element, the work function of silicide can be adjusted to a value suitable for silicon forming the rectification element. This makes it possible to reduce the interface resistance generated at the junction of P-type/N-type semiconductor (e.g., P-type/N-type silicon) and silicide.

FIG. 13C shows the magnitude of the work function of each kind of silicide. In FIG. 13C, the horizontal axis indicates a base material for forming silicide layer 39 of the present embodiment, and the vertical axis indicates the work function to silicon (denoted by "A" in FIG. 13C, unit: [eV]).

As shown in FIG. 13A, when an interface is formed between silicide layer 39 and the P-type semiconductor layer (e.g., the P-type silicon layer), silicide belonging to group G1 enclosed by a full line in FIG. 13C is preferably used as the base material (also referred to as a base silicide material) for forming silicide layer 39 in the P-type silicon layer.

Among silicides in group G1, $TiSi_y$, $VSi_y$, $CrSi_y$, $MnSi_y$, $FeSi_y$, $CoSi_y$, $NiSi_y$, $NdSi_y$, $MoSi_y$, $HfSi_y$, $TaSi_y$, $WSi_y$, $PdSi_y$, $IrSi_y$, $PtSi_y$, $RhSi_y$, $ReSi_y$ or $OsSi_y$ is used as the base silicide material for the silicide layer 39. It is preferable to add a foreign element to these silicides in order to reduce the resistance of the interface between the silicide layer 39 and the P-type silicon layer. In addition, "y" in each composition formula is indicated by a value higher than 0 and a value equal to or lower than 2.

As shown in FIG. 13B, when an interface is formed between silicide layer 39 and the N-type semiconductor layer (e.g., the N-type silicon layer), silicide belonging to group G2 enclosed by a broken line in FIG. 13C is preferably used as the base silicide material for forming the silicide layer 39 in the N-type silicon layer.

Among silicides in group G2, $TiSi_y$, $VSi_y$, $CrSi_y$, $MnSi_y$, $FeSi_y$, $CoSi_y$, $NiSi_y$, $NdSi_y$, $MoSi_y$, $HfSi_y$, $TaSi_y$, $YSi_y$, $YbSi_y$, $ErSi_y$, $HoSi_y$, $DySi_y$, $GdSi_y$ or $TbSi_y$ is used as the base silicide material for the silicide layer 39. It is preferable to add a foreign element to these silicides in order to reduce the resistance of the interface between the silicide layer 39 and the N-type silicon layer. In addition, "y" in each composition formula is a value indicated by 1 to 2.

Not only the amount of doping of the silicide layer 39 with the additional element adjusted but also the material of silicide to serve as the base silicide material for the silicide layer 39 is changed depending on whether the silicon layer that combines with the silicide layer to form a junction is a P-type silicon layer or an N-type silicon layer. Thereby, the high-temperature resistance of silicide layer 39 is improved, and the resistance of the interface between the silicon layer and silicide layer 39 can be reduced by using a material having more suitable physicality.

In addition, from the perspective of the high-temperature resistance, $TiSi_y$, $CoSi_y$, $PtSi_y$, $TaSi_y$ or $WSi_y$ is effective as the base material for forming silicide layer 39 to which a foreign element is added.

Moreover, in the case illustrated in FIG. 13A and FIG. 13B, the silicide layer 39 forms an interface with the P-type/N-type silicon layer that configures the PIN diode. However, the example shown in FIG. 13A and FIG. 13B is substantially the same as the case where the silicide layer 39 is provided in a P-type/N-type silicon layer that configures a different element structure, such as a PIN structure, a MIS structure (e.g., a MIS diode) or a PN structure (e.g., a PN diode).

The high-temperature resistance of the silicide layer can be improved and the interface resistance can be reduced by adjusting the arrangement, in the cell unit, of the silicide layer 39, 39A, 39B which includes an additional element having a greater atomic radius than the atomic radius of the 3d transition metal element or by adjusting the material serving as the base material for the silicide layer 39, 39A, 39B as shown in FIG. 12A to FIG. 13C in accordance with the configurations of the memory cell array and the cell unit.

In the resistance change memory according to the present embodiment, the high-temperature resistance of the silicide layer is improved by the addition of the foreign element, so that the agglomeration or diffusion of the metal elements (atoms) included in the silicide layer and the erosion by the silicide layer can be inhibited. As a result, the breakdown voltage of the rectification element can be higher, and the output current of the rectification element when a reverse bias is applied can be reduced.

Furthermore, in the resistance change memory according to the present embodiment, the interface resistance of the silicon-silicide junction is reduced by the addition of the foreign element, so that the output current of the rectification element when a forward bias is applied can be increased.

Moreover, these improvements in the element characteristics can contribute to the thickness reduction of the element and the reduction of a cell area. As described above, according to the resistance change memory in the embodiment, characteristic deterioration of the element used in the resistance change memory can be inhibited.

(2) Manufacturing Method (a) First Manufacturing Method

Figure 14C:
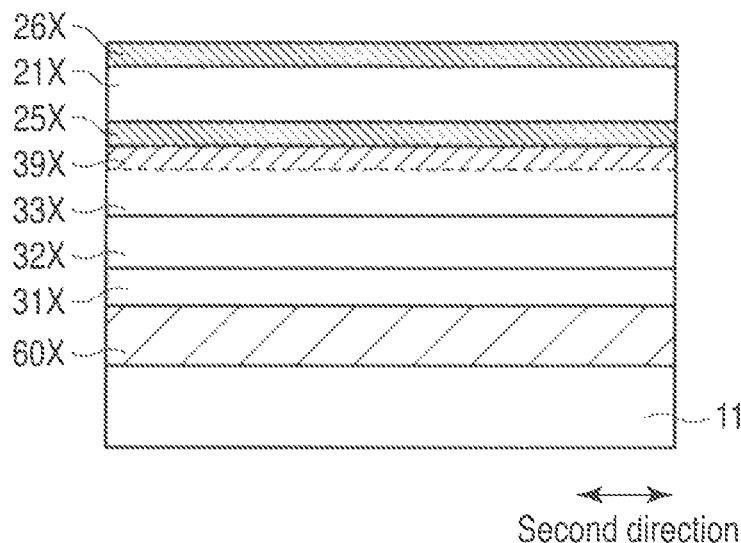
FIG. 14C is a diagram showing one step of the first method of manufacturing the resistance change memory according to the embodiment.
Figure 14D:
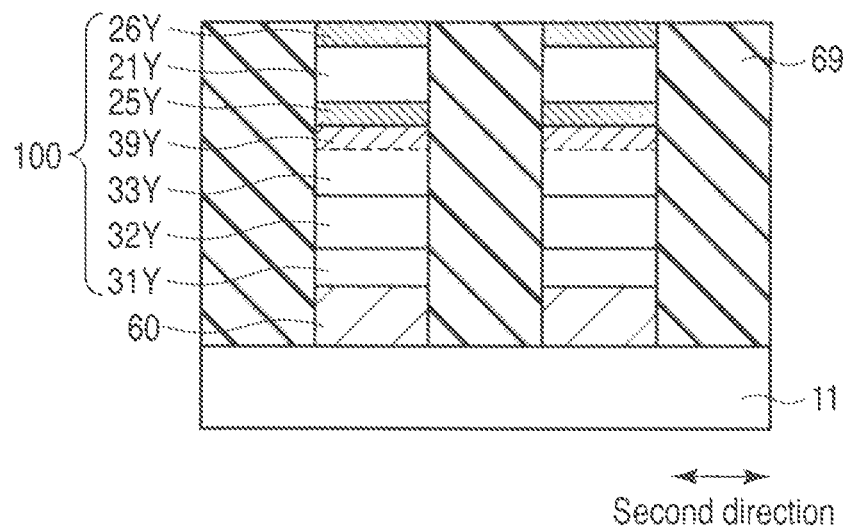
FIG. 14D is a diagram showing one step of the first method of manufacturing the resistance change memory according to the embodiment.
Figure 14G:
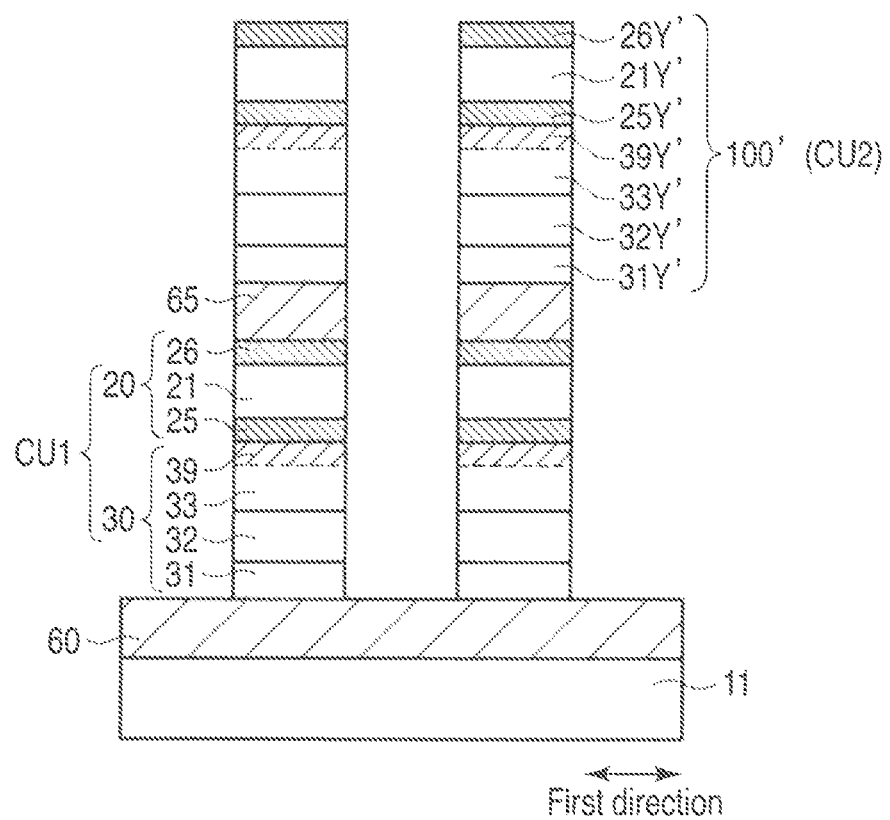
FIG. 14G is a diagram showing one step of the first method of manufacturing the resistance change memory according to the embodiment.

A first method of manufacturing the resistance change memory according to the present embodiment is described with FIG. 14A to FIG. 14G. Here, FIG. 14A to FIG. 14E show sectional process views taken along the second direction of a memory cell array in one step of the present manufacturing method. Further, FIG. 14F and FIG. 14G show sectional process views taken along the first direction of a memory cell array in one step of the present manufacturing method.

Although a memory element is stacked on a non-ohmic element in the structure of a cell unit formed in the case of this manufacturing method, this manufacturing method is not limited to this structure.

As shown in FIG. 14A, a conductive layer 60X serving as a interconnect line is deposited on the substrate (e.g., an interlayer insulating film) 11 by, for example, a chemical vapor deposition (CVD) method or a sputter method.

A plurality of layers for forming a rectification element (non-ohmic element) of a cell unit are sequentially deposited on the conductive layer 60X by, for example, the chemical vapor deposition (CVD) method.

For example, in case the rectification element is a PIN diode, three semiconductor layers 31X, 32X, 33X are stacked. Semiconductor layers 31X, 32X, 33X contain silicon, and are made of, for example, at least one of an SiC layer, an SiGe layer, an SiSn layer, a polycrystalline Si layer, an amorphous silicon layer and a monocrystalline Si layer. In the SiC layer, the ratio of C to Si is, for example, 0 atomic % to 3 atomic %. In the SiSn layer, the ratio of Sn to Si is, for example, 0 atomic % to 3 atomic %. In the SiGe layer, the ratio of Ge to Si is, for example, 0 atomic % to 30 atomic %.

In case that the rectification element in the cell unit is a PIN diode, one of semiconductor layers 31X, 33X is a P-type semiconductor layer (e.g., B-doped Si), and the other is an N-type semiconductor layer (e.g., P-doped Si). The semiconductor layer 32X between the semiconductor layer 31X and the semiconductor layer 33X is an intrinsic semiconductor layer.

In case a PN diode is used as the rectification element, two semiconductor layers are stacked on the conductive layer 60X. In case a MIS diode is used as the rectification element, a metal layer, an insulating layer and a semiconductor layer are stacked on the conductive layer 60X.

The stacking order of two or more layers such as the semiconductor layers constituting the rectification element is appropriately changed depending on which of the circuit configurations, indicated by a to p of FIG. 10, the cell unit has. For example, when the cell unit has the configuration indicated by "a" of FIG. 10, the N-type semiconductor layer (cathode layer) 31X having a thickness of about 5 nm to 30 nm is deposited on the conductive layer 60X in FIG. 14A. The intrinsic semiconductor layer (I layer) 32X having a thickness of about 50 nm to 120 nm is deposited on the N-type semiconductor layer 31X. Further, the P-type semiconductor layer (e.g., an anode layer) 33X having a thickness of about 5 nm to 30 nm is deposited on the intrinsic semiconductor layer 32X.

Here, three stacked layers (semiconductor layers) 31X, 32X, 33X are referred to as silicon layers 31X, 32X, 33X.

In addition, a diffusion preventing layer, an adhesive layer and a high-concentration impurity layer may be formed between the conductive layer 60X and the silicon layer 31X.

A metal film 59 is deposited on the semiconductor layer 33X by, for example, the sputter method or the CVD method. In the first manufacturing method according to the present embodiment, the metal film 59 is an alloy film. This alloy film includes a 3d transition metal element 51, and an additional element 52 having an atomic radius greater than the atomic radius of the 3d transition metal element 51.

The 3d transition metal element 51 is one kind of element selected from the above-mentioned 3d transition metal element group consisting of Sc, Ti, V, Cr, Mn, Fe, Co, Ni, Cu and Zn. The additional element 52 is at least one kind of element selected from the above-mentioned additional element group consisting of Y, Zr, Nb, Mo, Tc, Ru, Rh, Pd, Ag, Cd, La, Ce, Pr, Nd, Pm, Sm, Eu, Gd, Tb, Dy, Ho, Er, Tm, Yb, Lu, Hf, Ta, W, Re, Os, Ir, Pt, Au, In, Ti, Ge, Sn and Pb.

For example, when Ni or Ti is used as the 3d transition metal element 51, Pd or Pt is used as the additional element 52. In addition, the metal film 59 may include two or more kinds of additional elements. For example, the metal film 59 may include both Pd and Pt.

The substrate 11 is performed to a thermal treatment (silicide treatment) for forming a silicide layer. For example, the silicon layer 33 serves as the source of silicon (hereinafter referred to as a base layer) for forming a silicide layer. The thermal treatment is conducted at a temperature ranging from, for example, 500° C. to 800° C. A rapid thermal annealing (RTA) method or other heating method may be used as a heating method for the silicide treatment.

A silicide reaction between the silicon layer 33X and the alloy film 59 is caused by this thermal treatment. Therefore, as shown in FIG. 14B, the silicide layer 39X is formed on the top of silicon layer 33X. The silicide layer 39X includes the Si element 50 derived from the silicon layer 33X, the 3d transition metal element 51 derived from the alloy film, and the additional element 52. Crystal grains constituting silicide layer 39X are rendered microcrystal by the addition of a foreign element to a certain silicide.

In FIG. 14A, the ratio of the 3d transition metal element 51 and the additional element 52 included in the alloy film 59 is appropriately set on the basis of the stoichiometric composition ratio of the silicide layer 39X to be formed or on the basis of an amount in which a desired high-temperature resistance and a desired work function are obtained. Similarly, the thickness of the alloy film 59 is set by a thickness relative to the thickness of the semiconductor layer 33X so that desired silicide layer 39X may be formed. The composition ratio and thickness of the silicide layer 39 to be formed may be controlled in accordance with the heating time or temperature of the silicide treatment.

In addition, due to the formation of the silicide layer 39 to which the foreign element 52 is added, a segregation layer (not shown) in which impurities (donor/acceptor) contained in the silicon layer 33 are segregated may be formed at the junction (interface) of the silicide layer 39 and the silicon layer 33.

After the silicide treatment, the alloy film 59 which has not caused a silicide reaction with the silicon layer is removed by, for example, wet etching.

In addition, the silicide layer 39X may further include elements (e.g., B, Ge) other than the Si element contained in the silicon layer 33X.

As shown in FIG. 14C, a first electrode layer 25X, a resistance change film 21X and a second electrode layer 26X are sequentially deposited on the silicide layer 39X as constituent parts of the memory element. Electrode layers 25X, 26X are formed by, for example, the CVD method or sputter method. The resistance change film 21X is formed by, for example, the sputter method, the CVD method, an atomic layer deposition (ALD) method, or a metal-organic CVD (MOCVD) method.

The materials for electrode layers 25X, 26X and the resistance change film 21X are selected by the combination of materials whereby the resistance value of the resistance change film 21X reversibly changes and the changed resistance value of the resistance change film 21X is retained in a nonvolatile manner. However, the material for electrode layers 25X, 26X is not limited as long as the resistance change film 21X itself reversibly changes its resistance value due to externally provided energy (e.g., a voltage or heat) and retains the changed resistance value.

As described above, a metal oxide, a metal compound or organic matter is used for the resistance change film 21X. Thus, a high formation temperature of about 600° C. to 800° C. may be used, depending on the material that forms the resistance change film 21X.

In the present embodiment, the silicide layer 39X formed on the silicon layer 33X includes an additional element having an atomic radius greater than the atomic radius of the 3d transition metal element, in addition to the Si element and the 3d transition metal element. Thus, as shown in FIG. 4 to FIG. 6, crystal grains constituting the silicide layer 39 are rendered microcrystal, so that silicide layer 39X has high high-temperature resistance (heat resistance).

Therefore, in the manufacturing method according to the present embodiment, agglomeration of metal elements for forming the silicide layer 39X is not easily caused by the high-temperature thermal treatment, and the formation of resultant agglomerates in the silicide layer 39X and silicon layers 32X, 33X thereunder is inhibited. The diffusion of the metal elements included in the silicide layer 39X into silicon layers 32X, 33X is also inhibited. Moreover, the silicon layer 33X is prevented from being reduced to a thickness smaller than a predetermined thickness due to excessive formation of the silicide layer 39X resulting from the high-temperature thermal treatment, and the junction (interface) of two silicon layers is prevented from being broken due to the erosion of two silicon layers 32X, 33X by the silicide layer 39X.

This reduces the need to increase the thickness of silicon layers 31X, 32X, 33X to alleviate the adverse effects of the diffusion of the metal elements and the erosion by the silicide layer.

As shown in FIG. 14D, a mask (not shown) having a predetermined shape is formed on an electrode layer 26Y. For example, each layer under the mask is processed in accordance with the shape of the mask by etching that uses a reactive ion etching (RIE) method. As a result, electrode layer 25Y, 26Y, a resistance change film 21Y, a silicide layer 39Y and silicon layers 31Y, 32Y, 33Y are sequentially processed, and divided into cell units in the second direction with a predetermined space. Thus, a stack 100 is formed on substrate 11. Formed stack 100 extends in the first direction. Simultaneously with the formation of the stack 100, conductive layer is processed, and the interconnect line 60 extending in the second direction is formed on the substrate 11.

Then, an interlayer insulating film 69 is embedded between adjacent stacks 100 by, for example, the CVD method or a coating method.

In addition, in this step, the stack may be divided in the first direction and a interconnect line extending in the second direction may be formed to form the first memory cell array M1 shown in FIG. 2. However, in a cross-point type memory cell array, the cell unit and the memory cell array are preferably formed in the manufacturing process shown in FIG. 14E and FIG. 14F without dividing stack 100 in the first direction immediately after the step shown in FIG. 14D.

As shown in FIG. 14E and FIG. 14F, conductive layer 65X serving as a second interconnect line is deposited on stack 100 and interlayer insulating film 69 extending in the first direction. Then, layers to constitute the cell unit of a second memory cell array are sequentially deposited on conductive layer 65X. The stacking order of the layers on conductive layer 65X varies depending on which of the connection relations indicated by "a" to "p" of FIG. 10 two cell units shared by one interconnect line (conductive layer 65X) have. For ease of explanation, the two cell units have the connection relation indicated by "a" of FIG. 10 in the case described here.

In the example shown in FIG. 14E, the stacking order of layers 31X', 32X', 33X', 25X', 21X', 26X' on a conductive layer 65X is the same as the stacking order of the layers constituting stack 100. The layers stacked on conductive layer 65X are formed in the same manufacturing process as the layers constituting the stack 100, respectively.

When the silicide layer 39X' is formed above stack 100, the whole substrate is subjected to a high-temperature (about 500° C. to 800° C.) thermal treatment. The silicide layer 39Y in the stack 100 is rendered microcrystal by the addition of a foreign element, and therefore has high-temperature resistance. Thus, in the stack 100 including the silicide layer 39Y, adverse effects of the high-temperature thermal treatment, such as the diffusion of the metal elements included in the silicide layer 39Y and the erosion of the silicon layer 33Y by the silicide layer 39Y are inhibited.

The stack 100 on the interconnect line 60 and the layers on the stack 100 are processed by a photolithographic technique and the RIE method in such a manner as to ensure the etching selectivity for the interconnect line 60. The stack 100 extending in the first direction is divided into cell units in the first direction with a predetermined space. Simultaneously with the division of the stack in the first direction, The conductive layer 65X on the stack is processed into individual patterns divided in the first direction, and an interconnect line 65 extending in the second direction is formed on the stack disposed on the interconnect line 60 extending in the first direction.

As shown in FIG. 14G, cell unit CU1 is formed between the interconnect line 60 extending in the first direction and the interconnect line 65 extending in the second direction.

In a cell unit CU1, a rectification element (non-ohmic element) 30 has a silicide layer 39 at the top, and the silicide layer 39 is provided on the top surface of a silicon layer 33. Further, a memory element 20 is provided on the silicide layer 39.

Moreover, since the layers are etched starting from the upper layer in order, a stack 100' is formed on the cell unit CU1 with the interconnect line 65 in between. Similarly to the interconnect line 65, the stack 100' is divided in the first direction with a predetermined space. In the step shown in FIG. 14G, the stack 100' extends in the second direction, in the same manner as in FIG. 14E. In the cross-point type memory cell array, the stack 100' is processed in the second direction into a cell unit CU2 of a (second-layer) memory cell array to be higher than the first-layer memory cell array.

Interlayer insulating films are embedded between cell units CU1 adjacent in the first direction and between stacks 100' adjacent in the first direction.

Here, in case memory cell arrays are further provided on stacks 100', the process similar to the process shown in FIG. 14E to FIG. 14G is repeated before a predetermined number of memory cell arrays are stacked.

As shown in FIG. 14E to FIG. 14G, the second-layer memory cell array is processed simultaneously with the formation of the first-layer memory cell array on the substrate 11.

Thus, the formation of the upper memory cell array and the processing of the lower memory cell array are carried out in a common step, so that the process of manufacturing the resistance change memory having the cross-point type memory cell array is simpler and its manufacturing costs are lower than when each memory cell array in each layer (interconnection level) is processed in the first and second directions.

In the case described with FIG. 14A to FIG. 14E, the silicide layer is formed at the top of the rectification element. When silicide layer 39 is formed at the bottom of the rectification element as in 12B and FIG. 12C, the alloy film formed between the conductive layer 60X and the silicon layer is subjected to silicidation together with the silicon layer, so that the silicide layer 39 is formed on the bottom of the silicon layer. The silicon layer to form the silicide layer 39 may be the silicon layer 31X, 33X or may be a layer formed separately from the silicon layer 31X, 33X.

In the case described with FIG. 14B, the alloy film 59 which has not caused a silicide reaction with the silicon layer is removed by, for example, wet etching after the silicide treatment. However, the alloy film which has not caused a silicide reaction may remain on the silicide layer 39X for use as the diffusion preventing layer, the adhesive layer, or as part of the electrode of the rectification element or the memory element.

Figure 14H:
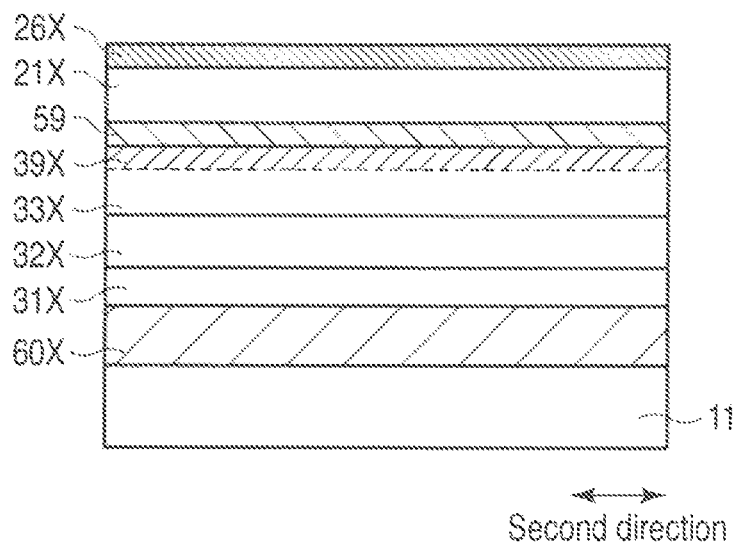
FIG. 14H is a diagram showing one step of the first method of manufacturing the resistance change memory according to the embodiment.

For example, as shown in FIG. 14H, the resistance change film 21X and the second electrode layer 26X may be sequentially deposited as constituent parts of the memory element on the metal film (alloy film) 59 used as the first electrode layer. As a result, the step of separately depositing lower electrode (first electrode layer) of the memory element can be eliminated, and the process of manufacturing the resistance change memory can be simpler.

As described above, in the first method of manufacturing the resistance change memory according to the present embodiment, the silicide layer 39 is provided on at least one end (top) or the other end (bottom) of non-ohmic element (rectification element) 30. The silicide layer 39 includes the Si element 50 and the 3d transition metal element 51, and also includes the element (additional element) 52 having an atomic radius greater than the atomic radius of the 3d transition metal element 51. In this manufacturing method, the silicide layer 39 is formed by the thermal treatment at 500° C. or more for the metal film (alloy film) including the 3d transition metal element 51 and the additional element 52 and for the silicon layer.

As shown in FIG. 4 to FIG. 6, the silicide layer 39 included in the resistance change memory according to the present embodiment includes the additional element 52 and thus has high-temperature resistance. Therefore, even if a high-temperature thermal treatment is included in the method of manufacturing a semiconductor device such as the resistance change memory, agglomeration of the metal elements (atoms) included in the silicide layer, diffusion of the metal elements into other constituent elements (e.g., the silicon layer) and the erosion of other parts by silicide can be inhibited.

As a result, in the resistance change memory according to the present embodiment, characteristic deterioration of the non-ohmic element caused when silicide having low heat resistance, such as the increase of a reverse current of the rectification element when a reverse bias is applied is reduced.

Furthermore, there is no need to increase the thickness of the silicon layer 33X in order to alleviate effects of the diffusion of the metal elements and the erosion by the silicide layer. Therefore, the thickness (height in the stacking direction) of the non-ohmic element (rectification element) is smaller, and the aspect ratio of the cell unit (stack) is lower.

Thus, the processing (etching) to form the cell unit is relatively easy, and the embedding quality of the interlayer insulating film between adjacent cell unit is improved.

As shown in FIG. 14E to FIG. 14G, the aspect ratio increases when two stacked memory cell arrays (cell units) are simultaneously processed, so that reducing the thickness of the non-ohmic element to hold down the increase of the aspect ratio is effective.

In addition, since the height of the non-ohmic element is smaller, there is no need to have a large space between adjacent cell units to ensure a margin for processing. This enables a reduction in the area of the memory cell array of the resistance change memory.

Furthermore, as shown in FIG. 7A and FIG. 7B, the work function of silicide can be adjusted by the addition of the additional element 52 to a certain silicide. This enables a reduction in the resistance of the interface between the silicide layer 39 and the semiconductor layer 33.

As a result, a current loss attributed to the interface resistance is reduced. For example, the upper limit value of the forward current when a forward bias is applied is higher in the rectification element, and the output of the forward current of the rectification element is higher than the value of a certain applied voltage. Thus, the current (voltage) that can be supplied to the memory element 20 is higher at a certain drive voltage applied to a selected cell unit.

As described above, according to the resistance change memory manufacturing method in the embodiment, a resistance change memory in which deterioration of element characteristics is inhibited can be provided.

(b) Second Manufacturing Method

A second method of manufacturing the resistance change memory according to the embodiment is described with FIG. 15A to FIG. 15D. FIG. 15A to FIG. 15D show sectional process views taken along the second direction of a memory cell array in one step of the present manufacturing method. It is to be noted that parts equivalent to the parts described in the first manufacturing method are denoted with the same reference numbers and are not described. It is also to be noted that steps equivalent to the steps in the first manufacturing method described with FIG. 14A to FIG. 14G are not described here.

The second method of manufacturing the resistance change memory according to the present embodiment is different from the first manufacturing method in that a metal film including one kind of the 3d transition metal element 51 is deposited separately from a metal film including at least one kind of the element 52 having an atomic radius greater than the atomic radius of the 3d transition metal element 51.

Figure 15A:
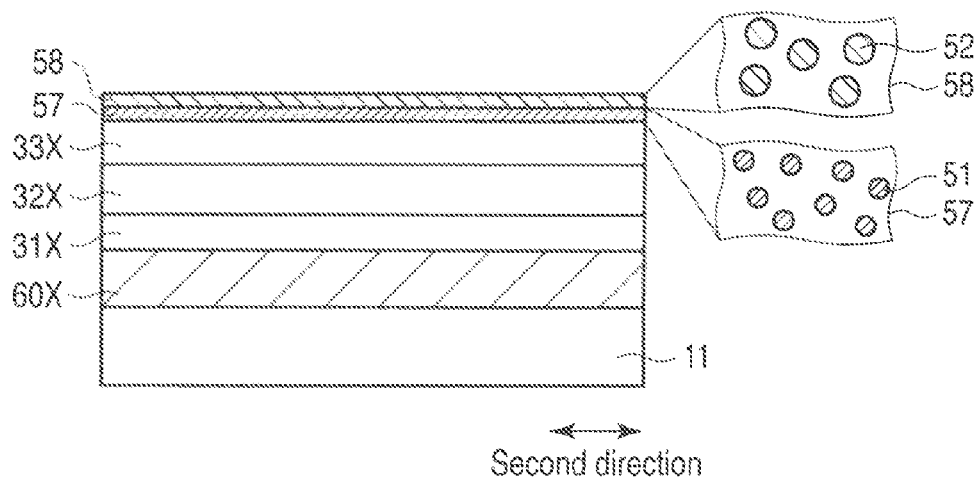
FIG. 15A is a diagram showing one step of a second method of manufacturing the resistance change memory according to the embodiment.

As shown in FIG. 15A, a metal film 57 containing the 3d transition metal element 51 as the main component is formed on the silicon layer 33X. Further, a metal film 58 containing the additional element 52 as the main component is formed on the metal film 57.

Layers 33X, 57, 58 are thermally treated, so that elements 51, 52 in two metal films 57, 58 cause a silicide reaction with the Si element in the silicon layer 33X, and the silicide layer 39X is formed on the silicon layer 33X as in FIG. 14B.

Figure 15B:
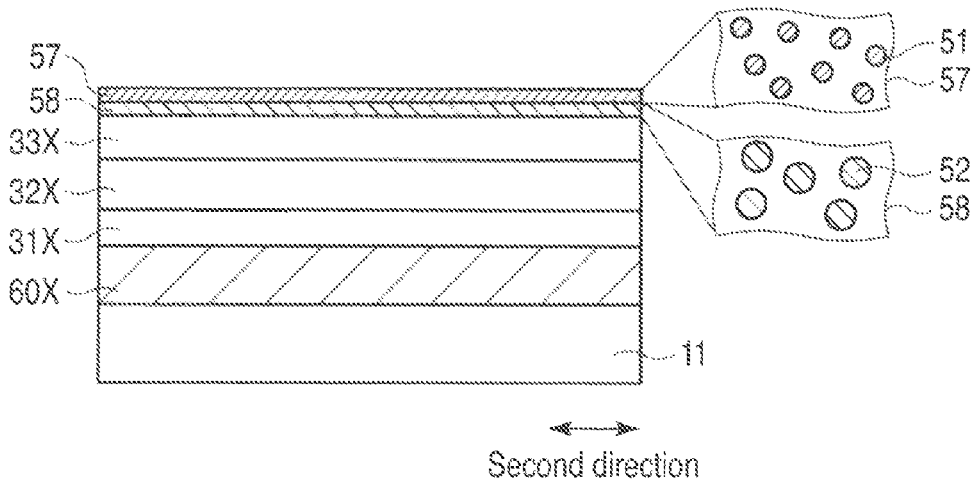
FIG. 15B is a diagram showing one step of the second method of manufacturing the resistance change memory according to the embodiment.

As shown in FIG. 15B, the metal film 58 containing the additional element 52 may be deposited on the silicon layer 33X, and the metal film 57 containing the 3d transition metal element 51 may be deposited on the metal film 58.

As shown in FIG. 15A and FIG. 15B, in the second method of manufacturing the resistance change memory according to the present embodiment, a silicide layer which has high-temperature resistance and which can reduce the resistance of the interface with the silicon layer 33X can be formed as in the first manufacturing method described above.

Furthermore, metal films 57, 58 which have not caused a silicide reaction with silicon may remain on the silicide layer 38X for use as part of the electrode of the memory element.

For example, when the step of removing the metal film which has not caused a silicide reaction with the silicon layer after the step in FIG. 15A is omitted, the metal film 58 can be used for the first electrode layer (the lower electrode of the memory element).

Figure 15C:
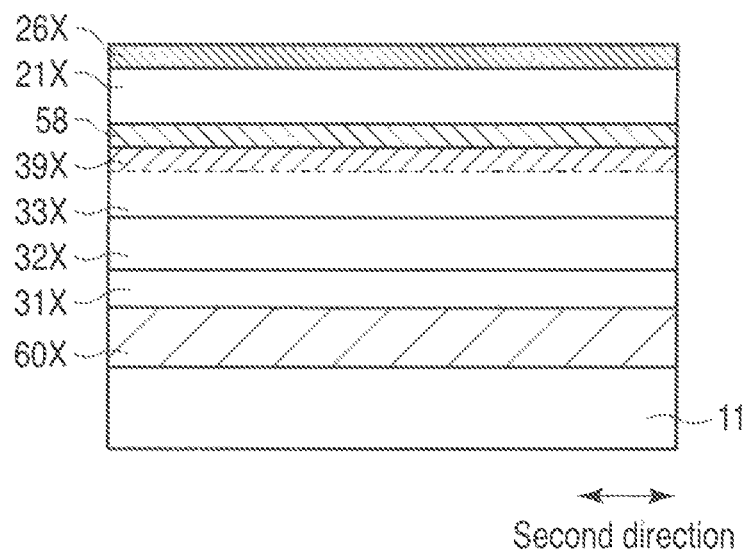
FIG. 15C is a diagram showing one step of the second method of manufacturing the resistance change memory according to the embodiment.

For example, as shown in FIG. 15C, the resistance change film 21X and the second electrode layer 26X are sequentially deposited as constituent parts of the memory element on the metal film 58 used as the first electrode layer. As a result, the step of separately depositing the first electrode layer can be eliminated, and the manufacturing process can be simplified.

Similarly, if the step of removing the metal film which has not caused a silicide reaction with the silicon layer after the step in FIG. 15B is omitted, the metal film 57 can be used for the first electrode layer (the lower electrode of the memory element).

Figure 15D:
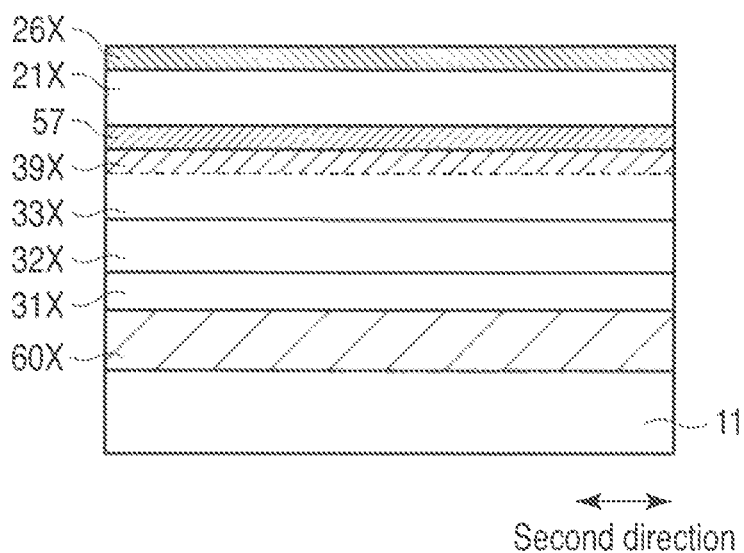
FIG. 15D is a diagram showing one step of the second method of manufacturing the resistance change memory according to the embodiment.

For example, as shown in FIG. 15D, the resistance change film 21X and the second electrode layer 26X are sequentially deposited as constituent parts of the memory element on the metal film 57 used as the first electrode layer. As a result, the step of separately depositing the first electrode layer can be eliminated, and the manufacturing process can be simplified.

Consequently, according to the second method of manufacturing the resistance change memory in the embodiment, a resistance change memory in which deterioration of element characteristics is inhibited can be provided as in the first manufacturing method.

(c) Third Manufacturing Method

A third method of manufacturing the resistance change memory according to the embodiment is described with FIG. 16A to FIG. 16D. FIG. 16A to FIG. 16D show sectional process views taken along the second direction of a memory cell array in one step of the present manufacturing method. It is to be noted that parts equivalent to the parts described in the first and second manufacturing methods are provided with the same reference numbers and are not described. It is also to be noted that steps equivalent to the steps in the first and second manufacturing methods are not described here.

The third method of manufacturing the resistance change memory according to the present embodiment is different from the first and second manufacturing methods in that a silicide layer including the Si element 50 and the 3d transition metal element 51 is formed and then the additional element 52 having an atomic radius greater than the atomic radius of the 3d transition metal element 51 is added to the formed silicide layer.

Figure 16A:
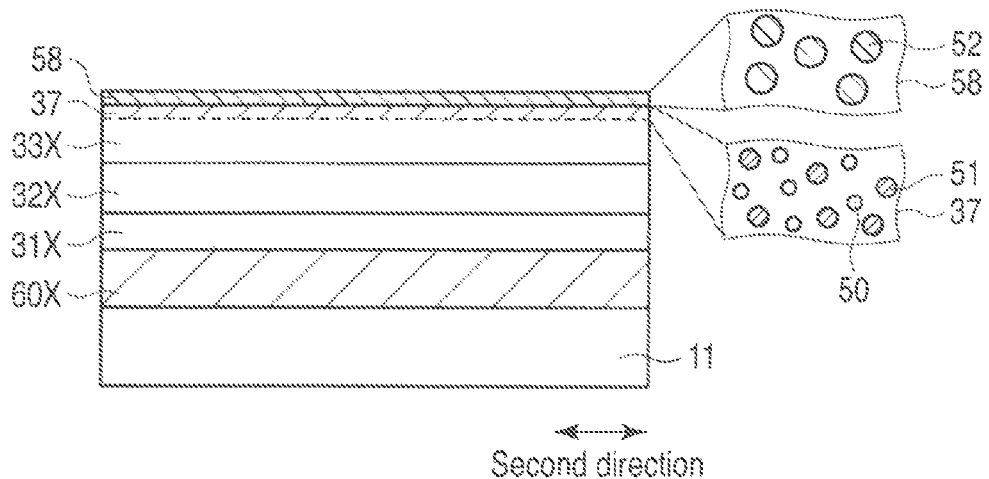
FIG. 16A is a diagram showing one step of a third method of manufacturing the resistance change memory according to the embodiment.

As shown in FIG. 16A, a silicide layer (hereinafter referred to as a base silicide layer) 37 including the Si element 50 and the 3d transition metal element 51 is formed on the silicon layer 33X. The base silicide layer 37 is formed by, for example, a silicide reaction between the silicon layer 33X and the 3d transition metal element. After the base silicide layer 37 is formed, the metal film 58 is deposited on the silicide layer 37. The metal film 58 includes the element 52 having an atomic radius greater than the atomic radius of the 3d transition metal element 51.

The base silicide layer 37 and the metal film 58 are thermally treated, and the element 52 included in the metal film 58 diffuses into the base silicide layer 37. Diffused element 52 chemically reacts (is bonded) with the Si element 50 and the metal element 51 in the silicide layer 37. Thus, the element 52 is added into the base silicide layer 37 including the Si element 50 and the 3d transition metal element 51.

Thus, in the same manner as shown in FIG. 14B, the silicide layer 39 including the Si element 50, the 3d transition metal element 51, and the element 52 having an atomic radius greater than the atomic radius of the element 51 is formed on the silicon layer 33X.

Figure 16B:
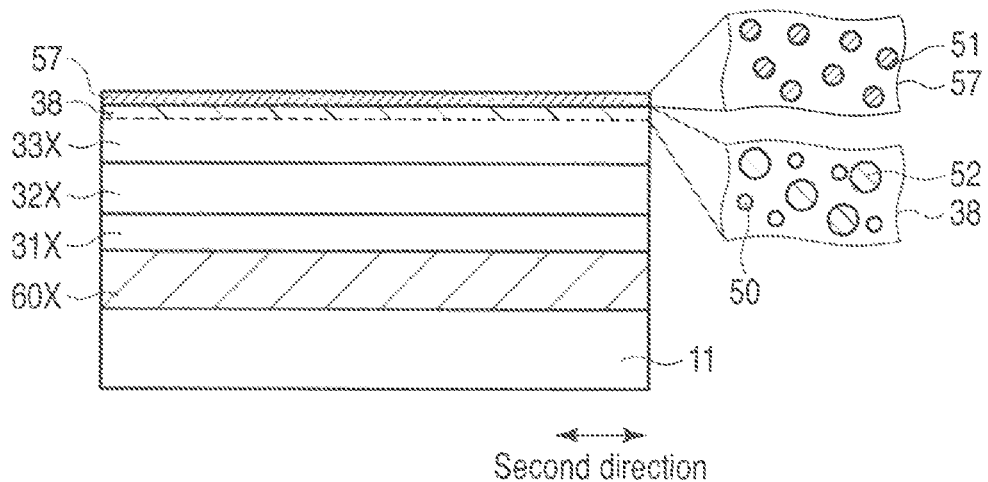
FIG. 16B is a diagram showing one step of the third method of manufacturing the resistance change memory according to the embodiment.

As shown in FIG. 16B, the metal film 57 containing the 3d transition metal element 51 as the main component may be deposited on a compound layer 38 including the Si element 50 and the additional element 52. In this case, the Si element 50 in the compound layer 38 and the 3d transition metal element 51 in the metal film 57 cause a silicide reaction due to a thermal treatment, and the silicide layer 39 shown in FIG. 14B is formed. In addition, the compound layer 38 may be a silicide layer composed of the Si element 50 and the additional element 52, depending on the kind of selected additional element 52.

As shown in FIG. 16A and FIG. 16B, in the third method of manufacturing the resistance change memory according to the present embodiment, a silicide layer which has high-temperature resistance and which can reduce the resistance of the interface with the silicon layer 33X can be formed as in the first and second manufacturing methods.

Furthermore, metal films 57, 58, which have not diffused into the silicide layer, may remain on the silicide layer 38X for use as part of the electrode of the memory element.

For example, when the step of removing the metal film which has not caused a silicide reaction with the silicon layer after the step in FIG. 16A is omitted, the metal film 58 can be used for the first electrode layer (the lower electrode of the memory element).

Figure 16C:
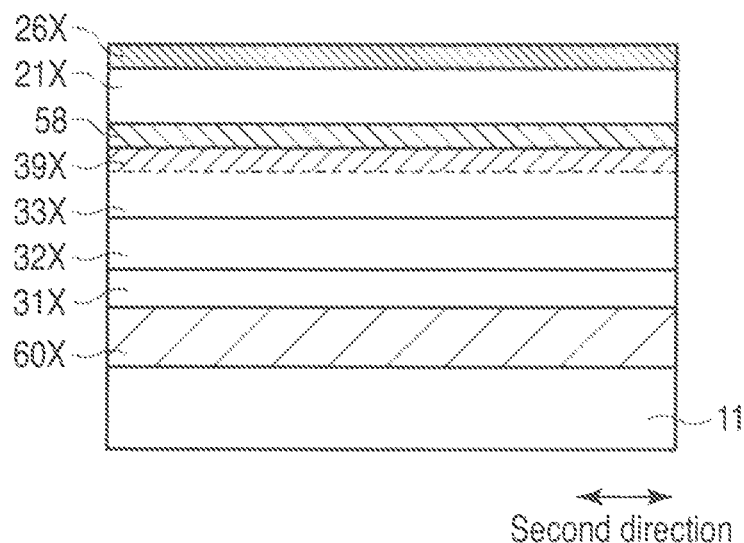
FIG. 16C is a diagram showing one step of the third method of manufacturing the resistance change memory according to the embodiment.

For example, as indicated by FIG. 16C, the resistance change film 21X and the second electrode layer 26X are sequentially deposited as constituent parts of the memory element on the metal film 58 used as the first electrode layer. As a result, the step of separately depositing the first electrode layer can be eliminated, and the manufacturing process can be simplified.

Similarly, when the step of removing the metal film which has not caused a silicide reaction with the silicon layer after the step in FIG. 16B is omitted, the metal film 57 can be used for the first electrode layer (the lower electrode of the memory element).

Figure 16D:
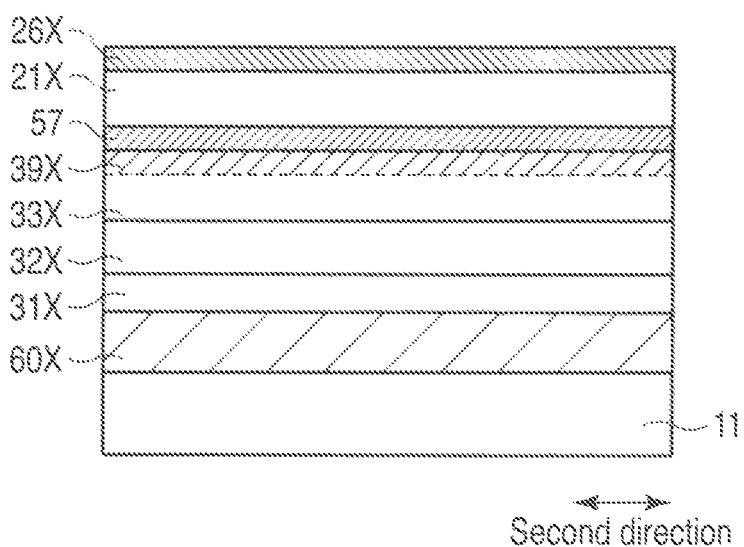
FIG. 16D is a diagram showing one step of the third method of manufacturing the resistance change memory according to the embodiment.

For example, as shown in FIG. 16D, the resistance change film 21X and the second electrode layer 26X are sequentially deposited as constituent parts of the memory element on the metal film 58 used as the first electrode layer. As a result, the step of separately depositing the first electrode layer can be eliminated, and the manufacturing process can be simplified.

Consequently, according to the third method of manufacturing the resistance change memory in the embodiment, a resistance change memory in which deterioration of element characteristics is inhibited can be provided as in the first and second manufacturing methods.

(d) Fourth Manufacturing Method

Figure 17A:
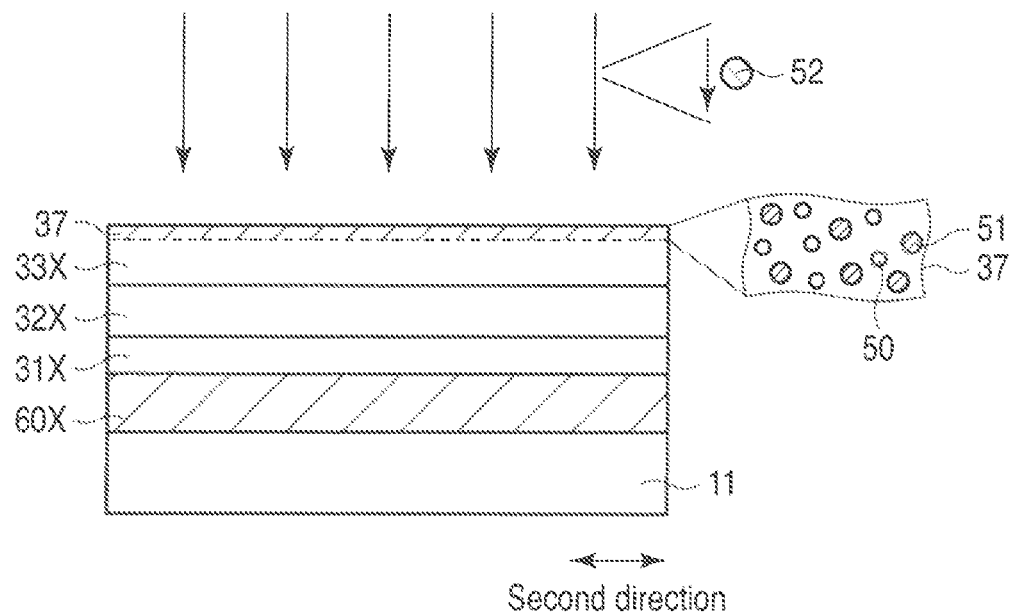
FIG. 17A is a diagram showing one step of a fourth method of manufacturing the resistance change memory according to the embodiment.
Figure 17B:
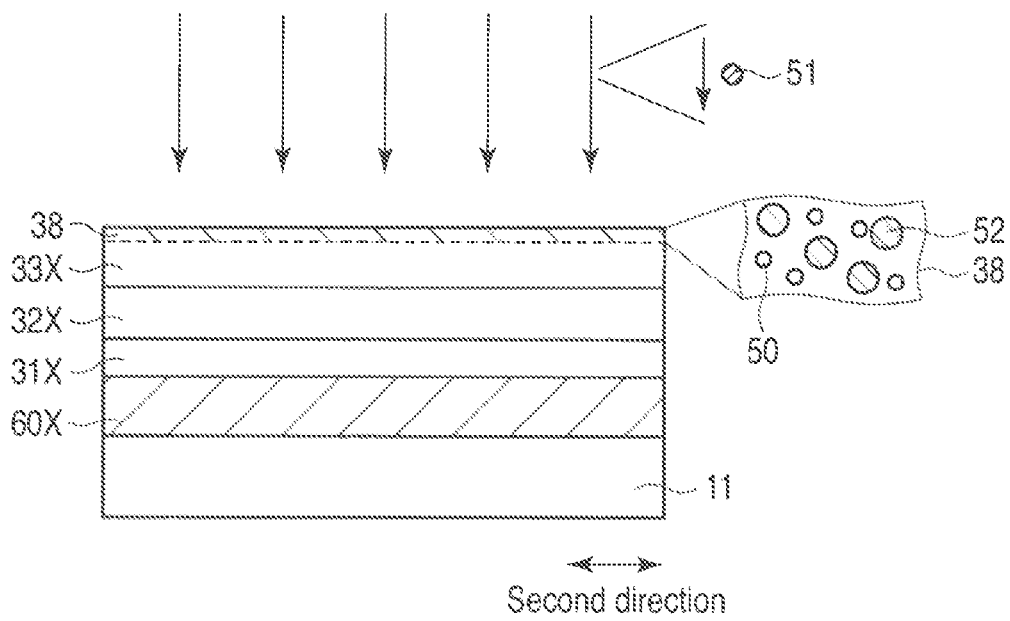
FIG. 17B is a diagram showing one step of the fourth method of manufacturing the resistance change memory according to the embodiment.

A fourth method of manufacturing the resistance change memory according to the embodiment is described with FIG. 17A and FIG. 17B. FIG. 17A and FIG. 17B show sectional process views taken along the second direction of a memory cell array in one step of the present manufacturing method. It is to be noted that parts equivalent to the parts described in the first to third manufacturing methods are provided with the same reference numbers and are not described. It is also to be noted that steps equivalent to the steps in the first to third manufacturing methods are not described here.

The fourth method of manufacturing the resistance change memory according to the present embodiment is different from the first to third manufacturing methods in that an element having an atomic radius greater than the atomic radius of a 3d transition metal element is added into a silicide layer by ion implantation.

As shown in FIG. 17A, a predetermined dose amount of ionized element 52 is implanted the into the base silicide layer 37 including the Si element 50 and the 3d transition metal element 51 by an ion implantation method. The silicide layer 37 into which the element 52 has been implanted is thermally treated. As a result of this thermal treatment, the element 52 implanted into the silicide layer 37 is activated in the silicide layer 37, and added element 52 chemically reacts (is bonded) with the Si element 50 and/or the 3d transition metal element 51 in the silicide layer 37. Thus, as shown in FIG. 14B, the silicide layer 39 including the Si element 50, the 3d transition metal element 51, and the element 52 having an atomic radius greater than the atomic radius of the element 51 is formed on the silicon layer 33X.

As shown in FIG. 17B, ionized 3d transition metal element 51 may be implanted into the compound layer 38 including the Si element 50 and the additional element 52. Then, a thermal treatment is carried out as shown in FIG. 17A, so that implanted 3d transition metal element 51 causes a silicide reaction with the Si element 52 in compound layer 38, and the silicide layer 39 is formed on the silicon layer 33X.

Moreover, both the 3d transition metal element 51 and the additional element 52 may be implanted into the silicon layer 33X by the ion implantation method. In this case as well, the silicide layer 39 is formed by carrying out a thermal treatment.

As shown in FIG. 17A and FIG. 17B, in the fourth method of manufacturing the resistance change memory according to the present embodiment, a silicide layer which has high-temperature resistance and which can reduce the resistance of the interface with the silicon layer 33X can be formed as in the first to third manufacturing methods.

Furthermore, if a silicide layer including the additional element 52 is formed by the ion implantation method as in the fourth manufacturing method described above, the silicide layer 39 including the additional element can be formed at a lower heating temperature than when the additional element 52 is formed in the silicide layer only by the thermal treatment. That is, in the fourth manufacturing method, the temperature of the thermal treatment for forming the silicide layer 39 can be lower.

Thus, when a plurality of memory cell arrays are stacked as in the case of the cross-point type memory cell arrays, heat for forming silicide layer 39 can be inhibited from being repeatedly provided to the lower layer memory cell arrays. This makes it possible to reduce the deterioration of element characteristics resulting from the history of a plurality of thermal treatments and reduce the difference of element characteristics between the upper layer element and the lower layer element.

Furthermore, the thermal treatment for forming the silicide layer 39 can inhibit impurities (e.g., carbon) in the interlayer insulating film and metal elements included in interconnect lines and the electrodes from diffusing into semiconductor layers 31X, 32X, 33X or the resistance change film 21X. This makes it possible to inhibit the deterioration of element characteristics resulting from the diffusion of impurities.

Consequently, according to the fourth method of manufacturing the resistance change memory in the embodiment, a resistance change memory in which deterioration of element characteristics is inhibited can be provided as in the first to third manufacturing methods.

(e) Fifth Manufacturing Method

Figure 18A:
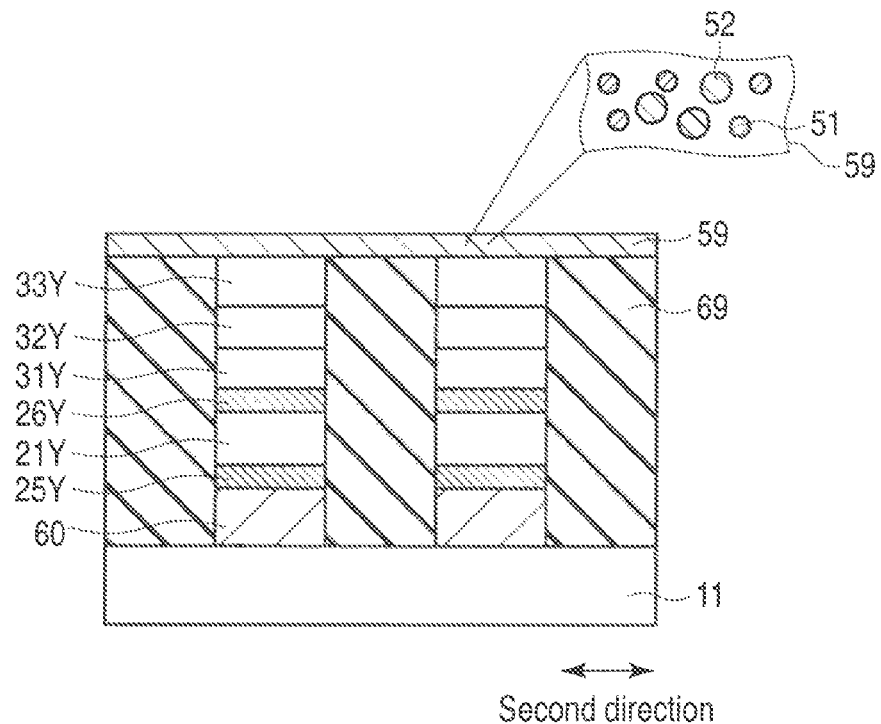
FIG. 18A is a diagram showing one step of a fifth method of manufacturing the resistance change memory according to the embodiment.
Figure 18B:
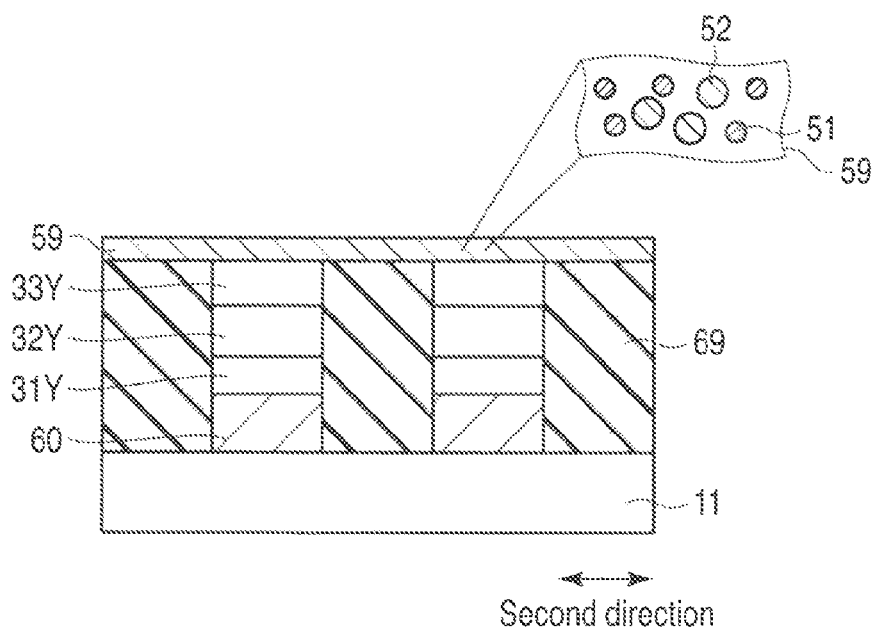
FIG. 18B is a diagram showing one step of the fifth method of manufacturing the resistance change memory according to the embodiment.

A fifth method of manufacturing the resistance change memory according to the embodiment is described with FIG. 18A and FIG. 18B. FIG. 18A and FIG. 18B show sectional process views taken along the second direction of a memory cell array in one step of the present manufacturing method. It is to be noted that parts equivalent to the parts described in the first to fourth manufacturing methods are provided with the same reference numbers and are not described. It is also to be noted that steps equivalent to the steps in the first to fourth manufacturing methods are not described here.

In the cases described in the first to fourth manufacturing methods, the silicide layer including the Si element, the 3d transition metal element and the additional element is formed before a plurality of layers to constitute the cell unit are processed into a stack of a predetermined shape (size). However, the silicide layer may be formed after the stack is formed.

In the case described with FIG. 18A, a non-ohmic element (rectification element) forming a cell unit is stacked on a memory element.

For example, as shown in FIG. 18A, the electrode layer 25Y, the resistance change film 21Y and the electrode layer 26Y are sequentially deposited on the conductive layer 60. Further, three silicon layers 31Y, 32Y, 33Y are sequentially deposited on the electrode layer 26Y.

As shown in the step shown in FIG. 14D, the stack 100 is formed by the photolithographic technique and the RIE method. Then, the interlayer insulating film 69 is embedded between adjacent stacks 100.

After the stack 100 is formed, the metal film 59, for example, is deposited on semiconductor layer 33Y and on the interlayer insulating film 69. The metal film 59 includes the 3d transition metal element 51, and the element 52 having an atomic radius greater than the atomic radius of the 3d transition metal element.

Furthermore, the 3d transition metal element included in the metal film 59 causes a silicide reaction with the Si element included in the silicon layer 33Y due to the thermal treatment for the metal film 59 and the silicon layer 33Y, and a silicide layer is formed. The additional element in the metal film 59 is added into the silicide layer.

Thus, the silicide layer 39 including an Si element, a 3d transition metal element, and an element having an atomic radius greater than the atomic radius of the 3d transition metal element is formed on the end (top) of the silicon layer 33Y after stack 100 is formed.

The step in which the silicide layer used in the present embodiment is formed after being processed into a stack as in the fifth method of manufacturing the resistance change memory according to the present embodiment is effective in the structure in which the rectification element 30 is stacked on the memory element 20 as in cell unit CU shown in FIG. 12D or FIG. 12F.

However, even when a memory element is stacked on a rectification element, silicon layers 31Y, 32Y, 33Y constituting the rectification element may be once processed, and a silicide layer may be formed by a method similar to that in FIG. 18A, as shown in FIG. 18B.

In the case described here, the above-described first manufacturing method is used to form the silicide layer including the 3d transition metal element 51 and the additional element 52 after the processing of the stack. However, it goes without saying that the above-described second to fourth manufacturing methods can also be used to form the silicide layer after the processing of the stack as in FIG. 18A to FIG. 18C.

Consequently, according to the fifth method of manufacturing the resistance change memory in the embodiment, a resistance change memory in which deterioration of element characteristics is inhibited can be provided as in the first and second manufacturing methods.

(4) Operation

The operation of the resistance change memory is described next.

FIG. 19 shows two memory cell arrays.

Memory cell array M1 corresponds to memory cell array M1 shown in FIG. 2, and memory cell array M2 corresponds to memory cell array M2 shown in FIG. 2. The connection between the memory element and the non-ohmic element (e.g., a rectification element) in cell unit CU1, CU2 corresponds to "a" of FIG. 10.

A. Set Operation

First described is the case where a writing (set) operation is performed on selected cell unit CU1-sel in memory cell array M1.

The initial state of selected cell unit CU1-sel is an erased (reset) state.

For example, the reset state is a high-resistance state (100 k$\Omega$ to 1 M$\Omega$), and the set state is a low-resistance state (1 k$\Omega$ to 10 k$\Omega$).

Selected interconnect line L2 (i) is connected to high-potential-side power supply potential Vdd, and selected interconnect line L1 (j) is connected to low-potential-side power supply potential Vss.

Among first interconnect lines from the substrate side, unselected interconnect lines L1 (j−1), L1 (j+1) other than selected interconnect line L1 (j) are connected to power supply potential Vdd. Among second interconnect lines from the substrate side, unselected interconnect lines L2 (i+1) other than selected interconnect line L2 (i) are connected to power supply potential Vss.

Furthermore, third unselected interconnect lines L3 (j−1), L3 (j), L3 (j+1) from the substrate side are connected to power supply potential Vss.

In this case, a forward bias is applied to the rectification element (e.g., a diode) in selected cell unit CU1-sel. Thus, set current I-set from a constant current source 12 runs through selected cell unit CU1-sel, and the resistance value of the memory element in selected cell unit CU1-sel changes from the high-resistance state to the low-resistance state.

Here, in the set operation, a voltage of, for example, about 1 V to 2 V is applied to the memory element in selected cell unit CU1-sel, and the density of set current I-set running through the memory element (high-resistance state) is set at a value ranging, for example, from $1\times10^5$ to $1\times10^7$ A/cm$^2$. In addition, when the change of the resistance value of the memory element in the set operation depends on the pulse width of the current, the pulse width of a set current is appropriately set at a predetermined pulse width.

On the other hand, a reverse bias is applied to the rectification element (diode) in the cell unit which is connected between unselected interconnect lines L1 (j−1), L1 (j+1) and unselected interconnect line L2 (i+1), among unselected cell units CU1-unsel in memory cell array M1.

Similarly, a reverse bias is applied to the rectification element (diode) in the cell unit which is connected between selected interconnect line L2 (i) and unselected interconnect lines L3 (j−1), L3 (j), L3 (j+1), among unselected cell units CU2-unsel in memory cell array M2.

Therefore, the following characteristics are required for the rectification element in the cell unit: a sufficiently low current when a reverse bias is applied, and a sufficiently high breakdown voltage.

B. Reset Operation

Next described is the case where an erasing (reset) operation is performed on selected cell unit CU1-sel in memory cell array M1.

Selected interconnect line L2 (i) is connected to high-potential-side power supply potential Vdd, and selected interconnect line L1 (j) is connected to low-potential-side power supply potential Vss.

Among first interconnect lines from the substrate side, unselected interconnect lines L1 (j−1), L1 (j+1) other than selected interconnect line L1 (j) are connected to power supply potential Vdd. Among second interconnect lines from the substrate side, unselected interconnect lines L2 (i+1) other than selected interconnect line L2 (i) are connected to power supply potential Vss.

Furthermore, third unselected interconnect lines L3 (j−1), L3 (j), L3 (j+1) from the substrate side are connected to power supply potential Vss.

In this case, a forward bias is applied to the rectification element (e.g., a diode) in selected cell unit CU1-sel. Thus, reset current I-reset from a constant current source 12 runs through selected cell unit CU1-sel, and the resistance value of the memory element in selected cell unit CU1-sel changes from the low-resistance state to the high-resistance state.

Here, in the reset operation, a voltage of, for example, about 1 V to 3 V is applied to the memory element in selected cell unit CU1-sel, and the density of reset current I-reset running through the memory element (low-resistance state) is set at a value ranging, for example, from $1\times10^3$ to $1\times10^6$ A/cm$^2$. In addition, when the change of the resistance value of the memory element in the reset operation depends on the pulse width of the current, the pulse width of a reset current is appropriately set at a predetermined pulse width.

On the other hand, a reverse bias is applied to the rectification element (diode) in the cell unit which is connected between unselected interconnect lines L1 (j−1), L1 (j+1) and unselected interconnect line L2 (i+1), among unselected cell units CU1-unsel in memory cell array M1.

Similarly, a reverse bias is applied to the rectification element (diode) in the cell unit which is connected between selected interconnect line L2 (i) and unselected interconnect lines L3 (j−1), L3 (j), L3 (j+1), among unselected cell units CU2-unsel in memory cell array M2.

Therefore, the following characteristics are required for the rectification element in the cell unit: a sufficiently low current when a reverse bias is applied, and a sufficiently high breakdown voltage.

In addition, the value of set current I-set and the value of reset current I-reset are different from each other. Moreover, when the set/reset operation of the memory element depends on the pulse width of the current/voltage, the pulse width of the set current and the pulse width of the reset current are different from each other. Further, the value/time of the voltage applied to the memory element in selected cell unit CU1-sel for generating these currents depends on the materials constituting the memory element.

C. Read Operation

Next described is the case where a read operation is performed on selected cell unit CU1-sel in memory cell array M1.

Selected interconnect line L2 (i) is connected to high-potential-side power supply potential Vdd, and selected interconnect line L1 (j) is connected to low-potential-side power supply potential Vss.

Among first interconnect lines from the substrate side, unselected interconnect lines L1 (j−1), L1 (j+1) other than selected interconnect line L1 (j) are connected to power supply potential Vdd. Among second interconnect lines from the substrate side, unselected interconnect lines L2 (i+1) other than selected interconnect line L2 (i) are connected to power supply potential Vss.

Furthermore, third unselected interconnect lines L3 (j−1), L3 (j), L3 (j+1) from the substrate side are connected to power supply potential Vss.

In this case, a forward bias is applied to the rectification element (e.g., diode) in selected cell unit CU1-sel. Thus, read current I-read from a constant current source 12 runs through the memory element in selected cell unit CU1-sel (the high-resistance state or the low-resistance state).

Therefore, for example, by detecting a potential change in a sense node when read current I-read is running through the memory element, data (resistance value) in the memory element can be read.

Here, the value of read current I-read is much lower than the value of set current I-set and the value of reset current I-reset so that the resistance value of the memory element may not change in reading. When the change of the resistance value of the memory element depends on the pulse width of the current, the pulse width of the read current is set at a pulse width that does not change the resistance value of the memory element.

In reading, as in setting/resetting, a reverse bias is applied to the rectification element (diode) in the cell unit which is connected between unselected interconnect lines L1 (j−1), L1 (j+1) and unselected interconnect line L2 (i+1), among unselected cell units CU1-unsel in memory cell array M1.

A reverse bias is also applied to the rectification element (diode) in the cell unit which is connected between selected interconnect line L2 (i) and unselected interconnect lines L3 (j−1), L3 (j), L3 (j+1), among unselected cell units CU2-unsel in memory cell array M2.

Thus, the following characteristics are required for the rectification element in the cell unit: a sufficiently low current when a reverse bias is applied, and a sufficiently high breakdown voltage.

The set/reset operation and read operation of the resistance change memory are performed as described above.

As described above, the resistance change memory according to the present embodiment has silicide layer 39 on at least one of both ends of the non-ohmic element (e.g., a rectification element) forming the cell unit as shown in FIG. 3. The silicide layer 39 includes the Si element 50, the 3d transition metal element 51 that combines with the Si element 50 to form silicide, and the additional element (foreign element) 52 having an atomic radius greater than the atomic radius of the 3d transition metal element 51.

Since silicide layer 39 included in the resistance change memory according to the present embodiment has high high-temperature resistance (high heat resistance) owing to the addition of the foreign element, the agglomeration and diffusion of the metal elements (atoms) included in the silicide layer and the erosion of silicon layer by the silicide layer are not easily caused.

In the resistance change memory according to the present embodiment, adverse effects of such a high-temperature thermal treatment on the silicide layer can be inhibited, so that, for example, a reverse current at the time of reverse bias application can be reduced, and a high breakdown voltage can be ensured.

Thus, in the resistance change memory according to the present embodiment, even if a high-temperature thermal treatment is carried out in its manufacturing process, deterioration in the reverse bias characteristics of the rectification element can be inhibited. Since the deterioration in the reverse bias characteristics of the unselected cell unit can be inhibited, wrong operation (e.g., wrong writing) of the unselected cell unit, such as the supply of an excessive current to the unselected cell unit, can be decreased.

In addition, in any of the set/reset operation and read operation, the number of unselected cell units is greater than the number of selected cell units.

Therefore, if the reverse bias characteristics of the unselected cell unit are deteriorated, the total amount of the reverse current generated in the whole memory cell array is significantly great. As a result, the power consumption of cross-point type memory cell array 2 in FIG. 2 is increased.

On the contrary, since the deterioration in the reverse bias characteristics of the rectification element can be inhibited in the resistance change memory according to the present embodiment, the increase of the power consumption of the resistance change memory can be inhibited.

The work function of the silicide layer included in the resistance change memory according to the present embodiment can be modulated by the addition of the foreign element to silicide. That is, by properly selecting the kind and addition amount of the foreign element added to a certain silicide, the interface resistance of the silicon-silicide junction can be reduced, and a current loss resulting from the interface resistance can be reduced.

Thus, in the resistance change memory according to the present embodiment, the upper limit of the forward current when a forward bias is applied can be improved, and the forward current of the rectification element at a certain forward bias voltage can be higher.

Therefore, in the resistance change memory according to the present embodiment, a current of an intensity sufficient to accurately perform the set/reset operation can be supplied to the memory element of the selected cell unit. The improvement of the characteristics of the rectification element when a forward bias is applied can also contribute to the reduction of the power consumption of the resistance change memory.

Consequently, characteristic deterioration of constituent elements (e.g., a rectification element) including silicide can be inhibited.

As described above, the silicide layer 39 including the Si element 50, the 3d transition metal element 51 that combines with the Si element 50 to form silicide, and the additional element 52 having an atomic radius greater than the atomic radius of element 51 is used to form the non-ohmic element (e.g., a rectification element). This inhibits the change of the quality of the silicide layer attributed to the high-temperature thermal treatment and resultant adverse effects on the elements, reduces the interface resistance of the silicide layer, and improves the electric characteristics of the elements.

Thus, according to the resistance change memory in the embodiment of the present invention, deterioration of the element characteristics of the resistance change memory can be inhibited.

<Modification>

Figure 20A:
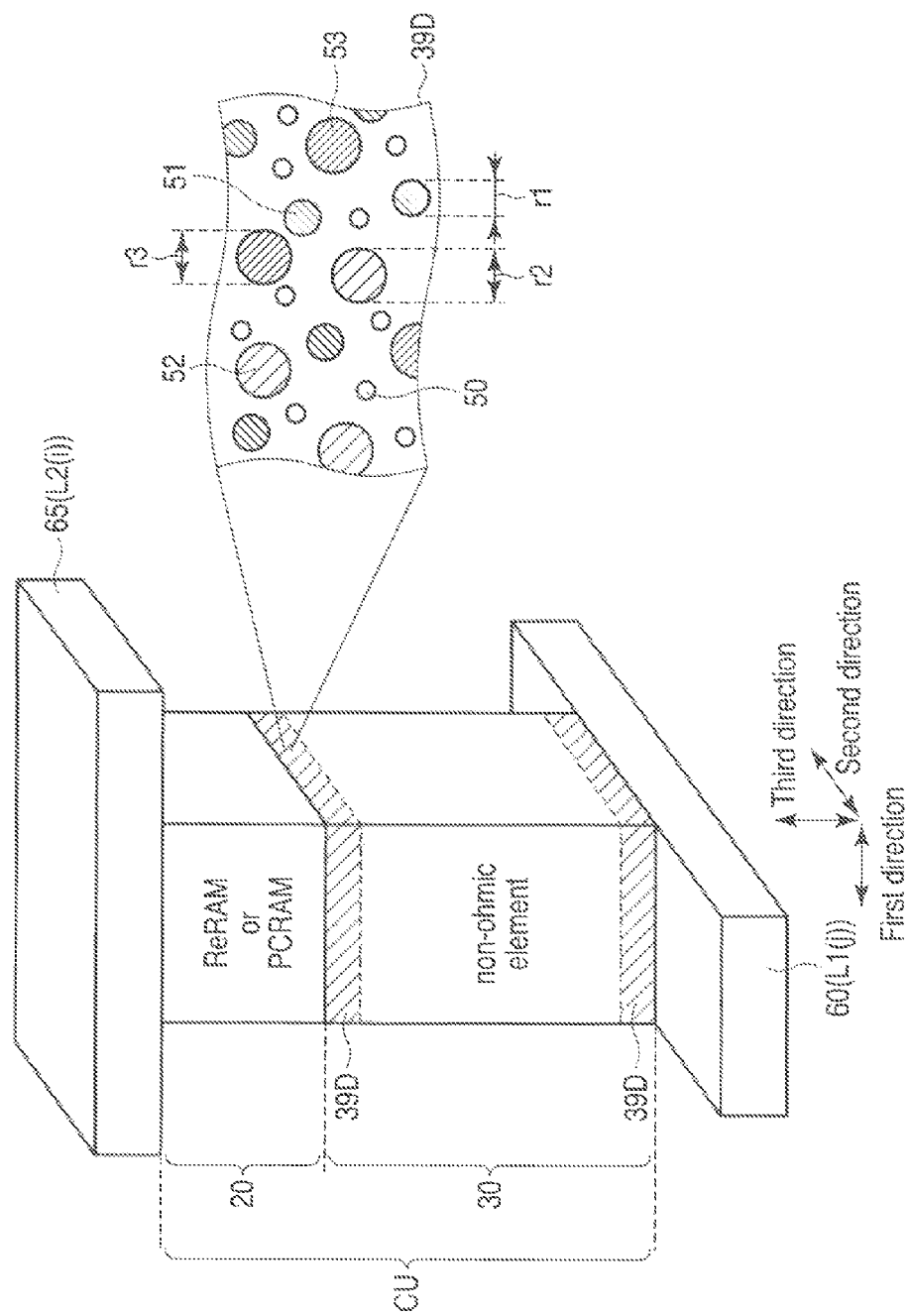
FIG. 20A is a diagram showing a modification of the resistance change memory according to the embodiment.

A modification of the resistance change memory according to the embodiment is described with FIG. 20A to FIG. 21.

(1) Modification 1

Figure 20B:
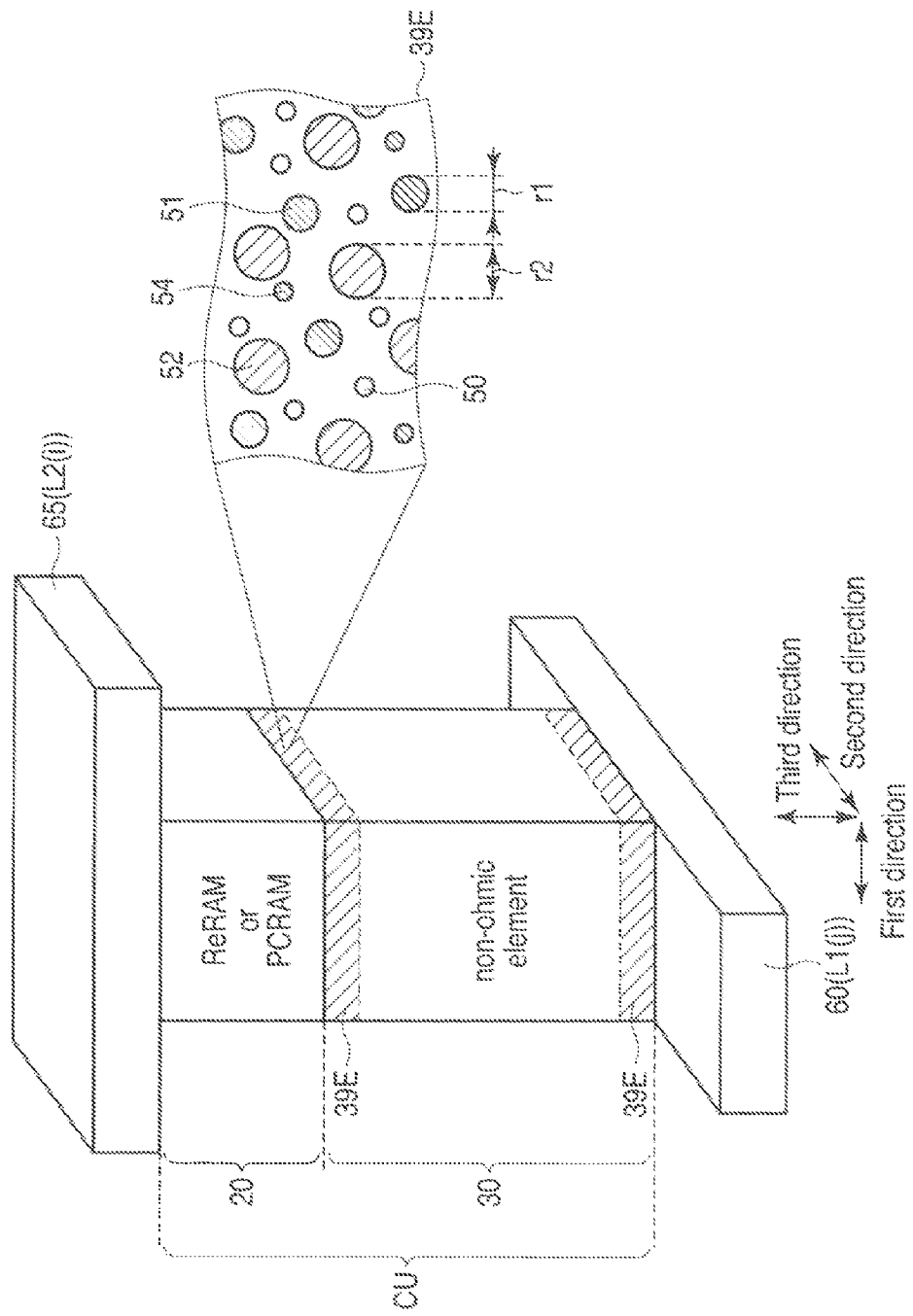
FIG. 20B is a diagram showing the modification of the resistance change memory according to the embodiment.

Modification 1 of the resistance change memory according to the embodiment is described with FIG. 20A and FIG. 20B.

FIG. 20A schematically shows a modification of the silicide layer used in the cell unit.

In the modification shown in FIG. 20A, a silicide layer 39D includes two or more kinds of additional elements 52, 53 selected from the above-mentioned additional element group.

Atomic radius r3 of the second additional element 53 may be greater than atomic radius r2 of the first additional element 52, or may be equal to or less than atomic radius r2.

Here, this modification is described taking as an example the case where Pd and Pt are added to $NiSi_y$.

In case a cross-point type memory cell array of the resistance change memory is provided above a substrate in which peripheral circuits are formed so that an interlayer insulating film intervenes therebetween, a thermal treatment for forming silicide may cause deterioration of the element formed by a front-end process as in the case of, for example, the effect of slipping into the edge of an element isolation insulating film. Moreover, in, for example, a back-end process for forming a memory cell array, the temperature used for the thermal treatment is preferably lowered to the extent possible.

As has been described with FIG. 4, the temperature of Pd-added $NiSi_y$ ($Ni_{1-x}Pd_xSi_y$) at which a silicide reaction is caused is higher than that of Pt-added $NiSi_y$ ($Ni_{1-x}Pt_xSi_y$). In other words, $Ni_{1-x}Pt_xSi_y$ can be formed at a relatively low heating temperature.

Furthermore, $Ni_{1-x}Pd_xSi_y$ has lower electric resistance and higher high-temperature resistance than $Ni_{1-x}Pt_xSi_y$. When $Ni_{1-x}Pd_xSi_y$ and $Ni_{1-x}Pt_xSi_y$ are combined together using such a characteristic difference, silicide which maintains high high-temperature resistance and low electric resistance and which can be formed at a low temperature can be provided.

In $NiSi_y$ including both Pt and Pd, the addition amount of Pt has only to be greater than the addition amount of Pd to decrease the reaction temperature (heating temperature) of silicide layer 39D.

Moreover, in $NiSi_y$ including both Pt and Pd, the addition amount of Pd has only to be greater than the addition amount of Pt to decrease electric resistance and improve high-temperature resistance.

Thus, by adding two or more kinds of additional elements to a certain silicide, the characteristics of the silicide layer 39D can be adjusted to better suit the operation characteristics and manufacturing process of the resistance change memory.

As a result, the element of the resistance change memory formed in both the front-end process and back-end process can be inhibited from characteristic deterioration due to a high-temperature thermal treatment.

FIG. 20B schematically shows a modification different from the modification in FIG. 20A.

Silicide layer 39E to which a foreign element is added is formed by, for example, the heating treatment of a metal film and a Si element or by ion implantation of an element into a layer including Si, in accordance with the manufacturing method described above.

Thus, SiC, SiGe or SiSn, for example, is used for the layer as a base layer including Si. These substances are subjected to silicidation, or a foreign element is added to these substances.

Furthermore, part of the N-type silicon layer or P-type silicon layer may be silicidated depending on the structure and characteristics of the non-ohmic element, and a silicide layer 39E may be thereby formed. Therefore, an element (e.g., P or As) serving as a donor for Si or an element (e.g., B) serving as an acceptor for Si may be included in the silicide layer 39E.

Moreover, an oxide film or nitride film may be formed on the surface of the silicon layer in the process of manufacturing the memory.

Thus, as shown in FIG. 20B, silicide layer 39E may include one or more kinds of elements 54 derived from a layer (base layer) including a Si element for forming the silicide layer 39E, such as C, Ge, Sn, P, As, B, O and N, in addition to the Si element 50, the 3d transition metal element 51 and the additional element 52.

These elements 54 are mainly lattice-substituted for the Si element 50.

It goes without saying that effects substantially similar to the effects obtained by the resistance change memories described in Basic example and Example can be obtained by the resistance change memory in Modification 1 shown in FIG. 20A and FIG. 20B.

(2) Modification 2

Modification 2 of the resistance change memory according to the embodiment is described with FIG. 21A to FIG. 21C.

For a interconnect line used as a word line/bit line, silicide may be used instead of a metal such as Cu or Al or a metal compound.

Therefore, a silicide layer including a Si element, a 3d transition metal element and an additional element may be used for interconnect lines 60, 65.

In FIG. 21A, a lower interconnect line is formed of the silicide layer 39. In FIG. 21B, an upper interconnect line is formed of the silicide layer 39. In FIG. 21C, both of two interconnect lines are formed of the silicide layers 39.

In addition, interconnect line 60, 65 may have a stack structure including a metal layer and silicide layer 39.

It goes without saying that effects substantially similar to the effects obtained by the resistance change memories described in Basic example and Example can be obtained by the resistance change memory in Modification 2 shown in FIG. 21A to FIG. 21C.

<Application>

An application of the embodiment is described with FIG. 22 to FIG. 26.

(1) Transistor

Figure 22:
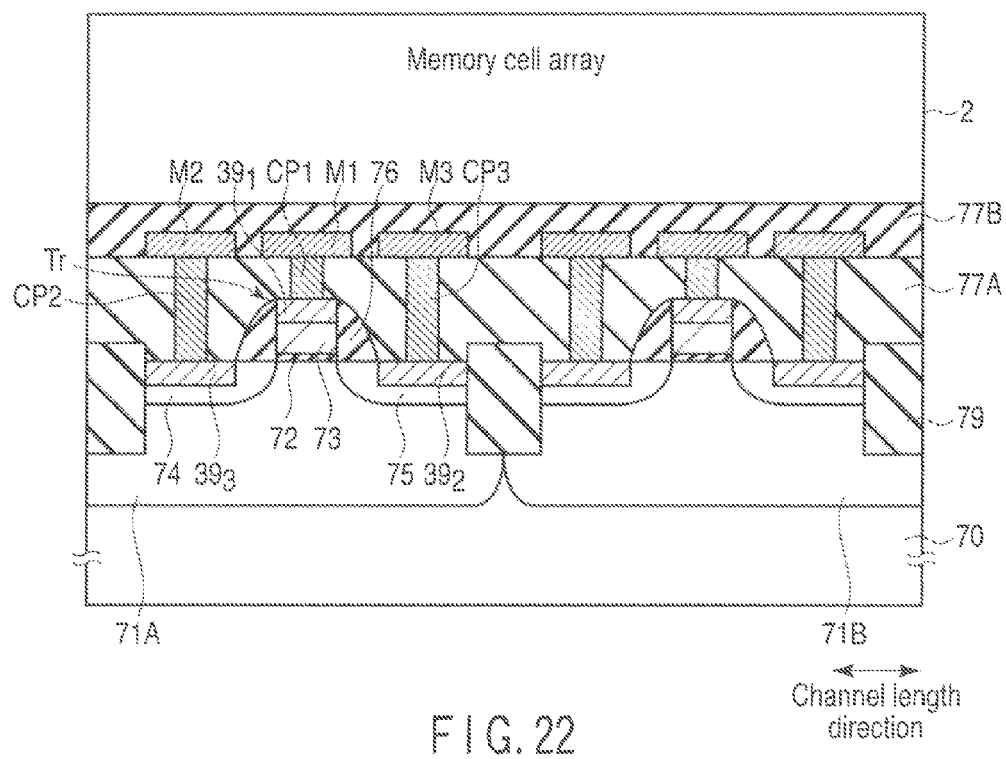
FIG. 22 is a diagram for illustrating a structure according to the application.

In the resistance change memory, memory cell array 2 shown in FIG. 2 is formed by, for example, a back-end process. On the other hand, field effect transistors (FET) that configure peripheral circuits such as the control circuits 3, 4 are formed by a front-end process. As shown in FIG. 22, field effect transistor Tr of the peripheral circuit is formed on a semiconductor substrate (silicon substrate) under the memory cell array 2.

FIG. 22 shows one example of the sectional structure of field effect transistor Tr used in the peripheral circuit. A section of the field effect transistor in a channel length direction is shown in FIG. 22.

As shown in FIG. 22, the same material as that of the silicide layer included in the cell unit according to the embodiment may be used for gate electrodes 73, $39_1$ of field effect transistor Tr and for source/drain electrodes $39_2$, $39_3$ of field effect transistor Tr.

A P-well 71A and an N-well 71B are provided in a semiconductor substrate 70. The P-well 71A and N-well 71B are electrically isolated from each other by an element isolation insulating film 79 in the semiconductor substrate 70.

An N-channel field effect transistor Tr is provided in the P-well 71A. A P-channel field effect transistor is provided in the N-well 71B. P-channel and N-channel field effect transistors are substantially the same in configuration. Therefore, the structure of transistor Tr in the P-well 71A is described here.

Two diffusion layers 74, 75 are provided in P-well 71A. Diffusion layers 74, 75 are used as the source/drain of transistor Tr. Source/drain electrodes $39_2$, $39_3$ are provided on the surfaces of diffusion layers 74, 75.

A gate insulating film 72 is provided on the surface of the well 71 between two diffusion layers 74, 75. A gate electrode 73, $39_1$ are provided on the gate insulating film 72. The top of the gate electrode is formed of the silicide layer $39_1$, and the bottom of the gate electrode is formed of the silicon layer 73.

A sidewall insulating film 76 is provided on the side portions of gate electrode 73, $39_1$.

Contacts CP1, CP2, CP3 are provided on gate electrodes 73, $39_1$ and source/drain electrodes $39_2$, $39_3$, respectively.

Electrodes 73, $39_1$, $39_2$, $39_3$ are connected to interconnect lines M1, M2, M3 via contacts CP1, CP2, CP3.

Contacts CP1, CP2, CP3 and interconnect lines M1, M2, M3 are provided in interlayer insulating films 77A, 77B. A metal such as W is used for contacts CP1, CP2, CP3.

An upper electrode $39_1$ of the gate electrode and source/drain electrodes $39_2$, $39_3$ are formed of silicide layers $39_1$, $39_2$, $39_3$ in which a foreign element (additional element) is added to silicide including an Si element and a 3d transition metal element.

In silicide layers $39_1$, $39_2$, $39_3$ used for the field effect transistor, the atomic radius of the added foreign element is greater than the atomic radius of the 3d transition metal element, similarly to the silicide layer used for the cell unit described with FIG. 3. In addition, one or more kinds of elements may be added to silicide layers $39_1$, $39_2$, $39_3$.

The field effect transistor shown in FIG. 22 is formed by the following manufacturing method.

Figure 23:
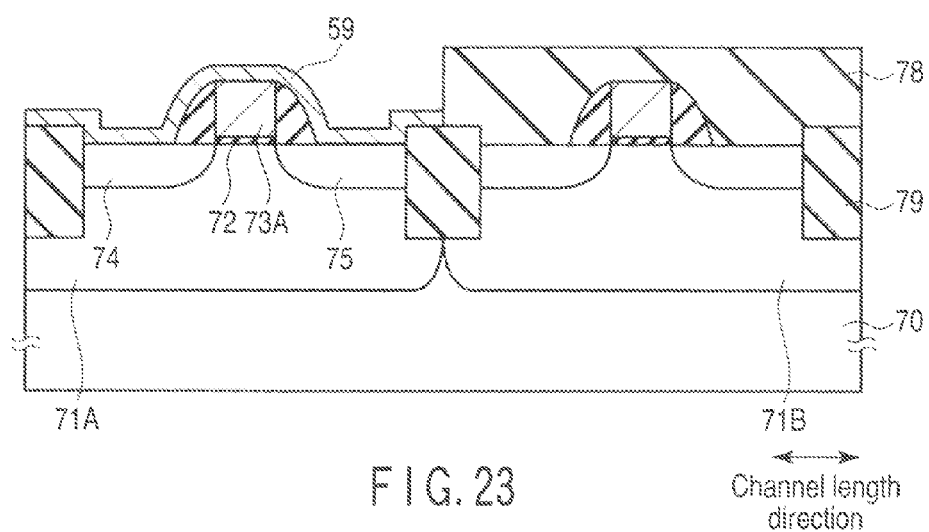
FIG. 23 is a diagram for illustrating a manufacturing method according to the application.

FIG. 23 shows one example of the field effect transistor manufacturing method.

As shown in FIG. 23, wells 71A, 71B and the element isolation insulating film 79 are formed in the semiconductor substrate (silicon substrate) 70.

The gate insulating film 72 is formed on the surfaces of wells 71A, 71B by, for example, a thermal oxidation method or the CVD method. A silicon layer is deposited on the gate insulating film 72 by, for example, the CVD method. The silicon layer is processed into a gate electrode 73A of a predetermined shape by the photolithographic technique and the RIE method.

Furthermore, the gate electrode 73A is used as a mask, so that diffusion layers 74, 75 are formed in wells 71A, 71B by the ion implantation method. When an N-type diffusion layer is formed in the P-well 71A, the surface of the well 71B is covered with a mask (resist). In contrast, when a P-type diffusion layer is formed in the N-well 71B, the surface of the P-well 71A is covered with a mask (resist).

After diffusion layers (source/drain) 74, 75 are formed in the P-well 71A, the sidewall insulating film 76 is formed on the side surface of the gate electrode 73A by the CVD method and the RIE (etch back) method.

Then, the gate electrode 73A having a silicon single-layer structure and the surfaces of diffusion layers 74, 75 in the silicon substrate are subjected to silicidation. When the transistor formed in the P-well is only subjected to silicidation, the surface of the N-well 71B is covered with the mask (insulating film) 78, as shown in FIG. 23.

As shown in FIG. 23, the metal film 59 including a 3d transition metal element and other elements (additional elements) is formed on the gate electrode 73A and diffusion layers 74, 75 by the sputter method or the CVD method, in the same manner as in the manufacturing method shown in FIG. 14A and FIG. 14B. Then, the substrate 70 is thermally treated, and the metal film 59 and silicon cause a silicide reaction.

However, any one of the second to fourth manufacturing methods described in Example may be used as the method of forming a silicide layer in the gate electrode of the transistor.

Thus, as shown in FIG. 22, the silicide layer $39_1$ is formed on the gate electrode 73 of the transistor. Moreover, silicide layers $39_2$, $39_3$ are formed as source/drain electrodes on the surfaces of diffusion layers 74, 75 of the transistor.

Silicide layer $39_1$, $39_2$, $39_3$ includes a Si element, a 3d transition metal element, and an additional element having an atomic radius greater than the atomic radius of the 3d transition metal element. Similarly to the treatment for the transistor in the P-well 71A, the transistor formed in the N-well 71B is subjected to silicidation.

In the P-well 71A, diffusion layers 74, 75 as the source/drain of N-channel transistor are made of N-conductivity-type silicon. In the N-well 71B, the diffusion layers as the source/drain of P-channel transistor are made of P-conductivity-type silicon. Thus, in the P-channel transistor and the N-channel transistor, the 3d transition metal element and the additional element for forming silicide layers $39_1$, $39_2$, $39_3$ may vary in consideration of the work function of silicide, depending on the P-type or N-type diffusion layers as the source/drain. Moreover, the silicide layers in the P-channel transistor and the N-channel transistor may include the same additional element. In this case, the P-well and the N-well may be subjected to silicidation at the same time.

Then, after the alloy film which has not caused a silicide reaction with Si is removed, an interlayer insulating film and a interconnect line, for example, are formed over transistor Tr by a known technique. Thus, the field effect transistor according to the application is completed.

As described above, in the Application shown in FIG. 22 and FIG. 23, the silicide layer $39_1$, $39_2$, $39_3$ including the Si element, the 3d transition metal element and the additional element is used for the gate electrode or the source/drain electrodes of the transistor. The atomic radius of the additional element is greater than the atomic radius of the 3d transition metal element.

In the application, a silicide layer having high high-temperature resistance is used for each of electrodes $39_1$, $39_2$, $39_3$. Thus, as described above, even if a high-temperature thermal treatment is carried out in the back-end process for forming a memory cell array, the element (e.g., the FET on the substrate) which is formed in the front-end process and which includes the silicide layer is inhibited from deteriorating in characteristic due to the high-temperature thermal treatment.

Diffusion layers 74, 75 and the lower part 73A of the gate electrode are made of silicon. The silicide layer $39_1$, $39_2$, $39_3$ to which a foreign element is added can reduce the interface resistance of the silicon-silicide junction, for example, the junction of the diffusion layer and the source/drain electrode.

In the gate electrode, the resistance of the interface between the upper part of the gate electrode for which the silicide layer $39_1$ is used and the lower part of the gate electrode for which silicon layer 73 is used is reduced. The decrease of a voltage due to the interface resistance is reduced, so that a gate voltage applied to the gate electrode 73 can be decreased, and a channel can be formed under the gate electrode $39_1$, 73 at a low gate voltage without any adverse effects of the interface resistance.

Similarly, the resistance of the interface between the diffusion layers 74, 75 formed in the silicon substrate 70 and the source/drain electrodes $39_1$, $39_2$ is reduced. As a result, the drain current of the field effect transistor at a certain supply potential increases.

In the example described here, the silicide layer $39_1$, $39_2$, $39_3$ to which a foreign element is added is used for the field effect transistor of the peripheral circuit of the resistance change memory. However, the silicide layer may be applied to the constituent element on the substrate formed by the front-end process other than the field effect transistor.

Furthermore, silicide layer $39_1$, $39_2$, $39_3$ described in the present embodiment may be used for a peripheral circuit of other semiconductor memories or a field effect transistor as a constituent element of a semiconductor integrated circuit (e.g., a logic circuit).

As described above, in the resistance change memory according to the embodiment, at least one kind of element having an atomic radius greater than the atomic radius of a 3d transition metal element is added to a silicide layer composed of Si and the 3d transition metal element. In the application, silicide layers $39_1$, $39_2$, $39_3$ are not only used for the memory cell arrays but also used for peripheral circuits formed on the silicon substrate such as the gate electrodes and the source/drain electrodes of the field effect transistor.

Consequently, as shown in FIG. 22 and FIG. 23, characteristic deterioration of the element used in the resistance change memory can also be inhibited in the application of the embodiment.

(2) Select Transistor

In Basic example and Example, the resistance change memory having the cross-point type memory cell array has been mainly described, and the cell unit of this memory is composed of the memory element and the non-ohmic element. However, depending on the kind of resistance change memory, a cell unit may be composed of one memory element and at least one transistor.

Figure 24:
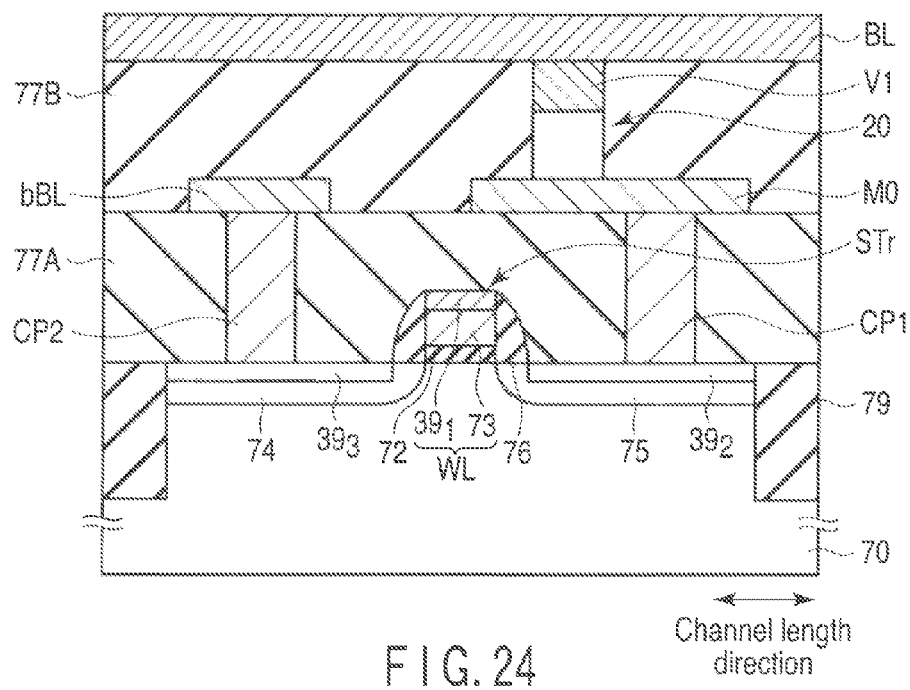
FIG. 24 is a diagram for illustrating a structure according to the application.

In the example shown in FIG. 24, one cell unit has a so-called a 1T+1R structure composed of one memory element 20 and one transistor STr. The transistor (hereinafter referred to as a select transistor) is used as a selective element for the memory element. The cell unit including such the select transistor STr is used in, for example, an MRAM or PCRAM. In addition, two or more select transistors may be provided for one memory element.

In the cell unit shown in FIG. 24, silicide layers $39_1$, $39_2$, $39_3$ described in the present embodiment are used for the gate electrode and the source/drain electrodes of the select transistor STr. The structure of the select transistor STr is substantially the same as the structure of transistor Tr in the peripheral circuit shown in FIG. 22, and the difference therebetween is therefore only described here.

The select transistor STr is a field effect transistor formed on a semiconductor substrate (e.g., a silicon substrate).

The memory element 20 is provided on an upper layer of select transistor STr via interlayer insulating films 77A, 77B.

One end of the memory element 20 is electrically connected to first bit line BL via contact V1. The other end of the memory element 20 is electrically connected to one end (source/drain) $39_2$, 75 of a current path of select transistor STr via an intermediate interconnect line M0 and a contact CP1.

The other end (source/drain) $39_3$, 74 of the current path of the select transistor STr is electrically connected to second bit line bBL via a contact CP2.

The gate electrode $39_1$, 73 of the select transistor STr is connected to the word line. In the example shown in FIG. 24, the gate electrode $39_1$, 73 is used as word line WL, and extends in the channel width direction.

The method of forming silicide layers $39_1$, $39_2$, $39_3$ in the gate electrode and the source/drain electrodes of select transistor STr is similar to the manufacturing method described with FIG. 23, and is therefore not described here.

In an MRAM or PCRAM, in writing or reading data, a potential is applied to the gate electrode (word line) of the select transistor in the selected cell unit, and the select transistor STr is turned on. A write current or read current is supplied to the memory element 20 via the current path (channel) of select transistor STr in an on-state.

For example, when a spin-injection magnetization inversion method is used for the operation of writing into the MRAM, the running direction of current I to be supplied to the memory element (MTJ element) is changed depending on the data to be written. Moreover, in the PCRAM, the write current I is supplied to the memory element 20 to provide a heat quantity for changing the crystal phase of resistance change film of the memory element 20.

Thus, when the memory is in operation, the write current or read current runs through the silicon-silicide junction.

As described above, in silicide layers $39_1$, $39_2$, $39_3$, the work function of silicide can be modulated by the addition of a foreign element to a certain silicide. As a result, the interface resistance is reduced at the junction of silicide and other parts.

Therefore, in the resistance change memory described in the application, the write current or read current can be supplied to the memory element 20 without any current attenuation attributed to the interface resistance.

Furthermore, as in the example of the field effect transistor in FIG. 22, silicide layers $39_1$, $39_2$, $39_3$ used for the gate electrode and the source/drain electrodes of the select transistor STr contain an additional element, so that the agglomeration and diffusion of the metal elements included in the silicide layer caused by the high-temperature thermal treatment are inhibited. Thus, deterioration of current transferring capability of the select transistor STr resulting from the high-temperature thermal treatment is inhibited.

Therefore, a write current of an intensity sufficient to write data into memory element 20 can be supplied, and writing failure due to the reduction of the write current can be prevented. Moreover, the reduction of the read current due to the interface resistance can be inhibited similarly to the write current, so that deterioration of a current or potential (e.g., a bit line potential) for determining data can be inhibited, and data can be read with accuracy.

Furthermore, since the influence of the reduction of the write current due to the interface resistance is reduced, there is no need to generate a high current in advance to counter the reduction of the current due to high interface resistance. Thus, the power consumption of the resistance change memory can be reduced.

Consequently, as shown in FIG. 24, characteristic deterioration of the element used in the resistance change memory can also be inhibited in the application of the embodiment.

(3) Flash Memory

In the example described above, a silicide layer including an Si element, a 3d transition metal element and an additional element having an atomic radius greater than the atomic radius of the 3d transition metal element is used for the resistance change memory.

However, this silicide layer can also be used for other semiconductor memories. The above-mentioned silicide layer can be applied to a flash memory.

Figure 25A:
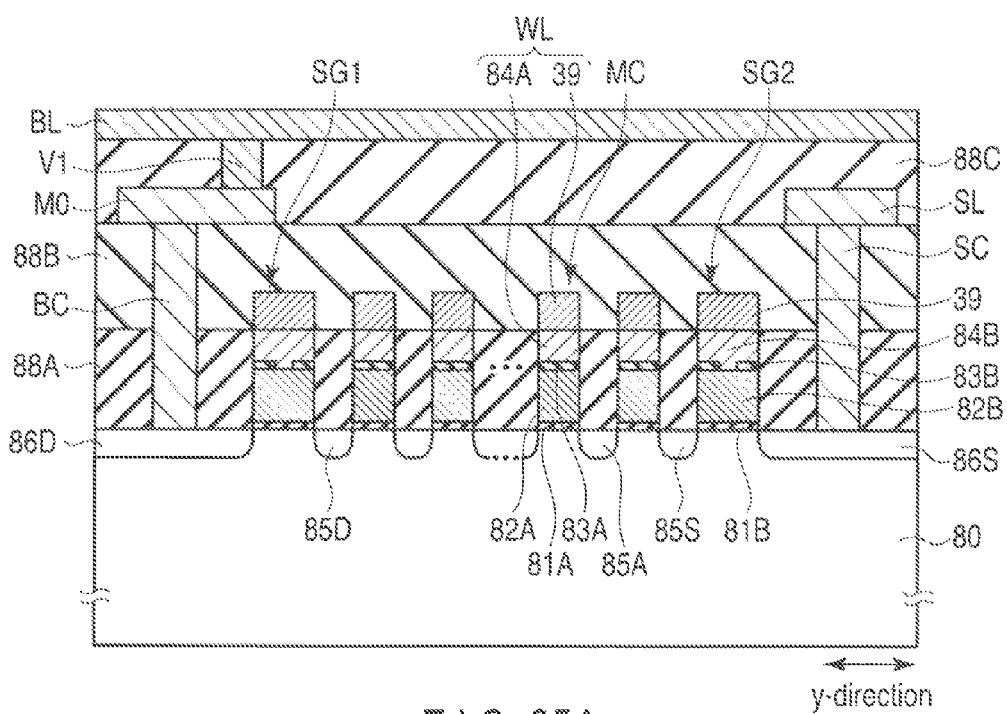
FIG. 25A is a diagram for illustrating a structure according to the application.
Figure 25B:
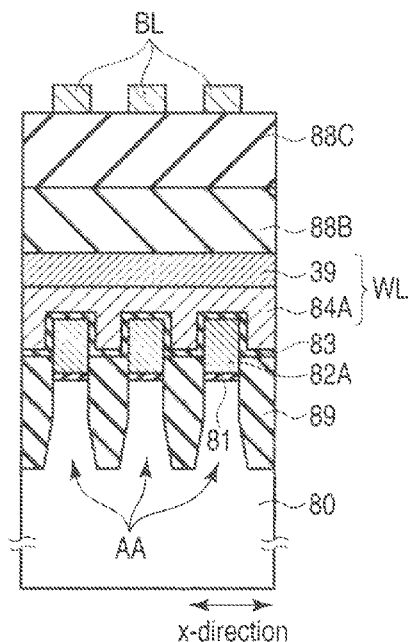
FIG. 25B is a diagram for illustrating a structure according to the application.

FIG. 25A and FIG. 25B show the sectional structure of one cell unit (NAND cell unit) in a NAND type flash memory. FIG. 25A shows the section of the NAND cell unit along a y-direction, and FIG. 25B shows the section of the NAND cell unit along an x-direction.

One NAND cell unit comprises a plurality of memory cells MC (e.g., n memory cells MC) having their current paths connected in series, and select transistors SG1, SG2 connected to one end of the plurality of memory cells MC and the other.

As shown in FIG. 25A and FIG. 25B, the NAND cell unit is disposed in an active area AA of a semiconductor substrate 80. The active areas AA adjacent in the x-direction are electrically isolated from each other by an element isolation insulating film 89.

As shown in FIG. 25A, a memory cell MC is a field effect transistor having a gate structure in which an control gate electrodes 39, 84 are stacked on a charge storage layer 82A.

The gate structure of the memory cell MC may be a stack gate structure that uses a floating gate electrode for the charge storage layer 82A, or a MONOS structure that uses an insulating film (e.g., a silicon nitride film) including a trap level for the charge storage layer 82A. In the case shown in FIG. 25A and FIG. 25B, the floating gate electrode is used for the charge storage layer.

The floating gate electrode 82A is provided on a gate insulating film 81 formed on the surface of semiconductor substrate 80.

The control gate electrode 39, 84A are stacked on the floating gate electrode 82A via an intergate insulating film 83A. the control gate electrode 84A, 39 have a polycide structure in which the silicide layer 39 is stacked on a polycrystalline Si layer 84A. In addition, the control gate electrode may have a fully-silicided structure (FUSI structure) in which the entire control gate electrode from its upper end to lower end is formed of a silicide layer.

The control gate electrode 39, 84A extend in the x-direction, and are shared by the plurality of memory cells MC adjacent in the x-direction. The control gate electrodes 39, 84A are used as word lines WL.

Furthermore, the plurality of memory cells MC adjacent in the y-direction share diffusion layers 85A, and are connected in series. The diffusion layer 85A is used as the source/drain of the memory cells MC.

Select transistors SG1, SG2 are provided on one end (drain side) of the memory cells MC connected in series and the other end thereof (source side), respectively. Select transistors SG1, SG2 are connected to the adjacent memory cells MC via diffusion layers 85D, 85S.

Select transistors SG1, SG2 are formed in a simultaneous process with the memory cells MC, and therefore become field effect transistors of the stack gate structure. A lower gate electrode 82B of select transistors SG1, SG2 are formed simultaneously with the floating gate electrode 82A. An upper gate electrode 39, 84B of select transistors SG1, SG2 are formed simultaneously with the control gate electrode 39, 84A. In select transistors SG1, SG2, The upper gate electrode 84B is electrically connected to the lower gate electrode 3B via opening formed in intergate insulating film.

The upper gate electrodes 39, 84B have a polycide structure, and include the silicide layer 39. Gate electrodes 39, 82B, 84B of select transistors SG1, SG2 are shared by a plurality of select transistors adjacent in the x-direction. Gate electrodes 39, 82B, 84B of two select transistors SG1, SG2 are used as select gate lines.

Drain-side diffusion layer 86D of the select transistor SG1 is connected to bit line BL via contacts BC, V1 and intermediate interconnect line M0. Source-side diffusion layer 86S of the select transistor SG2 is connected to a source line SL via a source line contact SC.

In addition, contacts BC, SC, V1 and interconnect lines M0, BL, SL are formed in interlayer insulating films 88A, 88B, 88C.

A method of manufacturing the flash memory according to the application is described next with FIG. 26.

Figure 26:
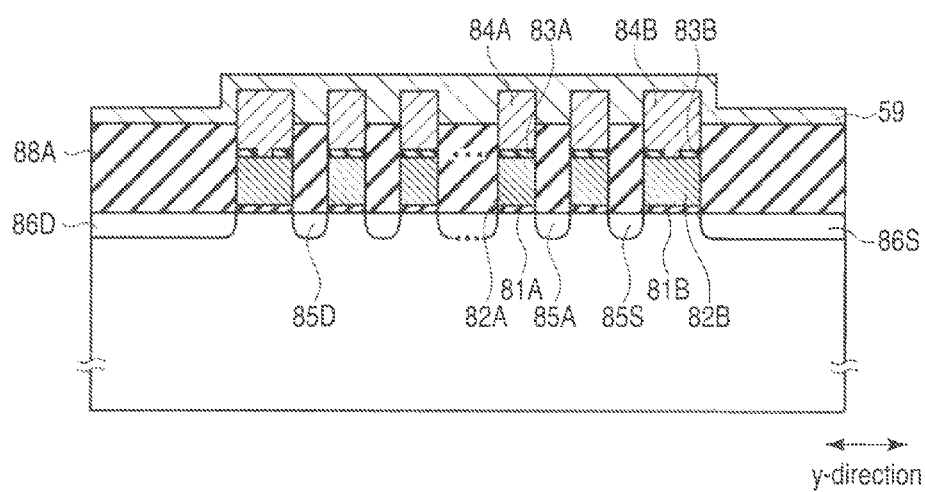
FIG. 26 is a diagram for illustrating a manufacturing method according to the application.

As shown in FIG. 26, gate electrodes 82A, 84A, 82B, 84B of a memory cell and select transistors are formed on the semiconductor substrate 80 by the CVD method, photolithography and RIE method. As described above, in the memory cell, control gate electrode 84A is formed on the floating gate electrode 82A via the intergate insulating film 83A. The control gate electrode 84A is made of, for example, a polycrystalline Si layer.

After gate electrodes 82A, 84A, 82B, 84B are formed, the interlayer insulating film 88A is formed over gate electrodes 82A, 84A. Then, the interlayer insulating film 88A is etched back, and control gate electrode 84A and the upper part of the gate electrode 84B of the gate electrode are exposed.

Furthermore, as in the manufacturing method shown in FIG. 14A and FIG. 14B, an alloy film 59 is deposited on the interlayer insulating film 88A and on exposed the control gate electrode 84A. The alloy film 59 includes a 3d transition metal element, and an element (additional element) having an atomic radius greater than the atomic radius of the 3d transition metal element. Then, the substrate 80 is thermally treated, and the alloy film 59 and an upper part of the polycrystalline Si layer 84A of the control gate electrode cause a silicide reaction.

Thus, as shown in FIG. 25A and FIG. 25B, the silicide layer 39 is formed on the polycrystalline Si layer 84A of the control gate electrode. In addition to the Si element and the 3d transition metal element, the silicide layer 39 includes an element having an atomic radius greater than the atomic radius of the 3d transition metal element.

Similarly, the silicide layer 39 is also formed on the polycrystalline Si layer 84B in the gate electrode (select gate line) of the select transistor.

In addition, any one of the second to fourth manufacturing methods described in Example may be used as the method of forming the silicide layer 39 in the gate electrode of the memory cell.

After the alloy film which has not caused a silicide reaction is removed, interlayer insulating films 88B, 88C, contacts BC, SC, V1 and interconnect lines M0, BL, SL are sequentially formed on the substrate 80 by a known technique. Thus, the flash memory shown in FIG. 25A and FIG. 25B is completed.

As described above, the silicide layer 39 including the Si element, the 3d transition metal element and the additional element (foreign element) can be applied to the gate electrodes of the memory cell and the select transistor, that is, a control line (word line/select gate line) of the flash memory. In this silicide layer 39, the atomic radius of the additional element is greater than the atomic radius of the 3d transition metal element, as in the silicide layer used in the resistance change memory.

This makes it possible to reduce the interface resistance of the silicon-silicide junction in the word line WL.

In the write operation of the flash memory, a write voltage is applied to the selective word line in the selected cell unit, so that a charge is injected into the charge storage layer 82A.

According to the application, since the reduction of the write voltage resulting from the interface resistance is small in the word line (control gate electrode) having the polycide structure, there is no need to generate a high voltage in advance to counter the reduction of the write voltage due to the interface resistance. Thus, the power consumption of the flash memory can be reduced.

While the flash memory has been described herein by way of example, the silicide layer 39 described in the embodiment can be applied to a DRAM or SRAM or to a mixed memory including the former memories. In the DRAM or SRAM, the silicide layer described in the present embodiment is used for the gate electrode (word line) or the source/drain electrodes of the transistor included in the memory cell.

OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a first interconnect line extending in a first direction;
   a second interconnect line extending in a second direction intersecting with the first direction; and
   a cell unit which includes a non-ohmic element having a first silicide layer on a first end of the non-ohmic element, and a memory element to store data in accordance with a reversible change in a resistance state, the cell unit being provided at an intersection of the first interconnect line and the second interconnect line, and the first end having the first silicide layer being at a position on an opposite side of the non-ohmic element than the memory element,
   wherein the first silicide layer includes
   a 3d transition metal element and an additional element which combine with an Si element to form the first silicide layer, the 3d transition metal element has a first atomic radius, and
   the additional element has a second atomic radius greater than the first atomic radius.

2. The resistance change memory according to claim 1, wherein
   the 3d transition metal element is one kind of element selected from the group consisting of Sc, Ti, V, Cr, Mn, Fe, Co, Ni, Cu and Zn.

3. The resistance change memory according to claim 1, wherein
   the additional element is at least one kind of element selected from the group consisting of Y, Zr, Nb, Mo, Tc, Ru, Rh, Pd, Ag, Cd, La, Ce, Pr, Nd, Pm, Sm, Eu, Gd, Tb, Dy, Ho, Er, Tm, Yb, Lu, Hf, Ta, W, Re, Os, Ir, Pt, Au, In, Tl, Sn and Pb.

4. The resistance change memory according to claim 1, wherein
   the composition formula of the first silicide layer is represented by $M_{1-x}D_xSi_y (0<x\leq 0.30, 0<y\leq 2)$
   where (M) indicates the 3d transition metal element, (D) indicates the additional element, and (Si) indicates the Si element.

5. The resistance change memory according to claim 1, wherein
the non-ohmic element comprises a first semiconductor layer having a first conductivity type, and a second semiconductor layer stacked on the first semiconductor layer and having a second conductivity type different from the first conductivity type.

6. The resistance change memory according to claim 5, wherein
an intrinsic semiconductor layer is provided between the first semiconductor layer and the second semiconductor layer.

7. The resistance change memory according to claim 5, wherein
the memory element is stacked on the non-ohmic element, and
a bottom of the memory element is electrically connected to the silicide layer provided on the top of the second semiconductor layer.

8. The resistance change memory according to claim 5, wherein
the non-ohmic element is stacked on the first interconnect line, and
the first interconnect line is electrically connected to the first silicide layer provided on the bottom of the first semiconductor layer.

9. The resistance change memory according to claim 5, wherein
the non-ohmic element is stacked on the memory element, and
a top of the memory element is electrically connected to the silicide layer provided on the bottom of the first semiconductor layer.

10. The resistance change memory according to claim 5, wherein
the non-ohmic element is stacked on the memory element,
the second interconnect line is stacked on the non-ohmic element, and
the second interconnect line is electrically connected to the first silicide layer.

11. The resistance change memory according to claim 5, wherein
the first and second semiconductor layers are selected from the group consisting of SiGe, SiC, SiSn, monocrystalline Si and polycrystalline Si.

12. The resistance change memory according to claim 1, wherein
at least one of the first and second interconnect lines is made of the same material included in the first silicide layer.

13. A resistance change memory according to claim 1, wherein
the non-ohmic element comprises a first semiconductor layer having an n-type, and a second semiconductor layer stacked on the first semiconductor layer and having a p-type,
the silicide layer is only provided on a top of the second semiconductor layer in stacking direction of the first and second semiconductor layers,
the memory element is stacked on the non-ohmic element, and
a bottom of the memory element is electrically connected to the silicide layer provided on the top of the second semiconductor layer.

14. The resistance change memory according to claim 1, wherein
the silicide layer is in direct contact with the second interconnect line.

15. The resistance change memory according to claim 14, wherein
the non-ohmic element further includes a second silicide layer formed of the 3d transition metal element and the additional element,
the first silicide layer is provided on a first end of the non-ohmic element and the second silicide layer is provided on a second end of the non-ohmic element which is on an opposite side of the first end,
the first silicide layer is in direct contact with the second interconnect, and
the second silicide layer is in direct contact with the memory element.

* * * * *